(12) United States Patent
Tanzawa et al.

(10) Patent No.: US 6,781,879 B2
(45) Date of Patent: Aug. 24, 2004

(54) NONVOLATILE SEMICONDUCTOR MEMORY WITH A PAGE MODE

(75) Inventors: Toru Tanzawa, Ebina (JP); Shigeru Atsumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/235,170

(22) Filed: Sep. 5, 2002

(65) Prior Publication Data

US 2003/0136976 A1 Jul. 24, 2003

(30) Foreign Application Priority Data

Sep. 5, 2001 (JP) .................................... 2001-269423

(51) Int. Cl.$^7$ ................................................ G11C 7/00
(52) U.S. Cl. ............................ 365/185.11; 365/230.01; 365/230.03; 365/230.06; 365/230.08; 365/235
(58) Field of Search ..................... 365/185.11, 230.01, 365/230.03, 230.06, 230.08, 235

(56) References Cited

U.S. PATENT DOCUMENTS

| | | | | |
|---|---|---|---|---|
| 4,434,465 A | * | 2/1984 | McDonough et al. | 712/245 |
| 5,691,945 A | * | 11/1997 | Liou et al. | 365/200 |
| 5,717,894 A | * | 2/1998 | Vivio | 711/118 |
| 5,815,458 A | * | 9/1998 | Chevallier et al. | 365/230.06 |
| 5,959,897 A | * | 9/1999 | Chevallier et al. | 365/185.33 |
| 6,047,352 A | * | 4/2000 | Lakhani et al. | 711/5 |
| 6,169,702 B1 | * | 1/2001 | Hoang et al. | 365/230.06 |
| 6,462,989 B1 | * | 10/2002 | Huber | 365/185.23 |
| 6,556,503 B2 | * | 4/2003 | Schreck | 365/230.06 |
| 2002/0099903 A1 | * | 7/2002 | Lakhani et al. | 711/103 |
| 2003/0039167 A1 | * | 2/2003 | Schreck | 365/230.06 |

OTHER PUBLICATIONS

U.S. patent application Ser. No. 10/233,133, Tanzawa et al., filed Aug. 30, 2002.
Pathak et al., "A 1.8V 64Mb 100MHz Flexible Read While Write Flash Memory," Digest of Technical Papers of 2001 ISCC, pp. 32–33, Feb. 2001.

* cited by examiner

Primary Examiner—Viet Q. Nguyen
(74) Attorney, Agent, or Firm—Frommer Lawrence & Haug LLP

(57) ABSTRACT

A first address subset is allocated as a first column address in a nonvolatile semiconductor memory. In addition, a second address subset higher in order than the first address subset is allocated as a first row address. Furthermore, a third address subset higher in order than the second address subset is allocated as a second column address.

16 Claims, 66 Drawing Sheets

| | | |
|---|---|---|
| A0 | CA0 | Intra-page (column) address |
| A1 | CA1 | |
| A2 | RA0 | Lower row address |
| A3 | RA1 | |
| A4 | RA2 | |
| A5 | RA3 | |
| A6 | RA4 | |
| A7 | RA5 | |
| A8 | RA6 | |
| A9 | CA2 | Page (column) address |
| A10 | CA3 | |
| A11 | CA4 | |
| A12 | RA7 | Upper row address & Boot block address |
| A13 | RA8 | |
| A14 | RA9 | |
| A15 | BA0 | Block address |
| A16 | BA1 | |

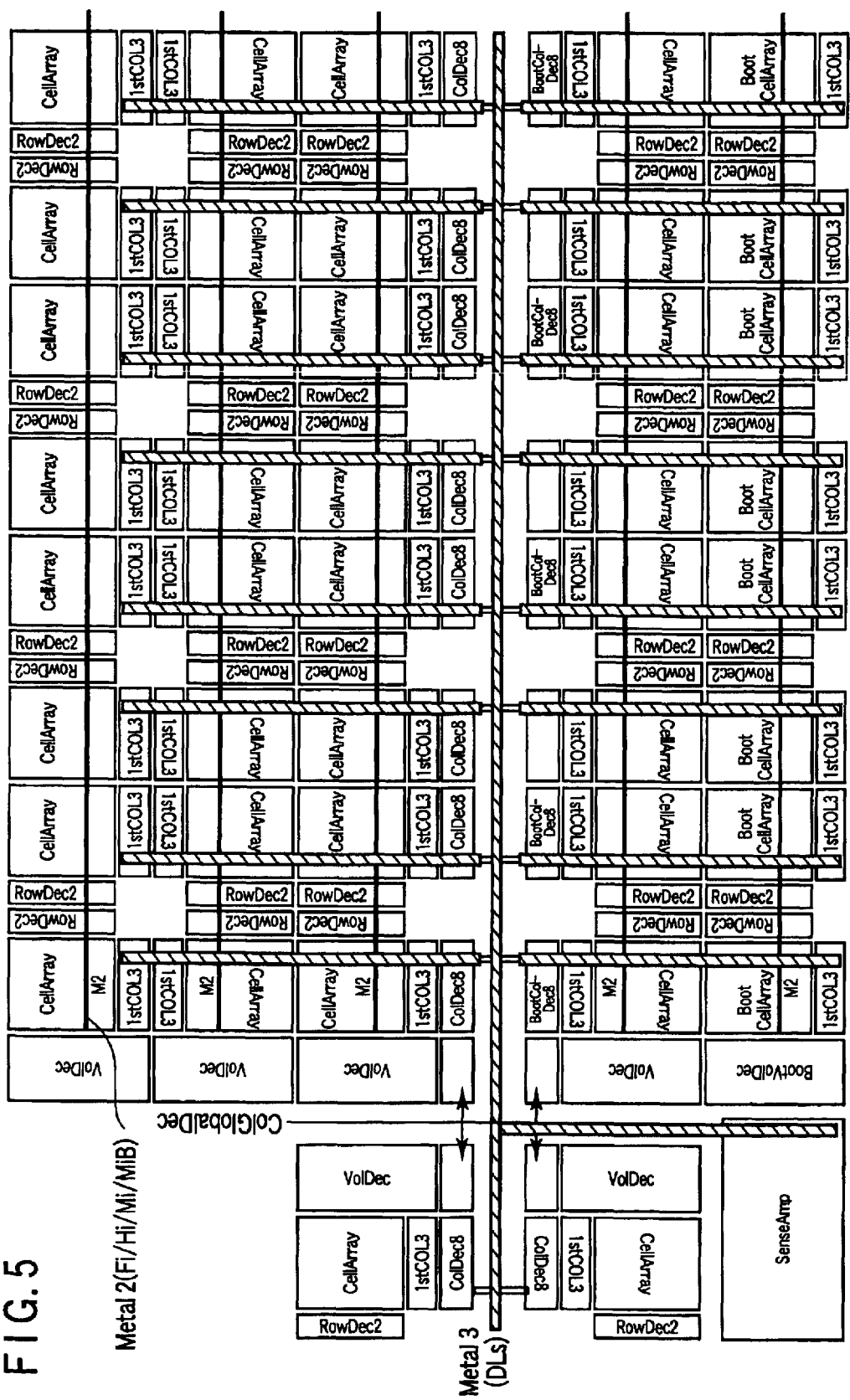
F I G. 5

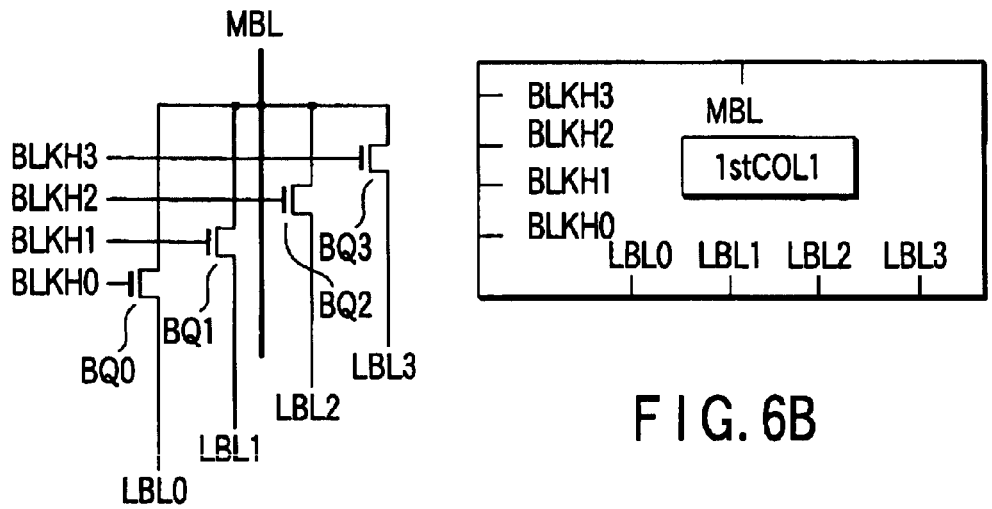
FIG. 6A
FIG. 6B
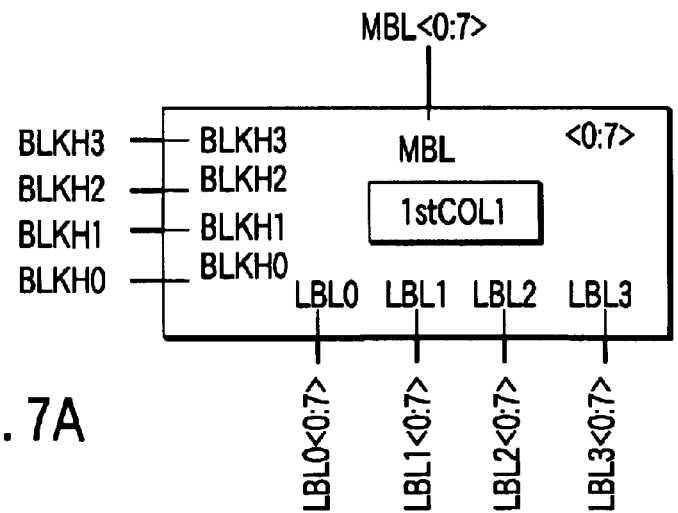
FIG. 7A
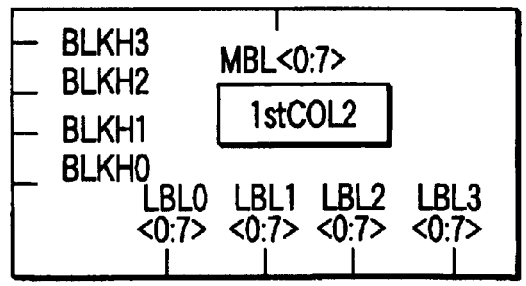
FIG. 7B

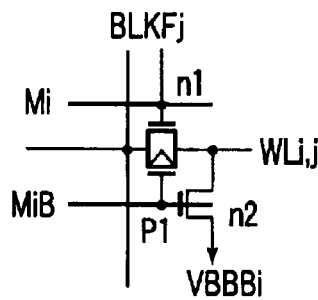
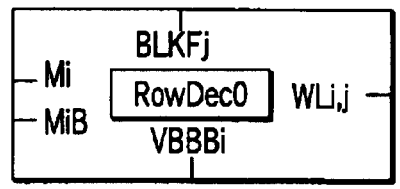
FIG. 11A  FIG. 11B
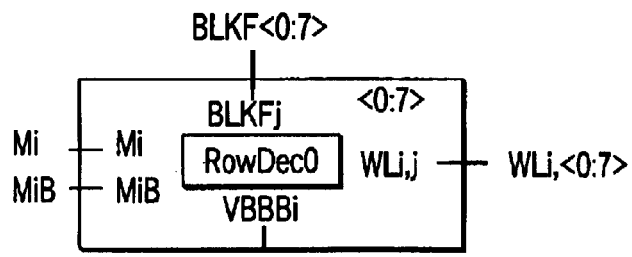
FIG. 12A
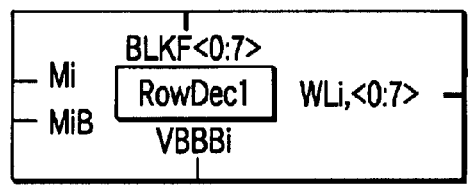
FIG. 12B
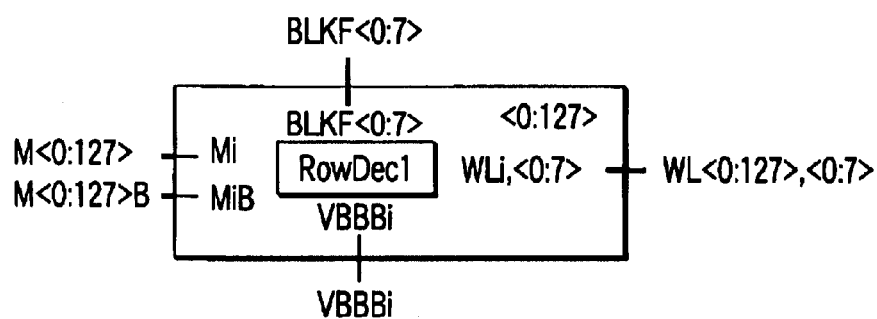
FIG. 13

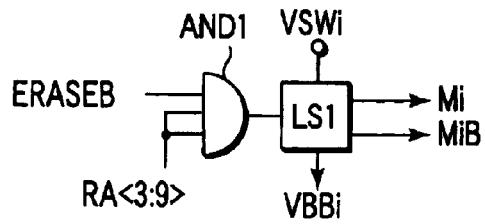
F I G. 14A
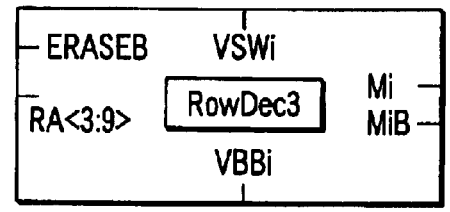
F I G. 14B
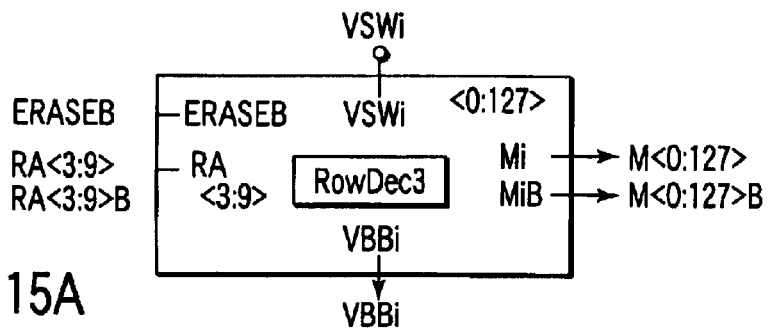
F I G. 15A
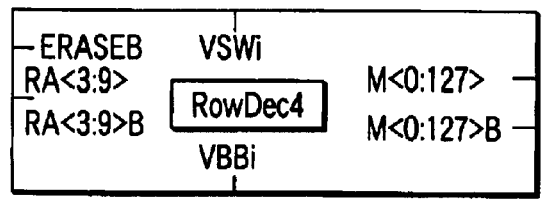
F I G. 15B
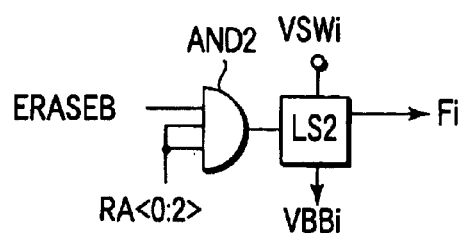
F I G. 16A
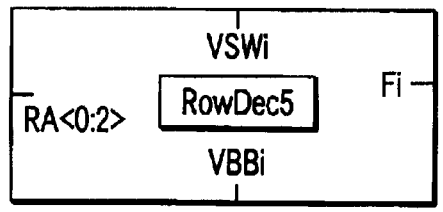
F I G. 16B

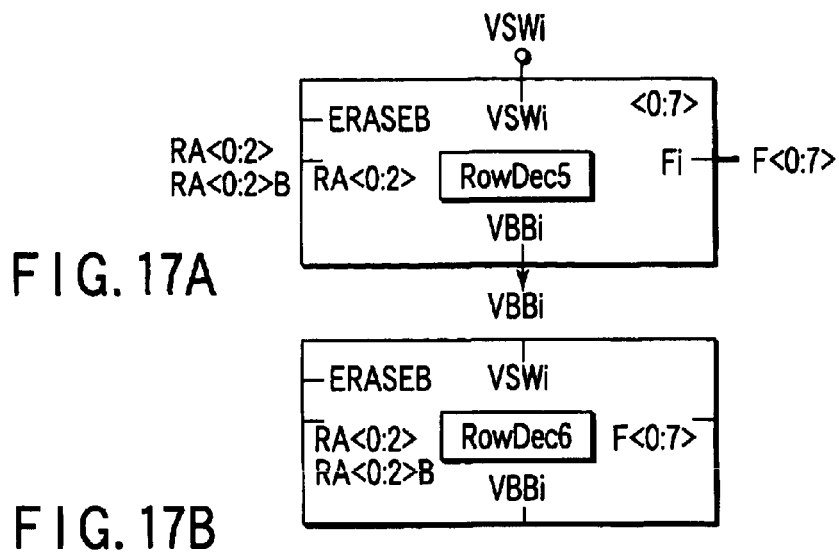
FIG. 17A
FIG. 17B
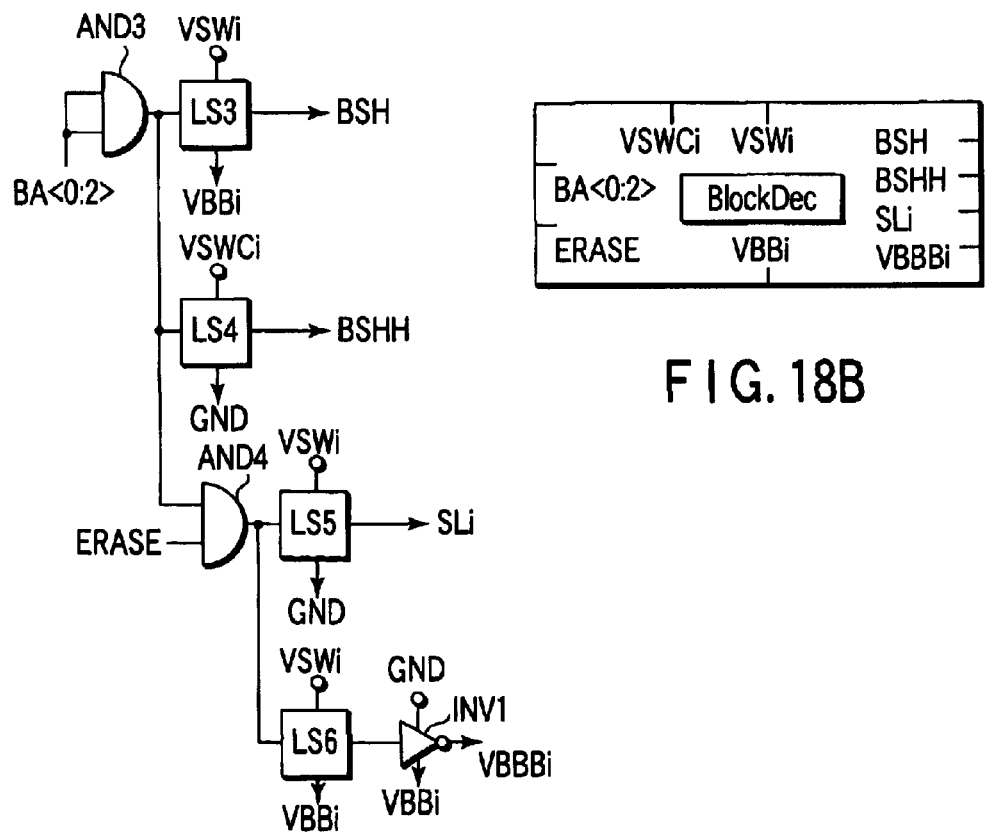
FIG. 18A
FIG. 18B

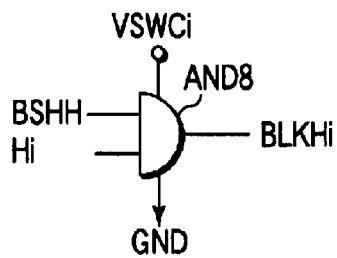
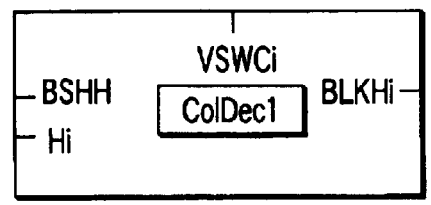
F I G. 22A          F I G. 22B
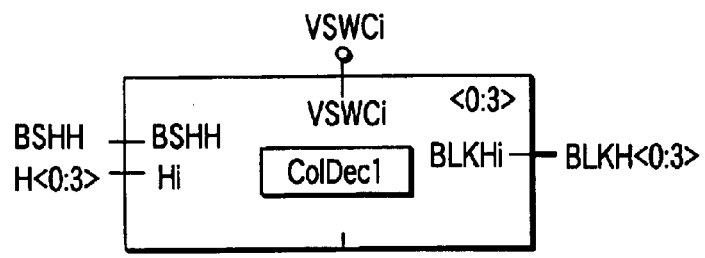
F I G. 23A
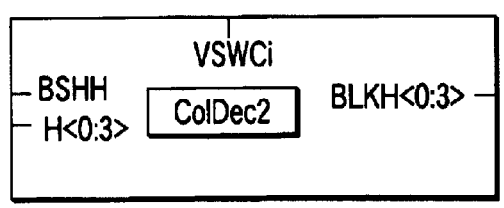
F I G. 23B
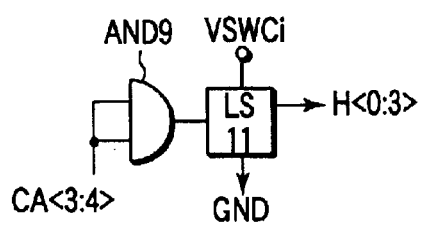
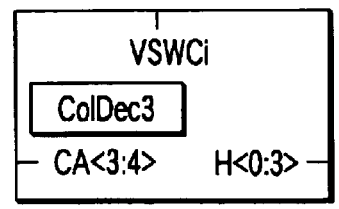
F I G. 24A          F I G. 24B

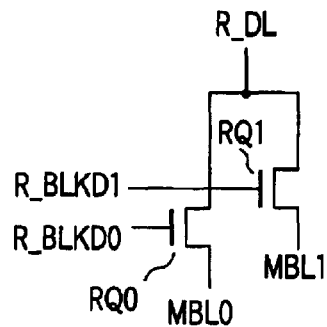
F I G. 25A
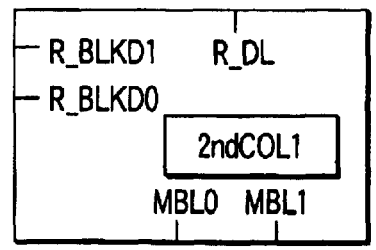
F I G. 25B
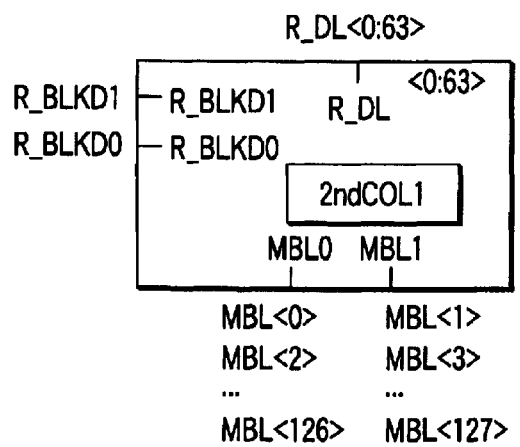
F I G. 26A
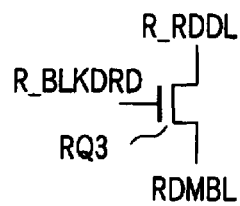
F I G. 26B
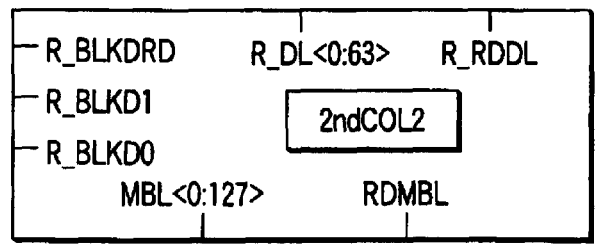
F I G. 26C

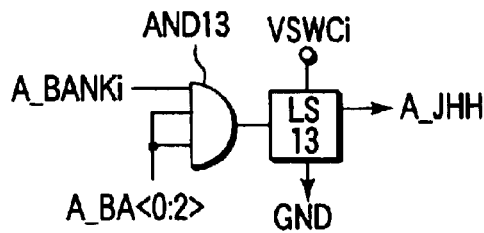 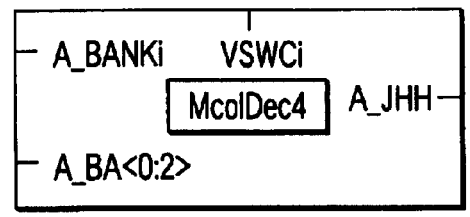
FIG. 33A  FIG. 33B
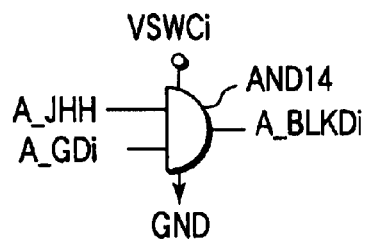 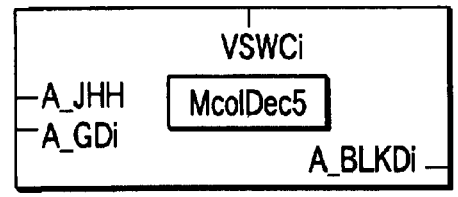
FIG. 34A  FIG. 34B
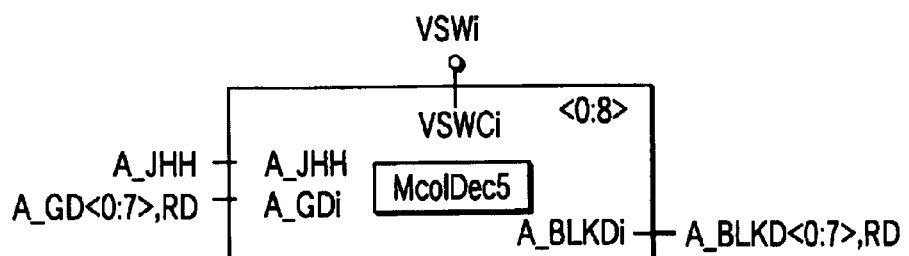
FIG. 35A
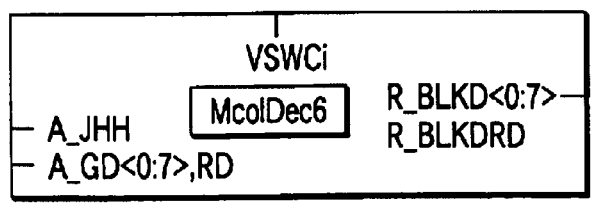
FIG. 35B

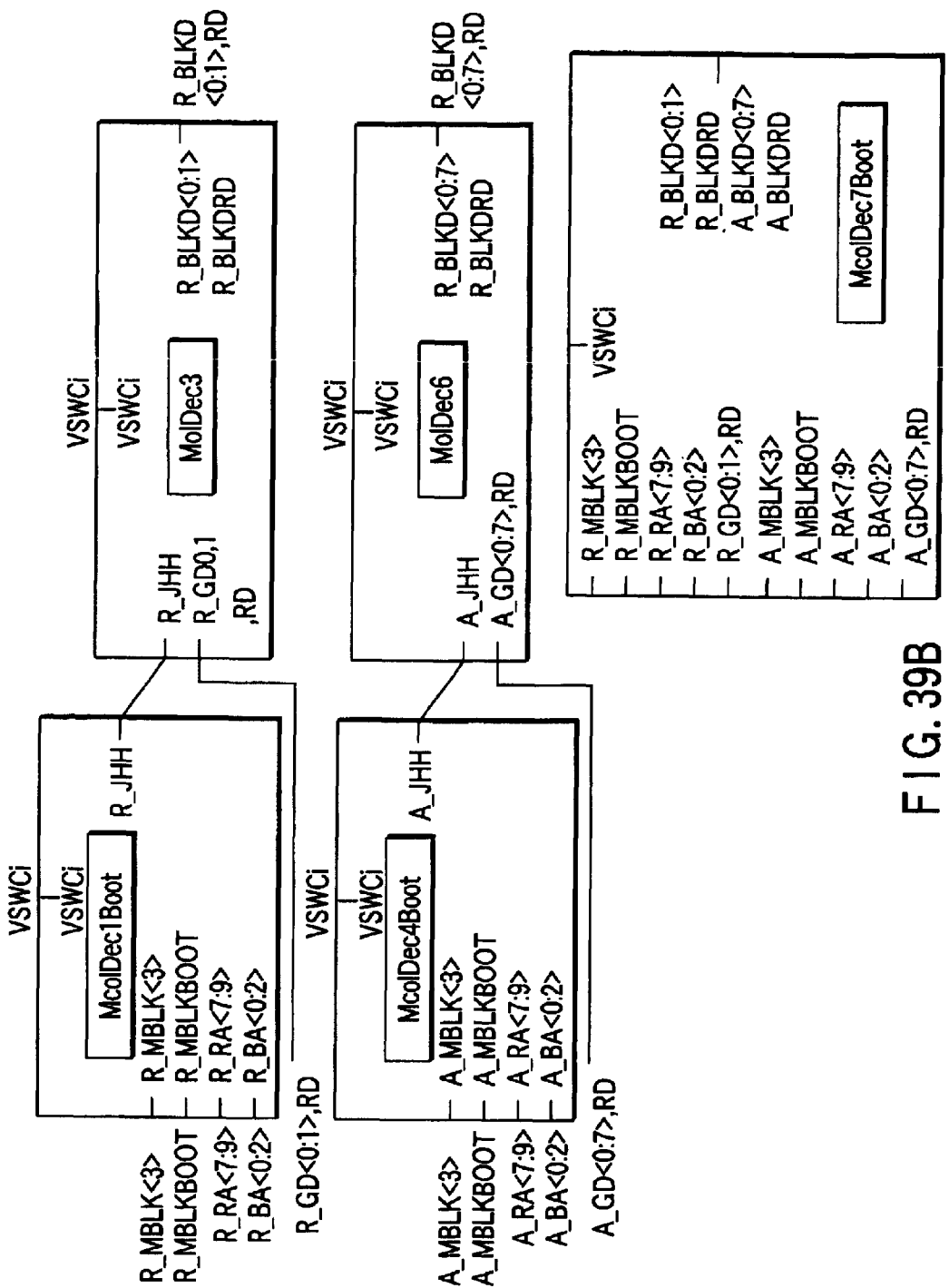

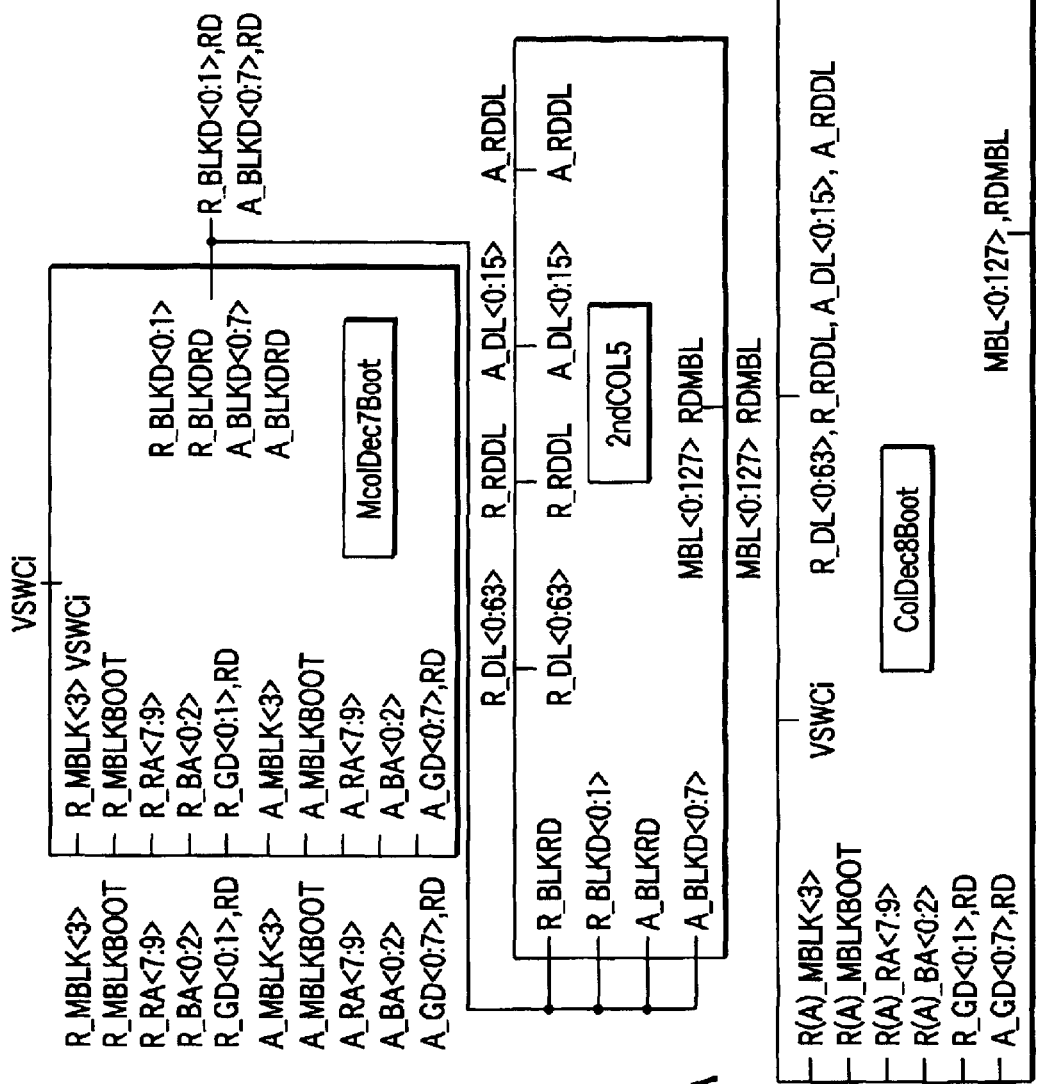
F I G. 41A
F I G. 41B

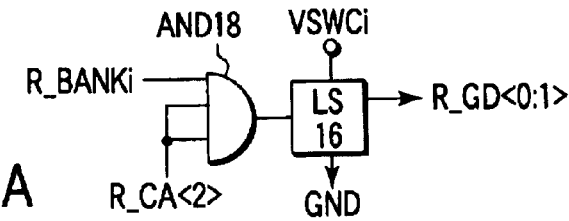
F I G. 42A
F I G. 42B
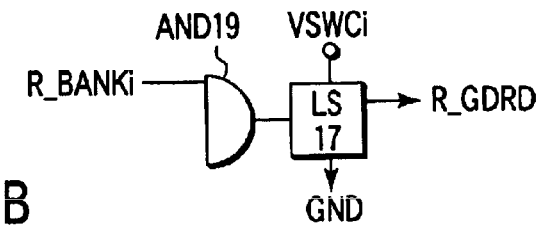
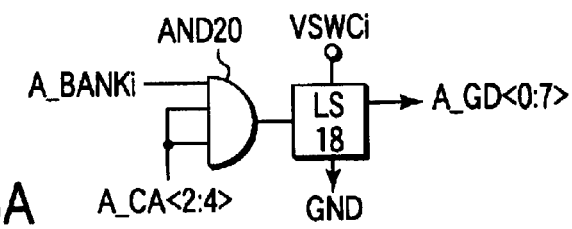
F I G. 43A
F I G. 43B
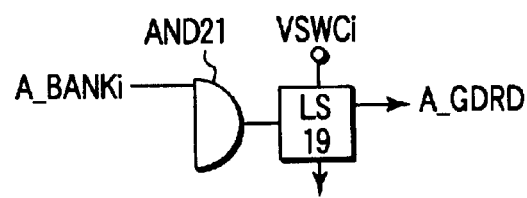
F I G. 44

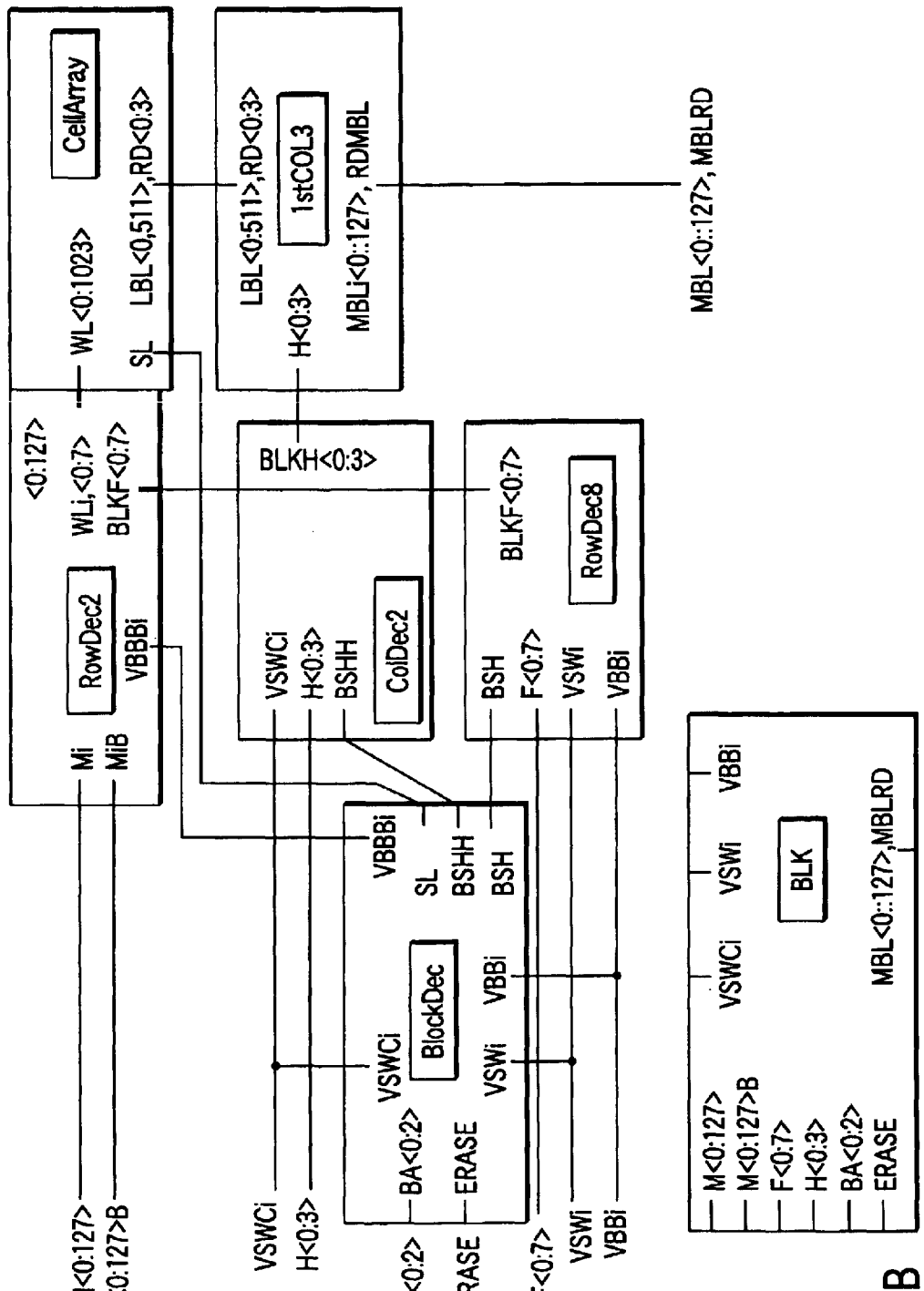
F I G. 47A    F I G. 47B

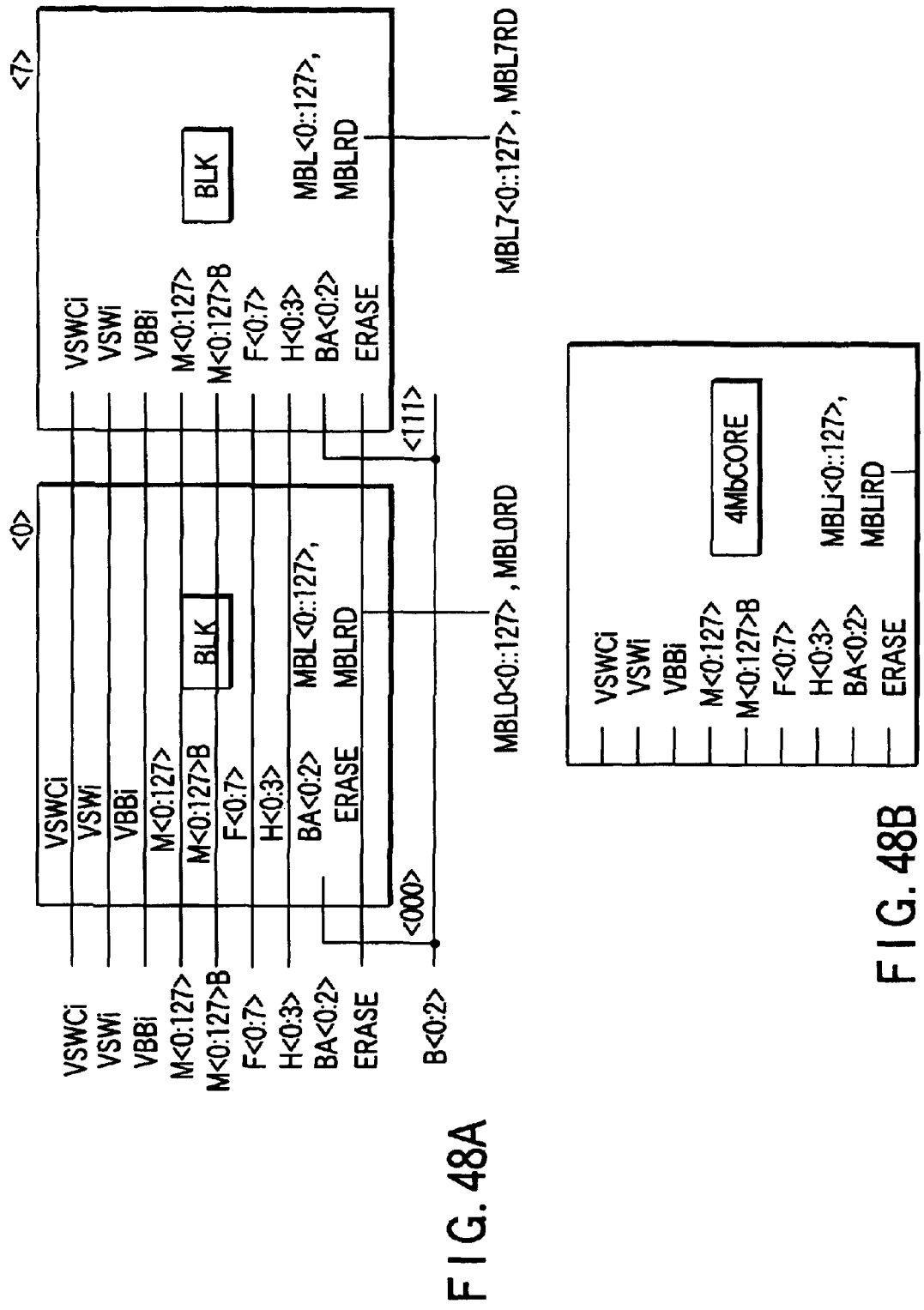
F I G. 48A
F I G. 48B

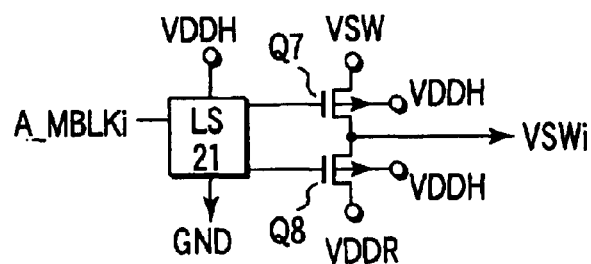
F I G. 55A
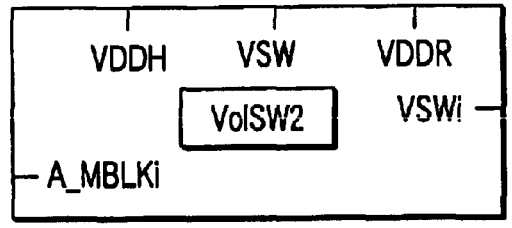
F I G. 55B
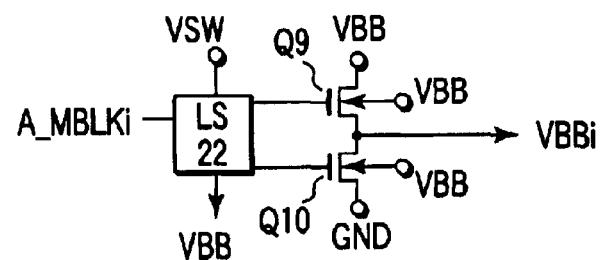
F I G. 56A
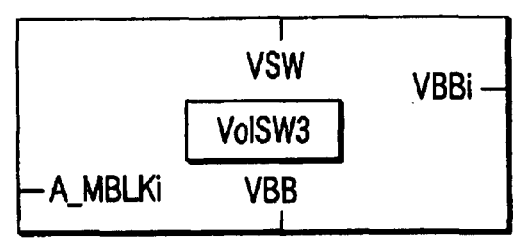
F I G. 56B

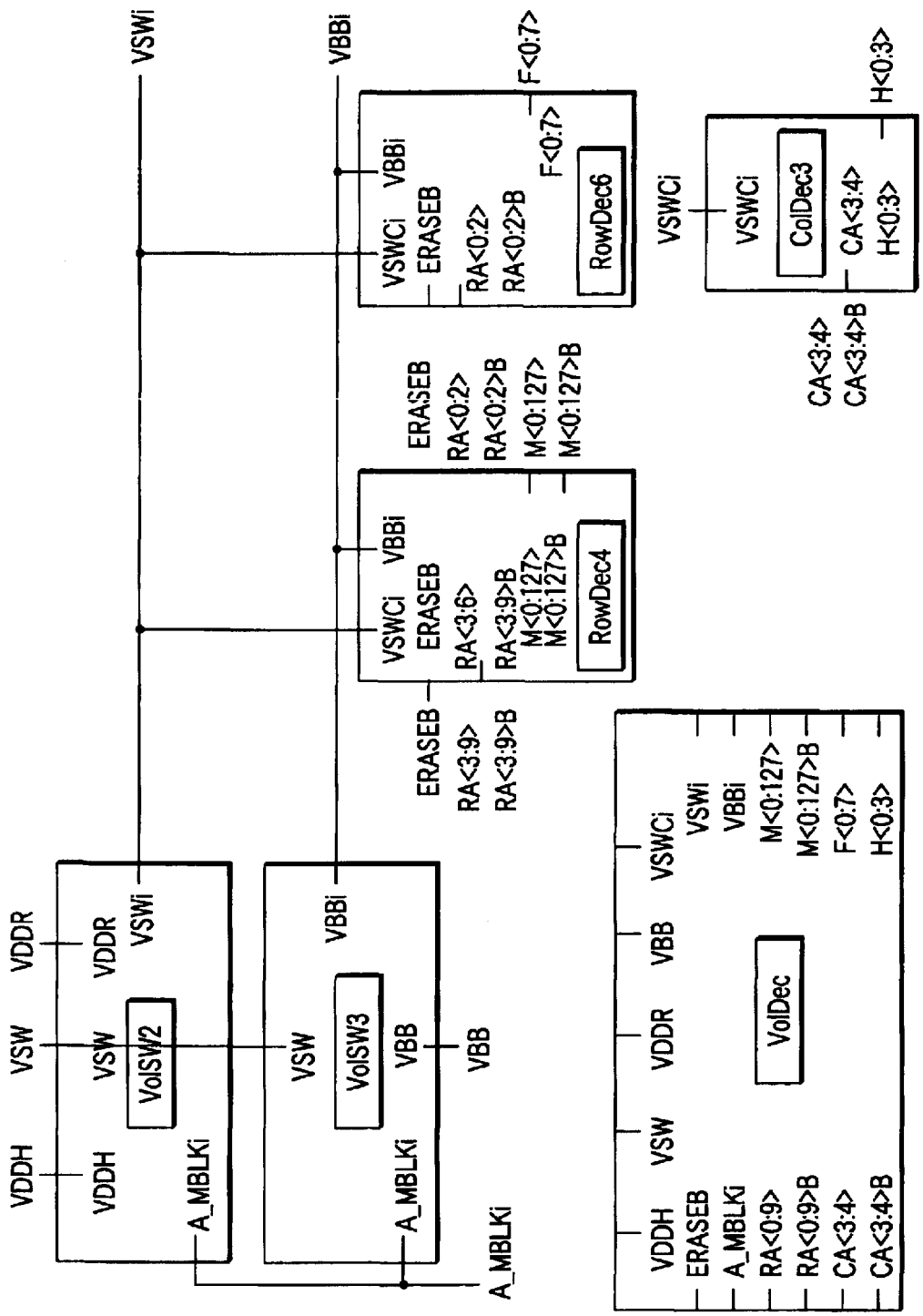
F I G. 60A
F I G. 60B

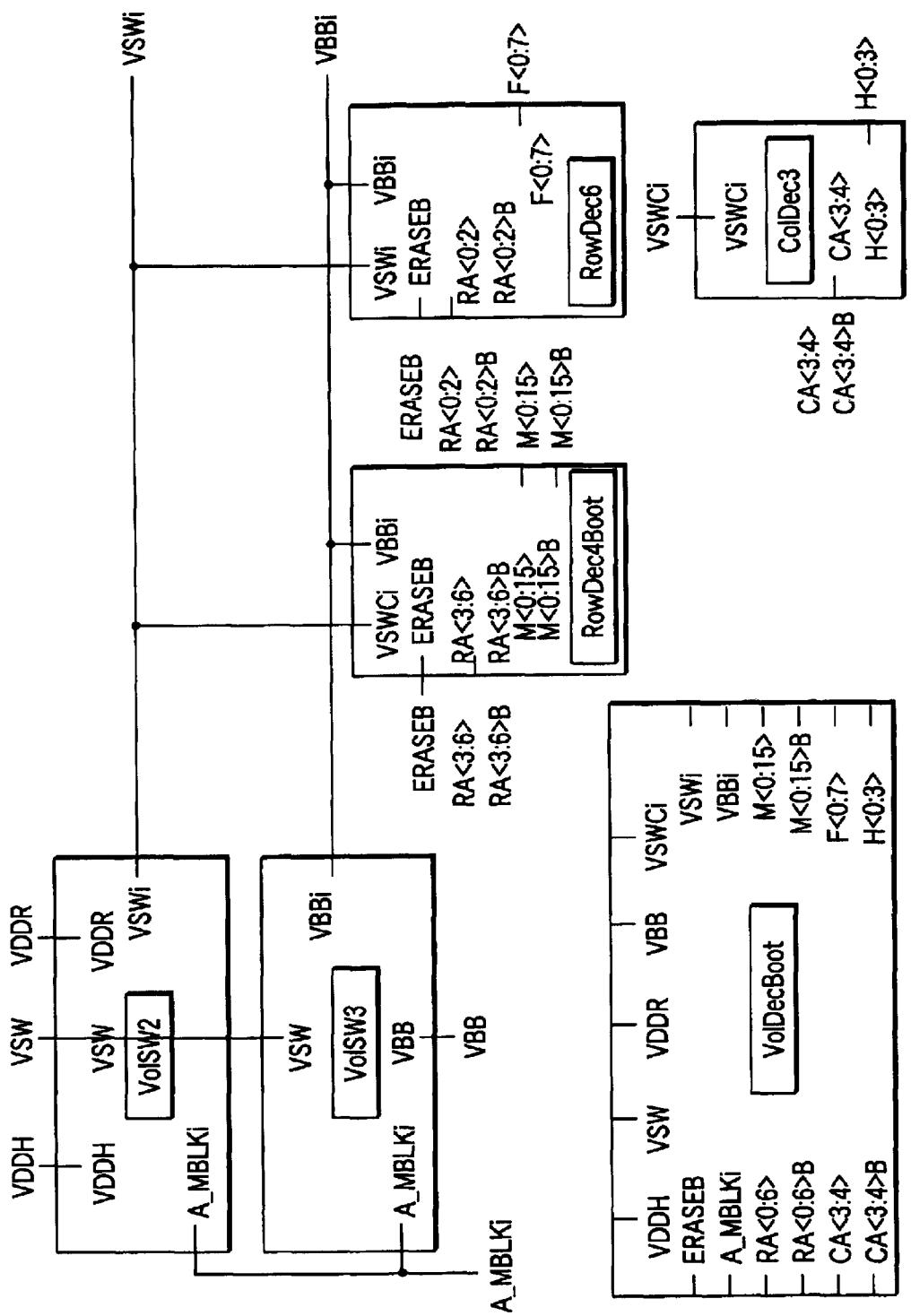
F I G. 62A
F I G. 62B

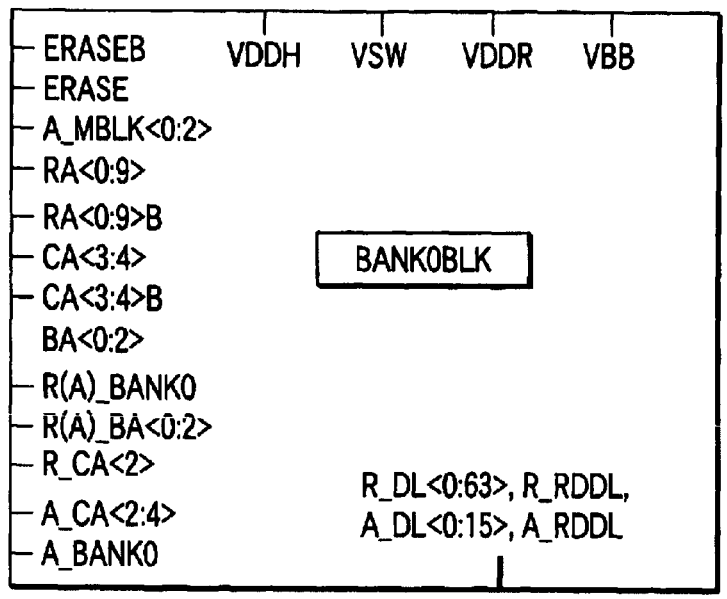
F I G. 65
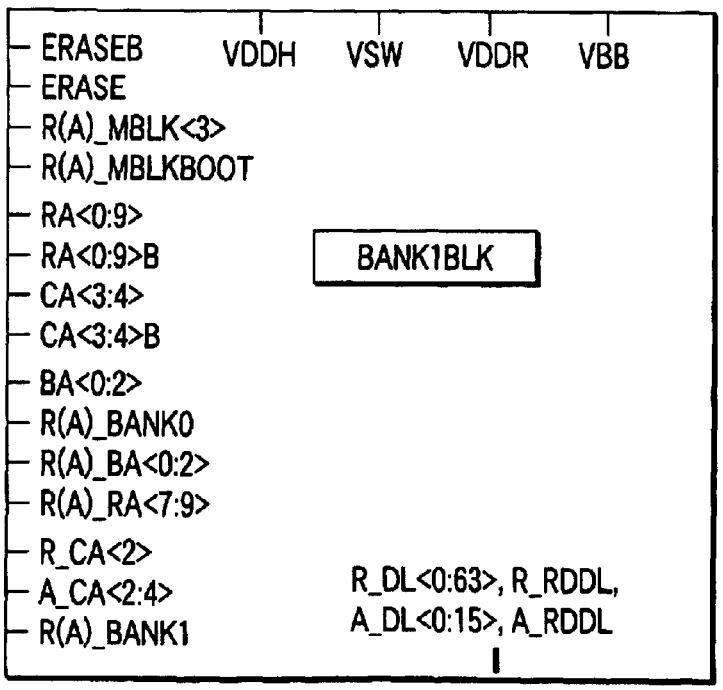
F I G. 68

```
                    VDDH   VSW   VDDR   VBB   VSWC1
    ERASEB ── ERASEB  │     │     │      │     │
    ERASE  ── ERASE   VDDH  VSW   VDDR   VBB   VSWCi
A_MBLK<3>  ── A_MBLKi   ┌──────────────────┐
   RA<0:9> ── RA<0:9>   │   4MbCoreVolDec  │
  RA<0:9>B ── RA<0:9>B  └──────────────────┘
    CA<3:4>── CA<3:4>    MBL0<0::127>,MBL0RD,
   CA<3:4>B── CA<3:4>B   ...,
    BA<0:2>── BA<0:2>    MBL7<0::127>,MBL7RD ERASEB ── ERASEB  VDDH  VSW   VDDR   VBB   VSWCi
    ERASE  ── ERASE
A_MBLKBOOT ── A_MBLKi   ┌──────────────────┐
   RA<0:9> ── RA<0:9>   │   BootCoreVolDec │
  RA<0:9>B ── RA<0:9>B  └──────────────────┘
    CA<3:4>── CA<3:4>    MBL0<0::127>,MBL0RD,
   CA<3:4>B── CA<3:4>B   ...,
    BA<0:2>── BA<0:2>    MBL7<0::127>,MBL7RD
```

MBL0<0::127>,MBL0RD,
...,
MBL7<0::127>,MBL7RD

F I G. 66A

```
    ─ ERASEB     VDDH   VSW   VDDR   VBB   VSWC1
    ─ ERASE
    ─ A_MBLK<3>        ┌──────────────────┐
    ─ A_MBLKBOOT       │  Bank1CoreVolDec │
    ─ RA<0:9>          └──────────────────┘
    ─ RA<0:9>B
    ─ CA<3:4>      MBL0<0::127>,MBL0RD,
    ─ CA<3:4>B     ...,
    ─ BA<0:2>      MBL7<0::127>,MBL7RD
```

F I G. 66B

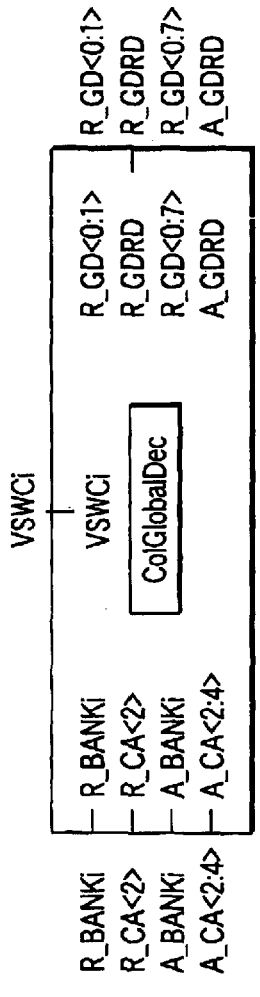
F I G. 69A
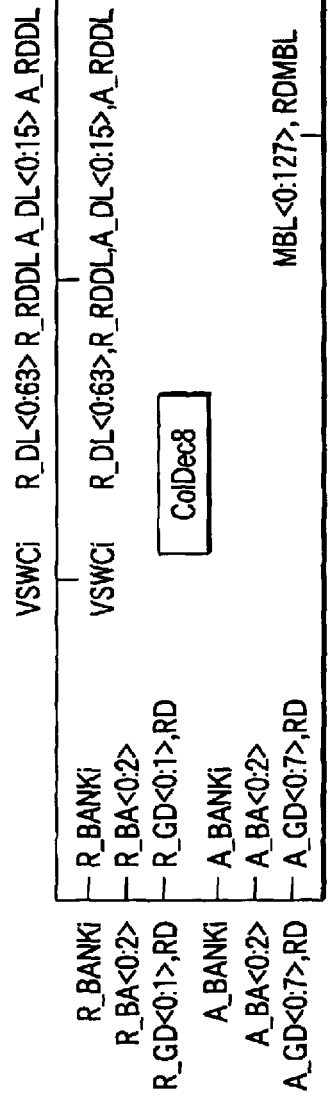
F I G. 69B
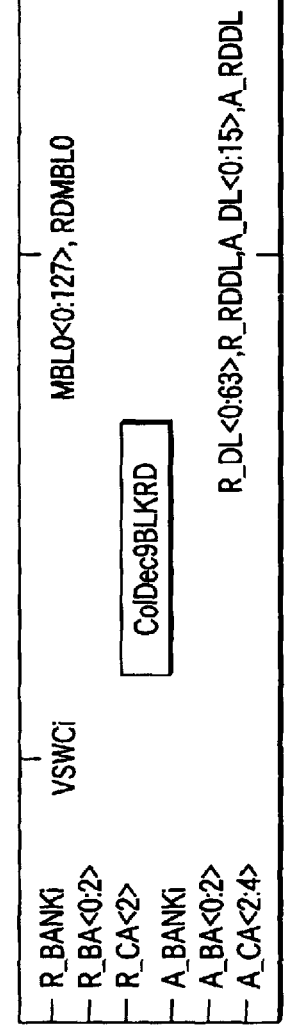
F I G. 69C

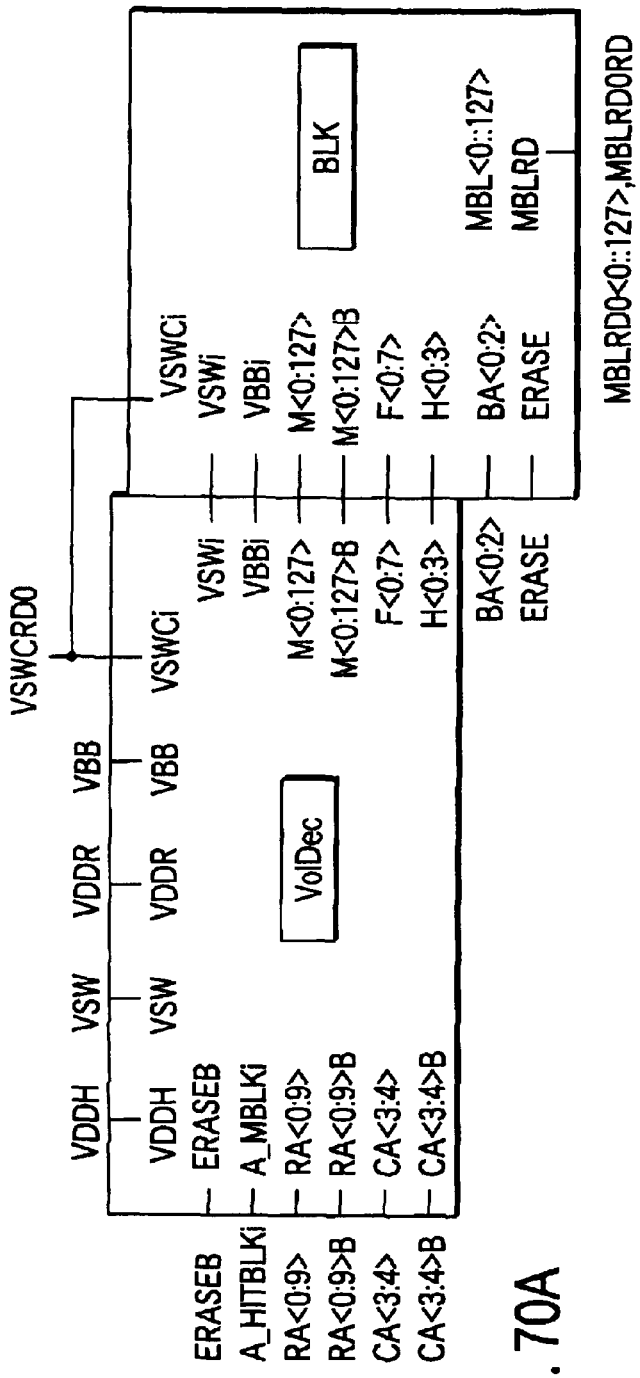
F I G. 70A
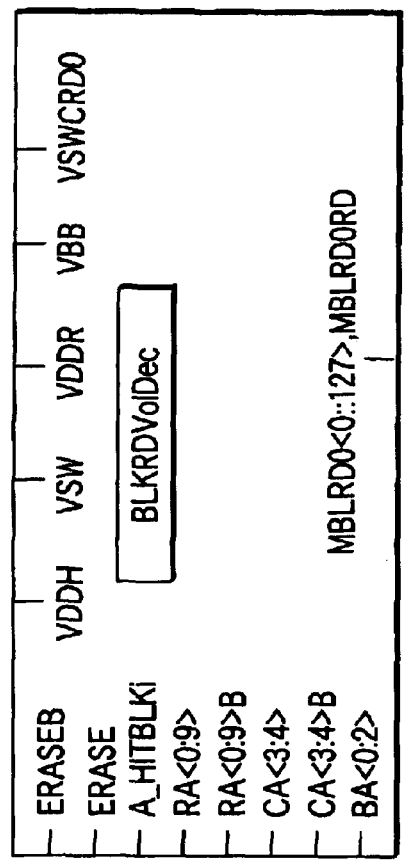
F I G. 70B

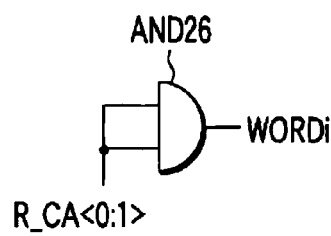
F I G. 81
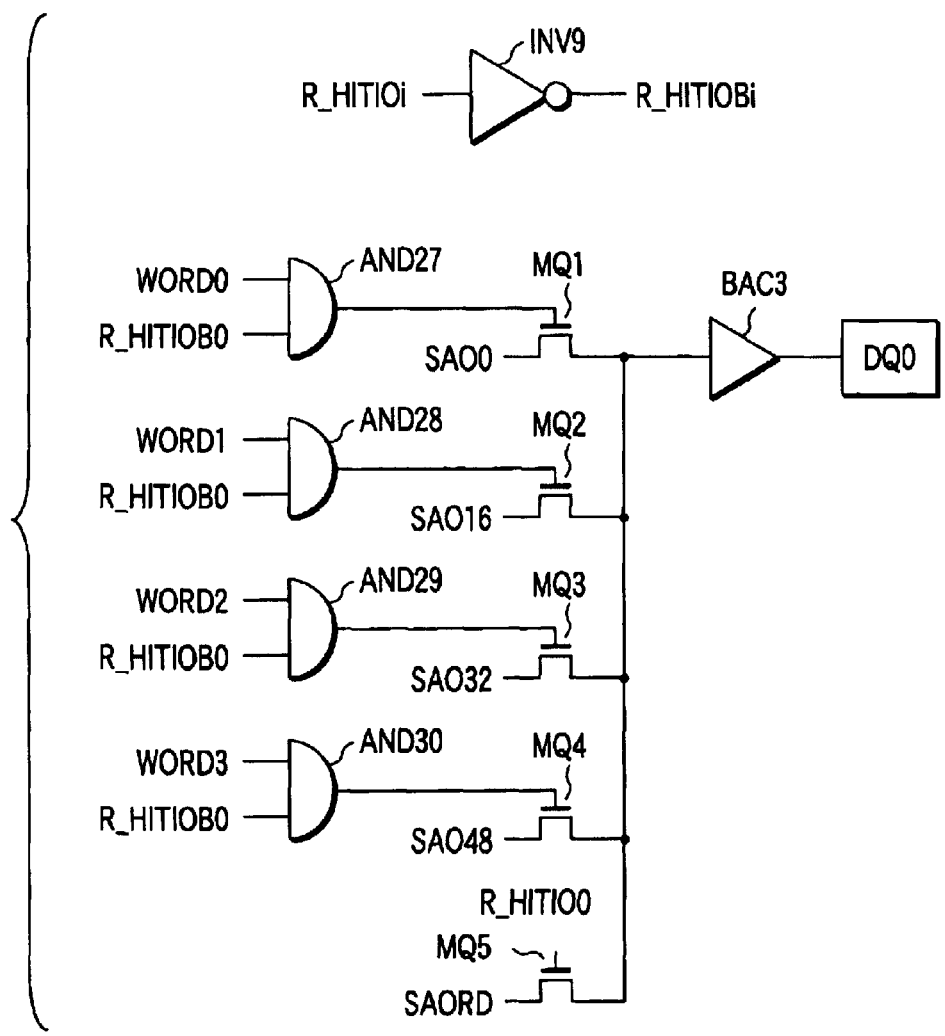
F I G. 82

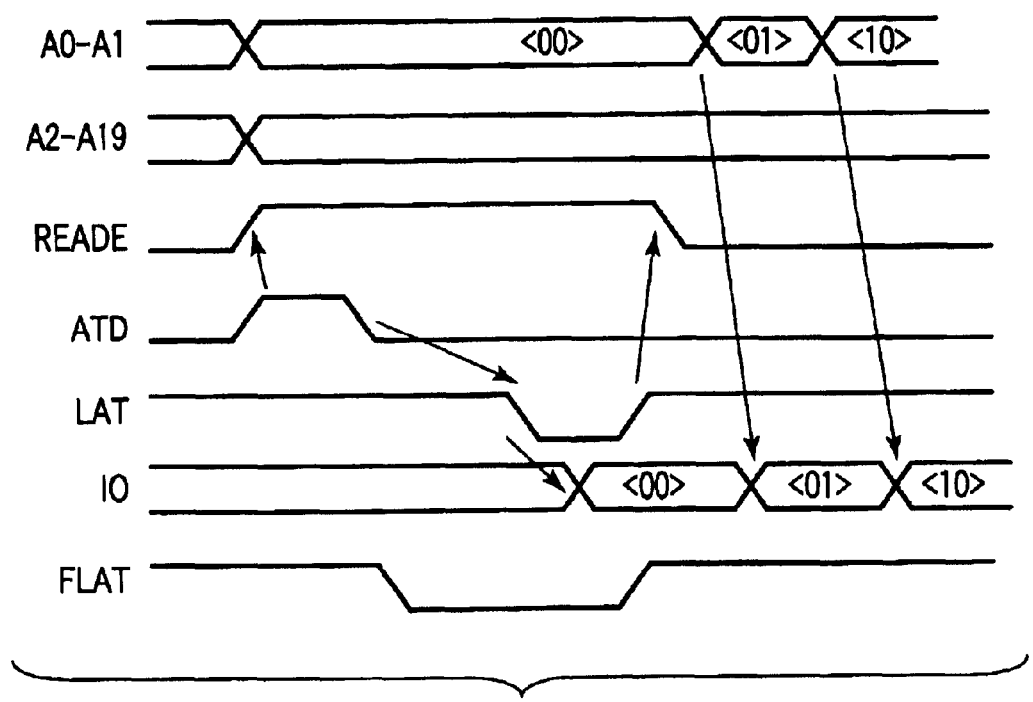
F I G. 90

| | | |
|---|---|---|
| A0 | CA0 | |
| A1 | CA1 | Intra-page (column) address |
| A2 | CA2 | |
| A3 | RA0 | |
| A4 | RA1 | |
| A5 | RA2 | |
| A6 | RA3 | |
| A7 | RA4 | Row address |
| A8 | RA5 | |
| A9 | RA6 | |
| A10 | RA7 | |
| A11 | RA8 | |
| A12 | RA9 | |
| A13 | CA3 | Page (column) address |
| A14 | CA4 | |
| A15 | BA0 | Block address |
| A16 | BA1 | |

|  | BL(4n) | BL(4n+1) | BL(4n+2) | BL(4n+3) |
|---|---|---|---|---|
| WL0 | page 0 | page 128 | page 256 | page 384 |
| WL1 | page 1 | page 129 | page 257 | page 385 |
| WL2 | page 2 | page 130 | page 258 | page 386 |
| ⋮ | ⋮ | ⋮ | ⋮ | ⋮ |
| WL127 | page 127 | page 255 | page 383 | page 511 |

FIG. 92A

|  | BL(4n) | BL(4n+1) | BL(4n+2) | BL(4n+3) |
|---|---|---|---|---|
| WL0 | page 0 | page 128 | page 256 | page 384 |
| WL1 | page 1 | page 129 | page 257 | page 385 |
| WL2 | page 2 | page 130 | page 258 | page 386 |
| ⋮ | ⋮ | ⋮ | ⋮ | ⋮ |
| WL127 | page 127 | page 255 | page 383 | page 511 |
| WL128 | page 512 | page 640 | page 768 | page 796 |
| ⋮ | ⋮ | ⋮ | ⋮ | ⋮ |
| WL255 | page 639 | page 767 | page 795 | page 923 |
| WL128 | page 3584 | page 3712 | page 3840 | page 3968 |
| ⋮ | ⋮ | ⋮ | ⋮ | ⋮ |
| WL255 | page 3711 | page 3839 | page 3967 | page 4095 |

FIG. 92C

| | | |
|---|---|---|
| A0 | CA0 | |
| A1 | CA1 | Intra-page (column) address |
| A2 | CA2 | |
| A3 | RA0 | |
| A4 | RA1 | |
| A5 | RA2 | |
| A6 | RA3 | Lower row address |
| A7 | RA4 | |
| A8 | RA5 | |
| A9 | RA6 | |
| A10 | CA3 | Page (column) address |
| A11 | CA4 | |
| A12 | RA7 | |
| A13 | RA8 | Upper row address & Boot block address |
| A14 | RA9 | |
| A15 | BA0 | Block address |
| A16 | BA1 | |

FIG. 92B

| | | |
|---|---|---|
| A0 | CA0 | Intra-page (column) address |
| A1 | CA1 | |
| A2 | RA0 | |
| A3 | RA1 | |
| A4 | RA2 | |
| A5 | RA3 | Lower row address |
| A6 | RA4 | |
| A7 | RA5 | |
| A8 | RA6 | |
| A9 | CA2 | |
| A10 | CA3 | Page (column) address |
| A11 | CA4 | |
| A12 | RA7 | |
| A13 | RA8 | Upper row address & Boot block address |
| A14 | RA9 | |
| A15 | BA0 | Block address |
| A16 | BA1 | |

FIG. 94B

| A0  | CA0 | Intra-page (column) address |
| A1  | CA1 | |
| A2  | RA0 | |
| A3  | RA1 | |
| A4  | RA2 | |
| A5  | RA3 | |
| A6  | RA4 | Row address |
| A7  | RA5 | |
| A8  | RA6 | |
| A9  | RA7 | |
| A10 | RA8 | |
| A11 | RA9 | |
| A12 | CA2 | |
| A13 | CA3 | Page (column) address |
| A14 | CA4 | |
| A15 | BA0 | Block address |
| A16 | BA1 | |

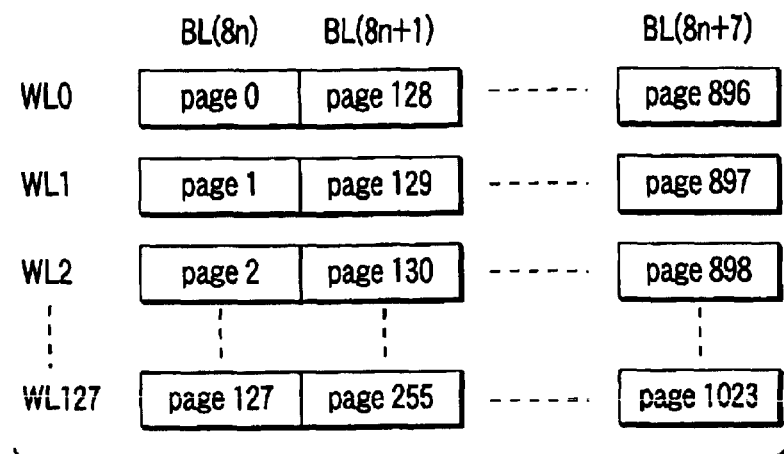
F I G. 94A
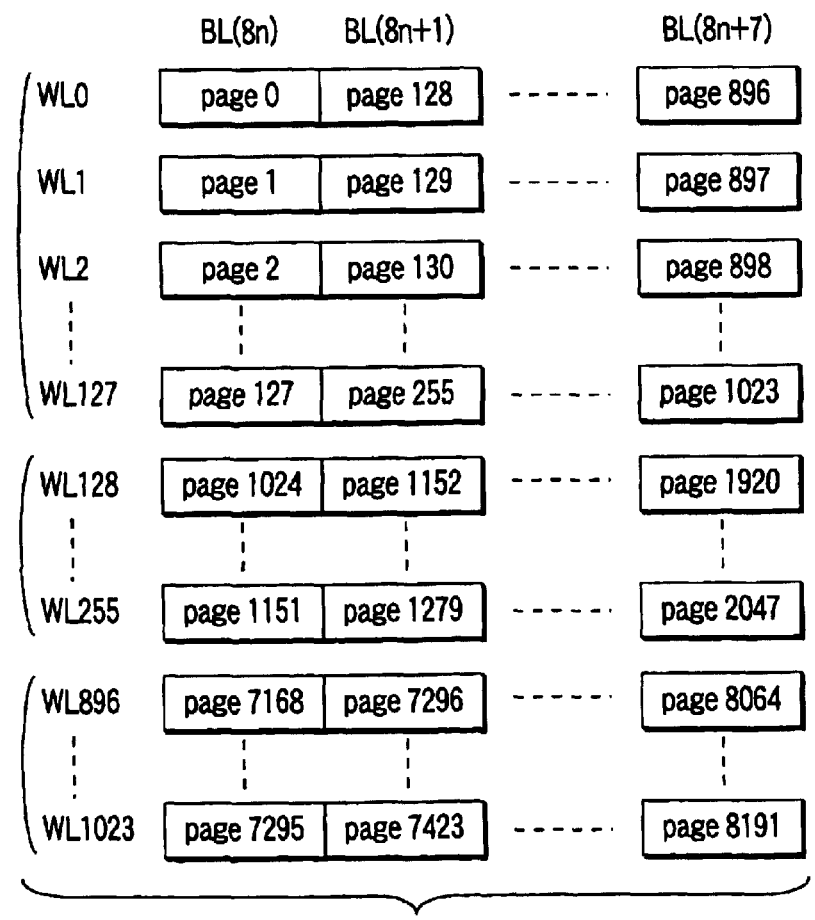
F I G. 94C

| A0 | CA0 | Intra-page (column) address |
|---|---|---|
| A1 | CA1 | |
| A2 | RA0 | |
| A3 | RA1 | |
| A4 | RA2 | |
| A5 | RA3 | |
| A6 | RA4 | Row address |
| A7 | RA5 | |
| A8 | RA6 | |
| A9 | RA7 | |
| A10 | RA8 | |
| A11 | CA2 | |
| A12 | CA3 | Page (column) address |
| A13 | CA4 | |
| A14 | CA5 | |
| A15 | BA0 | Block address |
| A16 | BA1 | |

| | | |
|---|---|---|
| A0 | CA0 | Intra-page (column) address |
| A1 | CA1 | |
| A2 | RA0 | |
| A3 | RA1 | |
| A4 | RA2 | |
| A5 | RA3 | Lower row address |
| A6 | RA4 | |
| A7 | RA5 | |
| A8 | RA6 | |
| A9 | CA2 | |
| A10 | CA3 | Page (column) address |
| A11 | CA4 | |
| A12 | RA7 | |
| A13 | RA8 | Upper row address & Boot block address |
| A14 | RA9 | |
| A15 | BA0 | Block address |
| A16 | BA1 | |

F I G. 96B

| | | |
|---|---|---|
| A0 | CA0 | Intra-page (column) address |
| A1 | CA1 | |
| A2 | RA0 | |
| A3 | RA1 | |
| A4 | RA2 | |
| A5 | RA3 | Lower row address |
| A6 | RA4 | |
| A7 | RA5 | |
| A8 | CA2 | |
| A9 | CA3 | Page (column) address |
| A10 | CA4 | |
| A11 | CA5 | |
| A12 | RA6 | |
| A13 | RA7 | Upper row address & Boot block address |
| A14 | RA8 | |
| A15 | BA0 | Block address |
| A16 | BA1 | |

F I G. 98B

| A0 | CA0 | Intra-page (column) address |
| A1 | CA1 | |
| A2 | RA0 | |
| A3 | RA1 | |
| A4 | RA2 | |
| A5 | RA3 | |
| A6 | RA4 | Row address |
| A7 | RA5 | |
| A8 | RA6 | |
| A9 | RA7 | |
| A10 | RA8 | |
| A11 | CA2 | |
| A12 | CA3 | Page (column) address |
| A13 | CA4 | |
| A14 | CA5 | |
| A15 | BA0 | Block address |
| A16 | BA1 | |

NONVOLATILE SEMICONDUCTOR MEMORY WITH A PAGE MODE

CROSS-REFERENCE TO RELATED APPLICATIONS

This application is based upon and claims the benefit of priority from the prior Japanese Patent Application No. 2001-269423, filed Sep. 5, 2001, the entire contents of which are incorporated herein by reference.

BACKGROUND OF THE INVENTION

1. Field of the Invention

This invention relates to a nonvolatile semiconductor memory, such as a flash memory, and more particularly to an address allocating method for a nonvolatile semiconductor memory with a page mode (page reading function).

2. Description of the Related Art

One known nonvolatile semiconductor memory is a flash memory. FIG. 1 is a sectional view of a memory cell in the flash memory. The memory cell (or memory cell transistor) is composed of a MOSFET (Metal Oxide Semiconductor Field-Effect Transistor), which has a stacked-gate structure where a floating gate FG and a control gate CG are stacked on top of the other via an insulating film. Specifically, in this example, an N-well region 101 is formed in a P-substrate. In the N-well region 101, a P-well region 102 is formed. At the surface of the P-well region 102, an $n^+$-type impurity diffused region 103 acting as the drain region of the MOSFET, an $n^+$-type impurity diffused region 104 acting as the source region, and a $p^+$-type impurity diffused region 105 are formed. On the substrate 100 between the impurity diffused regions 103 and 104, a gate insulating film 106, a floating gate FG, an insulating film 107, and a control gate CG are stacked in that order. At the surface of the N-well region 101, there is provided an $n^+$-type impurity diffused region 108, which is connected to the impurity diffused region 104 and impurity diffused region 105. In addition, at the main surface of the substrate 100, there is provided a $p^+$-type impurity diffused region 109, which is then connected to the ground point.

In the memory cell transistor, the threshold voltage with respect to the control gate CG changes (or shifts) according to the number of electrons accumulated in the floating gate FG. The memory cell transistor stores "0" or "1" data according to a change in the threshold voltage.

FIG. 2 shows a part of a memory cell array where units of the memory cell transistor are arranged in a matrix. The control gates of the individual memory cell transistors MC are connected to word lines WL0 to WLn on a row basis. The drains of the individual memory cell transistors MC are connected to bit lines BL0 to BLm on a column basis. The sources of the individual memory cell transistors MC are all connected to a ground point Vss (source line).

FIG. 3 shows the relationship between the control gate voltage and the drain current in the memory cell transistor of FIG. 1. A state where the number of electrons accumulated in the floating gate FG is relatively large (that is, the threshold voltage Vt of the memory cell transistor is high) is defined as "0" data. Conversely, a state where the number of electrons accumulated in the floating gate FG is relatively small (that is, the threshold voltage Vt of the memory cell transistor is low) is defined as "1" data. The bias conditions for data reading, erasing, and writing are shown in TABLE 1:

TABLE 1

|     | Read | Program     | Erase    |
|-----|------|-------------|----------|
| Vg  | 5 V  | 9 V         | −7 V     |
| Vd  | 1 V  | 5 ("0") 0 ("1") | Floating |
| Vs  | 0 V  | 0 V         | 10 V     |

The data is read by applying voltage Vd (=1 V) to the drain of the memory cell transistor, voltage Vs (=0 V) to the source, and voltage Vg (=5 V) to the control gate CG. Whether the stored data is "1" or "0" is determined, depending on whether cell current Icell flows or not.

Erasing is effected all at once on the memory cells that share the source and the P-well region 102. When the drain is set in the floating state, the source voltage Vs is set to Vs=10 V, and the control gate voltage Vg is set to Vg=−7 V, electrons flow from the floating gate FG to the substrate because of an F-N tunnel phenomenon, which sets all of the memory cells to be erased to "1" data.

In contrast, writing is done bit by bit. In a state where the source voltage Vs is set to Vs=0 V and the control gate voltage Vg is set to Vg=9 V, a 5 V bias (drain voltage Vd=5 V) is applied to the bit line of the cell into which "0" is to be written, which causes high-energy electrons generated in a channel hot electron phenomenon to be injected into the floating gate. At this time, when the bit line to be kept at "1" is set to 0 V (drain voltage Vd=0 V), this prevents electrons from being injected, resulting in no change in the threshold voltage Vt.

Next, to check the program or erase operation, program verify or erase verify is performed. In the program verify, the control gate voltage Vg is set to a voltage Vpv higher than that in reading, thereby performing "0" reading. Then, a write operation and a program verify operation are carried out alternately. When all of the cells to be written into have the "0," the writing operation is ended. Similarly, in erasing, a voltage Vev lower than the voltage in reading is applied to the control gate CG, thereby carrying out a "1" reading erase verify operation, which secures the cell current Icell sufficiently. As described above, the word-line voltage to the cell varies according to the operation mode.

With the recent improvements in the data processing speed of CPUs (Central Processing Units), flash memories are required to have higher-speed data transmission speed. Such flash memory as shortens the total data output time of consecutive words by having a page mode reading function as DRAM or SRAM has been put on the market (see ISSCC2001 DIGEST OF TECHNICAL PAPERS pp. 32–33, February 2001, B. Pathank et al., "A 1.8-V 64-Mb 100-MHz Flexible Read While Write Flash Memory"). A collection of words, that is, a page, is specified by a page address. Any word on the page is specified by an intra-page address (in-page address). Since words on the page have consecutive addresses, the intra-page addresses are allocated to the column side. Therefore, in a case where low-order addresses are allocated to the column side, addresses higher in order than these addresses are allocated to the row side, and addresses still higher in order are allocated to block addresses, when a program composed of several tens of to hundreds of consecutive words is read, the number of word lines to be selected is smaller than that in a conventional method of allocating low-order addresses to the row side, middle-order addresses to the column side, and high-order addresses to block addresses. As a result, the time during which reading stress per line is applied becomes longer, which makes it more difficult to maintain the data reliability.

For example, when cells for 32 words are connected to a single word line, consider a case where 128 words continue to be read for ten years. When there is no page mode function, since allocating the low-order addresses to the rows makes it possible to read 128 word lines equally, the stress time per word line is $3 \times 10^8$ sec/128 words=$3 \times 10^6$ sec. On the other hand, when the page size is 8 words, four pages are allocated to a single word line and 128 words are allocated to four word lines. As a result, since eight words can be read during the time required to read one word, the word line stress time with respect to the time required to read eight words is $\frac{1}{8}$. However, because the number of word lines decreases to $\frac{4}{128}$, the length of time that a single word line is selected becomes 32 times the present value. As a result, the word line stress time (or read disturb time) is four times as long as that when there is no page mode.

As described above, the conventional nonvolatile semiconductor memory with a page mode reading function to realize high-speed data transfer speed has the problem of increasing the read disturb time. Measures to deal with this problem have been needed.

BRIEF SUMMARY OF THE INVENTION

According to an aspect of the present invention, there is provided a nonvolatile semiconductor memory comprising: a plurality of nonvolatile memory cells, at least one of the plurality of nonvolatile memory cells is addressed by address signals Ai (i=0, ..., I−1), each of the address signals Ai (i=0, ..., I−1) including first address subset Aj (j=0, ..., J−1), second address subset Ak (k=J, ..., K−1), and third address subset Al (l=K, ..., L−1); a plurality of word lines and a plurality of bit lines which are connected to the plurality of nonvolatile memory cells; an address buffer to which the first address subset is inputted as a first column address, the second address subset is inputted as a first row address, and a third address subset is inputted as a second column address; and a decoder to which the output signal of the address buffer is supplied and which is configured to select at least one of the plurality of nonvolatile memory cells, wherein the plurality of bit lines are selected by at least the third address subset, and the plurality of word lines are selected by at least the second address subset.

According to another aspect of the present invention, there is provided a nonvolatile semiconductor memory with at least as many sense amplifiers as correspond to $2^{N1}$ words comprising: a plurality of nonvolatile memory cells; a plurality of word lines and a plurality of bit lines which are connected to the plurality of nonvolatile memory cells; an address buffer to which an N1 number of address subset of the lowest order are inputted as a first column address, an N2 number of address subset higher than any of the N1 number of address subset are inputted as a first row address, and an N3 number of address subset higher in order than any of the N2 number of address subset are inputted as a second column address; and a decoder to which the output signal of the address buffer is supplied and which is configured to select at least one of the plurality of nonvolatile memory cells, wherein the plurality of bit lines are selected by at least the second column address, and the plurality of word lines are selected by at least the first row address.

According to still another aspect of the present invention, there is provided a nonvolatile semiconductor memory with at least as many sense amplifiers as correspond to $2^{N1}$ words comprising: a plurality of nonvolatile memory cells; a plurality of word lines and a plurality of bit lines which are connected to the plurality of nonvolatile memory cells; an address buffer to which an N1 number of address subset of the lowest order are inputted as an intra-page address, an N2 number of address subset higher in order than any of the N1 number of address subset are inputted as a first row address, and an N3 number of address subset higher in order than any of the N2 number of address subset are inputted as a page address; and a decoder to which the output signal of the address buffer is supplied and which is configured to select at least one of the plurality of nonvolatile memory cells, wherein the plurality of bit lines are selected by at least the page address, and the plurality of word lines are selected by at least the first row address.

According to still another aspect of the present invention, there is provided a nonvolatile semiconductor memory comprising: a plurality of nonvolatile memory cells; a plurality of word lines and a plurality of bit lines which are connected to the plurality of nonvolatile memory cells; a first address buffer to which a first address subset is inputted; a second address buffer to which a second address subset higher in order than the first address subset is inputted; a third address buffer to which a third address subset higher in order than the second address subset is inputted; a row decoder to which the output of the second address buffer is inputted and which selects one of the plurality of word lines when reading the data stored in the plurality of nonvolatile memory cells; a column decoder to which the output of the third address buffer is inputted and which selects at least an N (where N is a positive integer equal to or larger than 2) number of bit lines from the plurality of bit lines when reading the data stored in the plurality of nonvolatile memory cells; at least an N number of sense amplifiers which read the data in the memory cells selected for reading; a multiplexer to which the output of the first address buffer is inputted and which selects an M number of outputs from the outputs of the N number of sense amplifiers; and an output buffer to which the output of the multiplexer is inputted.

According to still another aspect of the present invention, there is provided a nonvolatile semiconductor memory comprising: a plurality of nonvolatile memory blocks, each of which includes a plurality of nonvolatile memory cells, a plurality of word lines and a plurality of bit lines which are connected to the plurality of nonvolatile memory cells, a row decoder which selects one of the plurality of word lines when reading the data stored in the plurality of nonvolatile memory cells, and a column decoder which selects at least an N (where N is a positive integer equal to or larger than 2) number of bit lines from the plurality of bit lines when reading the data stored in the plurality of nonvolatile memory cells; a first address buffer to which a first address subset is inputted; a second address buffer to which a second address subset higher in order than the first address subset is inputted; a third address buffer to which a third address subset higher in order than the second address subset is inputted; a fourth address buffer to which a fourth address subset higher in order than the third address subset is inputted; at least an N number of sense amplifiers which read the data in the memory cells selected for reading; a multiplexer to which the output of the first address buffer is inputted and which selects an M number of outputs from the outputs of the N number of sense amplifiers; an output buffer to which the output of the multiplexer is inputted; and a block decoder to which the output of the fourth address buffer is inputted and which selects one of the plurality of nonvolatile memory blocks when reading the data stored in the plurality of nonvolatile memory cells, wherein one of the word-lines is selected by the output of the second address buffer and the output of the block decoder, and at least one of the bit-lines is selected by the output of at least the third address buffer and the output of the block decoder.

According to still another aspect of the present invention, there is provided a nonvolatile semiconductor memory comprising: a plurality of nonvolatile memory blocks, each of which includes a plurality of nonvolatile memory cells, a plurality of word lines and a plurality of bit lines which are connected to the plurality of nonvolatile memory cells, a row decoder which selects one of the plurality of word lines when reading the data stored in the plurality of nonvolatile memory cells, and a column decoder which selects at least an N (where N is a positive integer equal to or larger than 2) number of bit lines from the plurality of bit lines when reading the data stored in the plurality of nonvolatile memory cells; a first address buffer to which a first address subset is inputted; a second address buffer to which a second address subset higher in order than the first address subset is inputted; a third address buffer to which a third address subset higher in order than the second address subset is inputted; a fourth address buffer to which a fourth address subset higher in order than the third address subset is inputted; a fifth address buffer to which a fifth address subset higher in order than the fourth address subset is inputted; at least an N number of sense amplifiers which read the data in the memory cells selected for reading; a multiplexer to which the output of the first address buffer is inputted and which selects an M number of outputs from the outputs of the N number of sense amplifiers; an output buffer to which the output of the multiplexer is inputted; and a block decoder to which the output of the fifth address buffer is inputted and which selects one of the plurality of nonvolatile memory blocks when reading the data stored in the plurality of nonvolatile memory cells, wherein one of the word-lines is selected by the outputs of the second and fourth address buffers and the output of the block decoder, and at least one of the bit-lines is selected by the output of at least the third address buffer and the output of the block decoder.

BRIEF DESCRIPTION OF THE SEVERAL VIEWS OF THE DRAWING

FIG. 5 is a block diagram showing an layout image of a 2-bank 16-Mbit flash memory with two redundancy blocks;

FIG. 6A is a circuit diagram showing the configuration of a column gate for selectively connecting a local bit line made of a first-level metal layer in a block to a main bit line made of a third-level metal layer;

FIG. 6B shows a symbol for the column gate shown in FIG. 6A;

FIG. 7A is a block diagram of a column gate including eight units of the column gate shown in FIGS. 6A and 6B;

FIG. 7B shows a symbol for the column gate shown in FIG. 7A;

FIG. 11A is a circuit diagram of a row decoder connected to each word line;

FIG. 11B shows a symbol for the row decoder shown in FIG. 11A;

FIG. 12A is a block diagram of a row decoder controlled by a pre-decode signal pair;

FIG. 12B shows a symbol for the row decoder shown in FIG. 12A;

FIG. 13 is a block diagram of a row decoder including 128 units of the row decoder shown in FIGS. 12A and 12B;

FIG. 14A is a circuit diagram of a pre-decoder that outputs a pre-decode signal pair;

FIG. 14B shows a symbol for the pre-decoder shown in FIG. 14A;

FIG. 15A is a block diagram of a row decoder including 128 units of the pre-decoder shown in FIGS. 14A and 14B;

FIG. 15B shows a symbol for the row decoder shown in FIG. 15A;

FIG. 16A is a circuit diagram of a row decoder that drives a selected word line;

FIG. 16B shows a symbol for the row decoder shown in FIG. 16A;

FIG. 17A is a block diagram of a row decoder composed of eight units of the row decoder shown in FIGS. 16A and 16B;

FIG. 17B shows a symbol for the row decoder shown in FIG. 17A;

FIG. 18A is a circuit diagram of a block decoder;

FIG. 18B shows a symbol for the block decoder shown in FIG. 18A;

FIG. 22A is a circuit diagram of a column decoder (signal BLKHi generating circuit);

FIG. 22B shows a symbol for the column decoder shown in FIG. 22A;

FIG. 23A is a block diagram of a column decoder composed of four units of the column decoder shown in FIGS. 22A and 22B;

FIG. 23B shows a symbol for the column decoder shown in FIG. 23A;

FIG. 24A is a circuit diagram of a column decoder;

FIG. 24B shows a symbol for the column decoder shown in FIG. 24A;

FIG. 25A is a circuit diagram of a column gate that selectively connects the main bit line to a read-only data line;

FIG. 25B shows a symbol for the column gate shown in FIG. 25A;

FIG. 26A is a block diagram of a column gate including 64 units of the column gate shown in FIGS. 25A and 25B;

FIG. 26B is a circuit diagram to help explain the connection between the column redundancy main bit line for each bit and the column redundancy data line;

FIG. 26C shows a symbol for the column gate including 64 units of the column gate shown in FIGS. 25A and 25B;

FIG. 33A is a circuit diagram of a decoder for auto column gate signals;

FIG. 33B shows a symbol for the decoder shown in FIG. 33A;

FIG. 34A is a circuit diagram of a decoder for auto column gate signals;

FIG. 34B shows a symbol for the decoder shown in FIG. 34A;

FIG. 35A is a block diagram of a decoder for auto column gate signals;

FIG. 35B shows a symbol for the decoder shown in FIG. 35A;

FIG. 39A is a block diagram of a decoder that outputs column gate signals for a bank including a boot block;

FIG. 39B shows a symbol for the decoder shown in FIG. 39A;

FIG. 41A is a block diagram showing the connection between a column gate signal output for a bank including a boot and a decoder column gate;

FIG. 41B shows a symbol for the circuit shown in FIG. 41A;

FIGS. 42A and 42B are circuit diagrams of a global decoder for column gate select signals;

FIGS. 43A and 43B are circuit diagrams of a global decoder for column gate select signals;

FIG. 44 shows a symbol for the global decoder for column gate select signals;

FIG. 47A is a block diagram showing a 512-Kbit block arrangement;

FIG. 47B shows a symbol for the block configuration shown in FIG. 47A;

FIG. 48A is a block diagram of a 4-Mbit core 4MbCORE composed of eight units of the 512-Kbit block shown in FIGS. 47A and 47B;

FIG. 48B shows a symbol for the core 4MbCORE shown in FIG. 48A;

FIG. 55A is a circuit diagram showing an example of the configuration of a power switch;

FIG. 55B shows a symbol for the power switch shown in FIG. 55A;

FIG. 56A is a circuit diagram showing an example of the configuration of a power switch;

FIG. 56B shows a symbol for the power switch shown in FIG. 56A;

FIG. 60A is a block diagram showing an example of the configuration of a power switch and a decoder provided for each 4-Mbit core;

FIG. 60B shows a symbol for the power switch and decoder shown in FIG. 60A;

FIG. 62A is a block diagram of a power switch and decoder for a boot core;

FIG. 62B shows a symbol for the power switch and decoder shown in FIG. 62A;

FIG. 65 shows a symbol for the decoder of bank BANK 0 shown in FIG. 64;

FIG. 66A is a block diagram of the power switch and decoder of bank BANK 1;

FIG. 66B shows a symbol for the power switch and decoder shown in FIG. 66A;

FIG. 67 is a block diagram showing the configuration of the decoder of bank BANK 1;

FIG. 68 shows a symbol for the decoder of bank BANK 1 shown in FIG. 67;

FIG. 69A is a block diagram of a global decoder, showing the block redundancy column decoder section;

FIG. 69B is a block diagram of a decoder, showing the block redundancy column decoder section;

FIG. 69C shows a symbol for the block redundancy decoder, representing the block redundancy column decoder section;

FIG. 70A is a block diagram showing the connection relationship between the redundancy block power switch and decoder and the block;

FIG. 70B shows a symbol for the circuit shown in FIG. 70A;

FIG. 71 is a block diagram showing the configuration of a redundancy block decoder;

FIG. 72 shows a symbol for the redundancy block decoder shown in FIG. 71;

FIGS. 73A to 73D are block diagrams showing the configuration of a 16-Mbit flash memory with a 2-bank structure of 4-Mbit+12-Mbit including two redundancy blocks;

FIG. 74 shows a symbol for the 16-Mbit flash memory core shown in each of FIGS. 73A to 73D;

Figure 1:
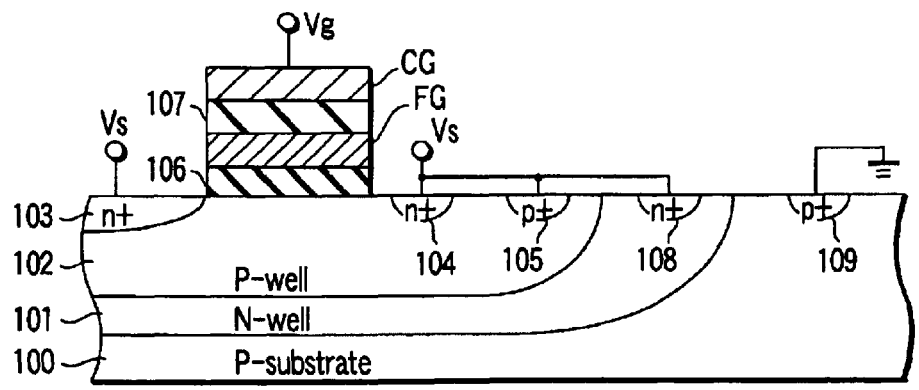
FIG. 1 is a sectional view of a memory cell in a flash memory to help explain a conventional nonvolatile semiconductor memory.
Figure 2:
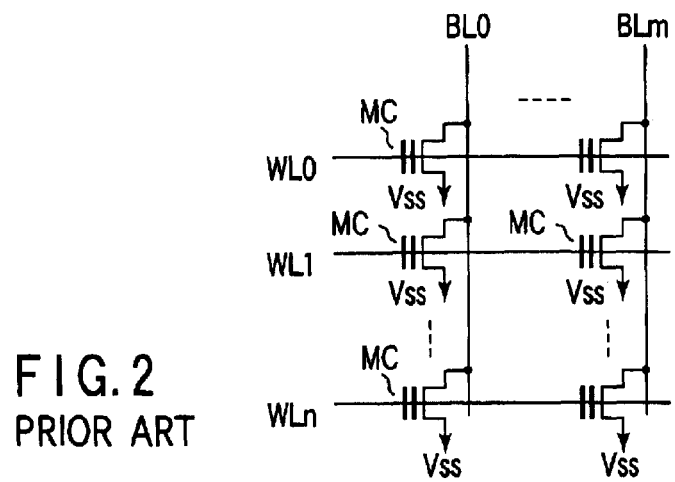
FIG. 2 is a circuit diagram of a part of a memory cell array where units of the memory cell transistor of FIG. 1 are arranged in a matrix, which helps explain a conventional nonvolatile semiconductor memory.
Figure 3:
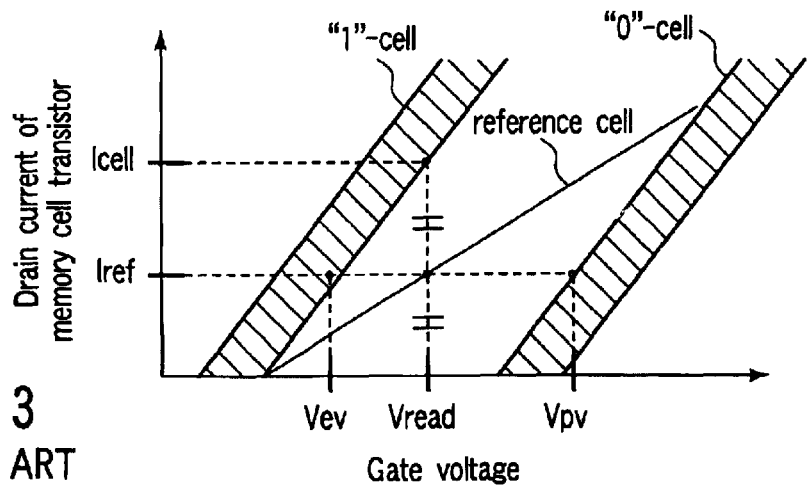
FIG. 3 shows the relationship between the control gate voltage and the drain current in the memory cell transistor of FIG. 1.
Figure 4:
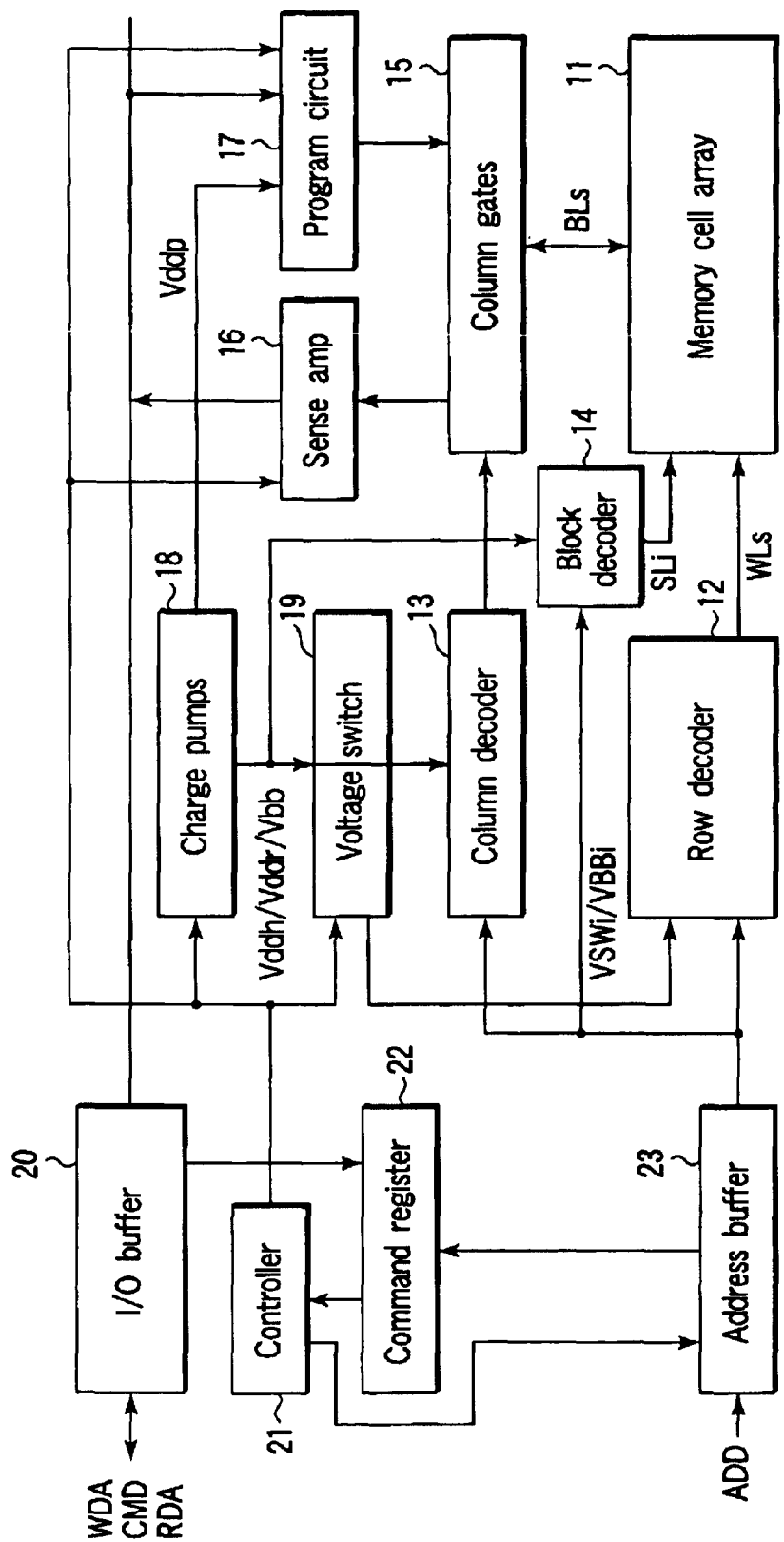
FIG. 4 is a block diagram schematically showing the configuration of a nonvolatile semiconductor memory according to an embodiment of the present invention.
Figure 75:
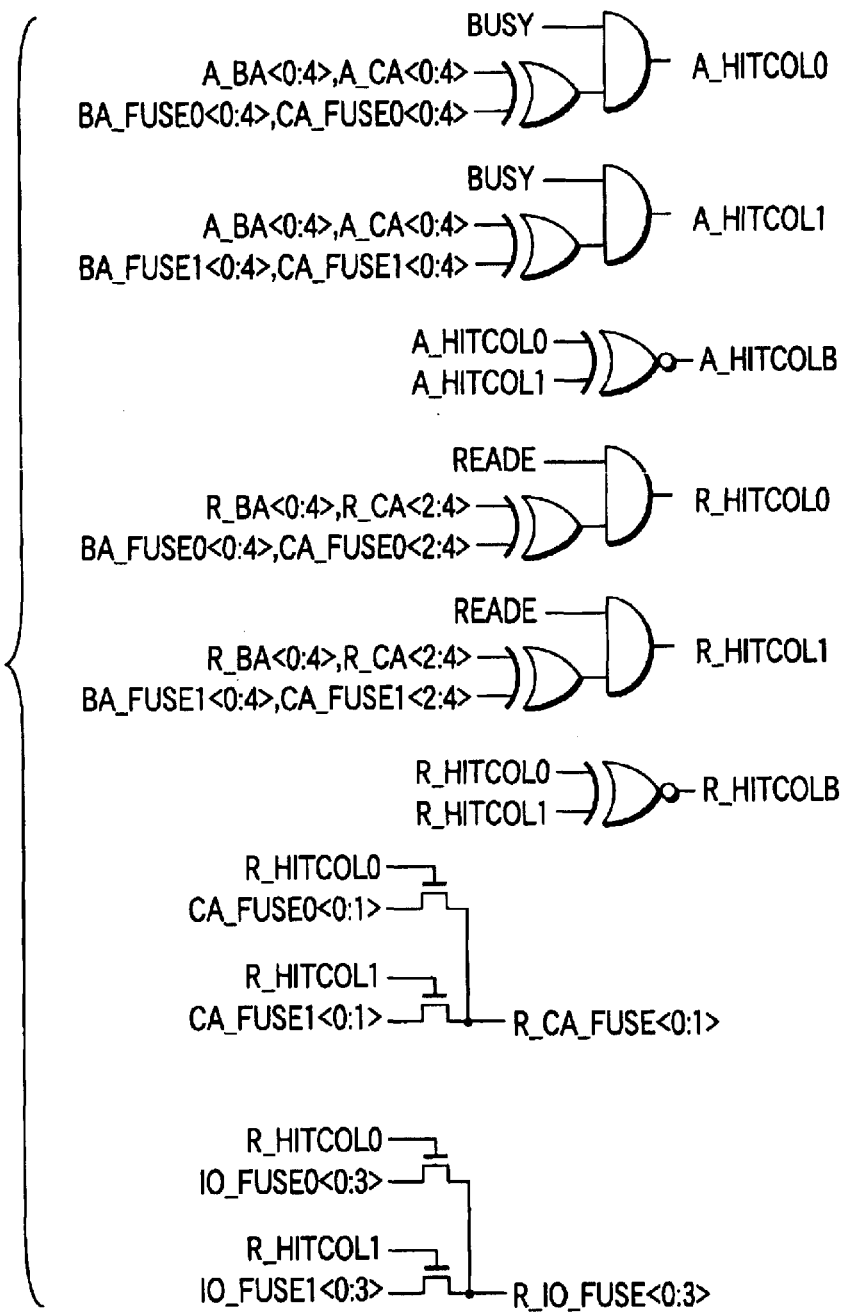
Figure 76:
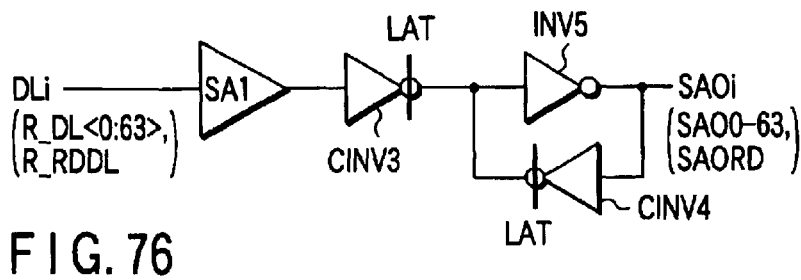
Figure 77:
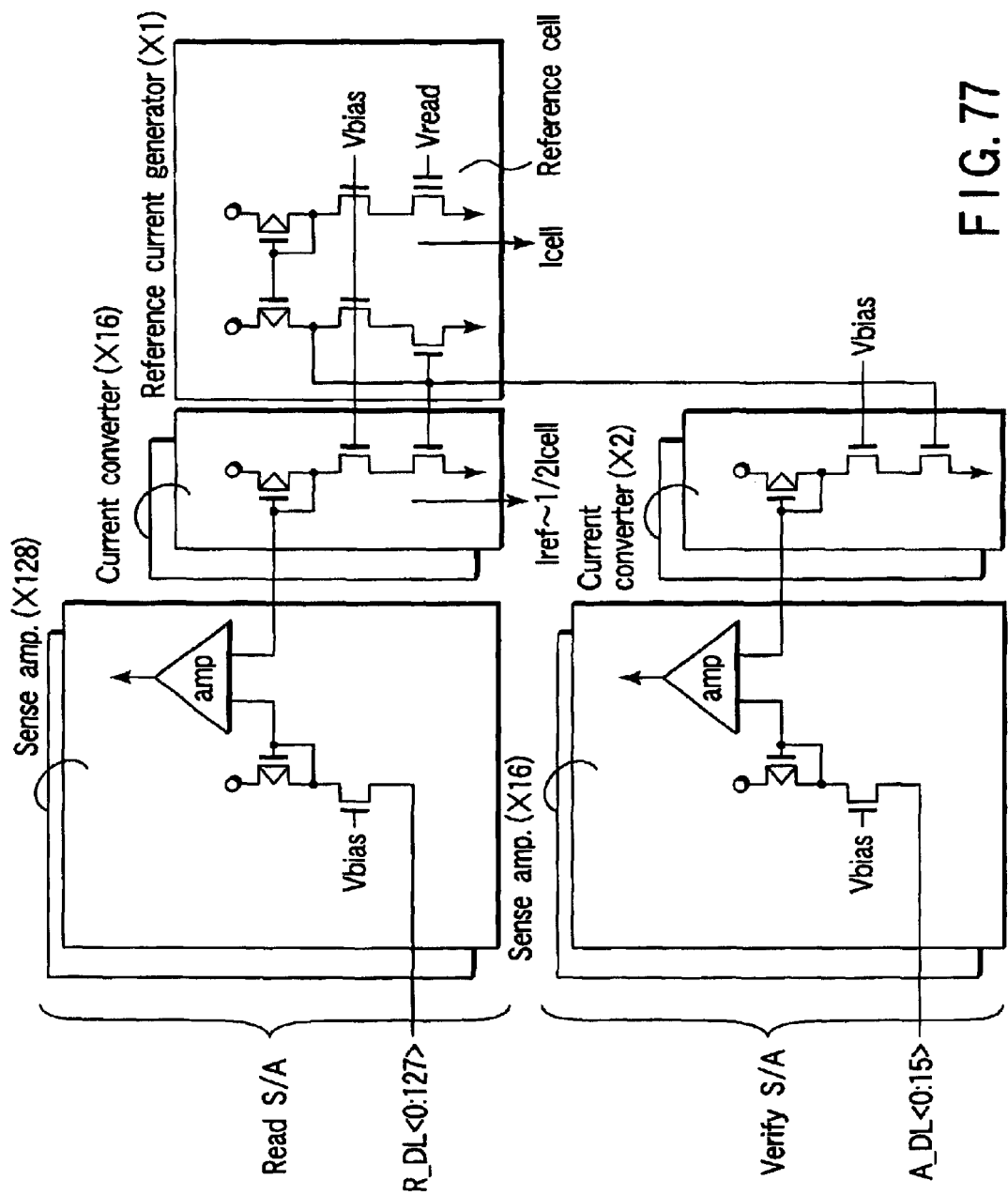
Figure 78:
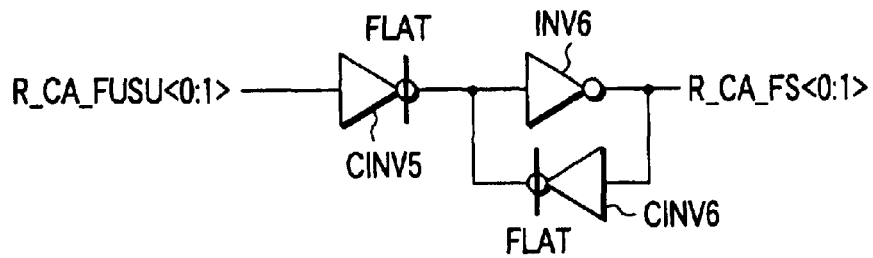
Figure 79:
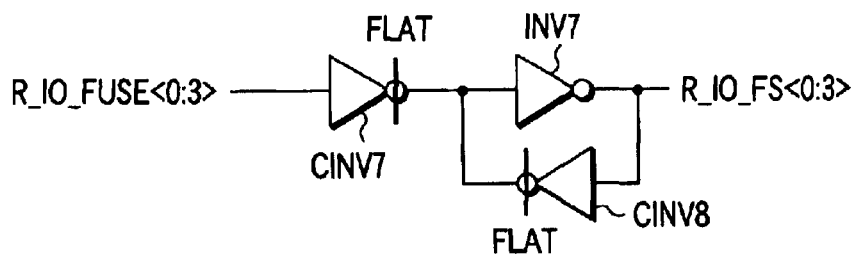
Figure 80:
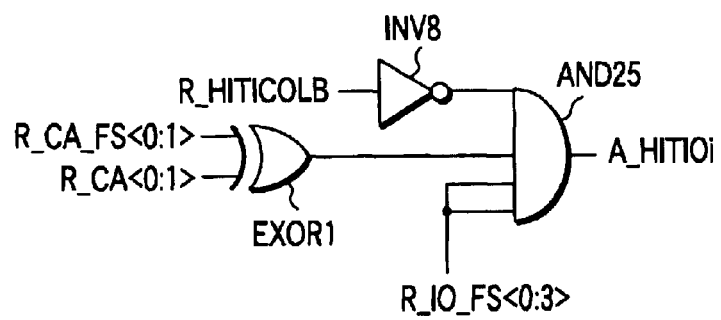
Figure 83:
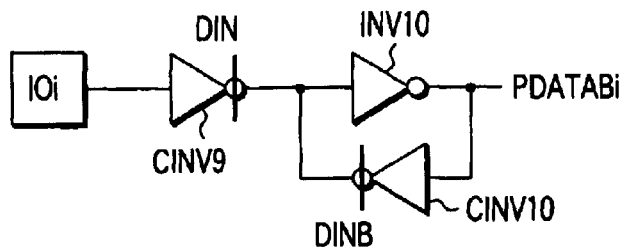
Figure 84:
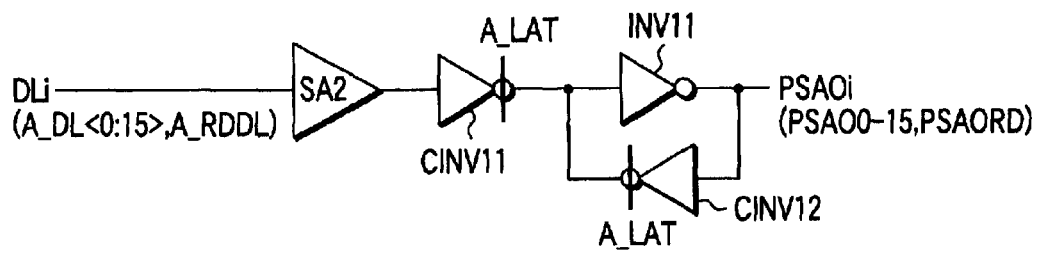
Figure 85:
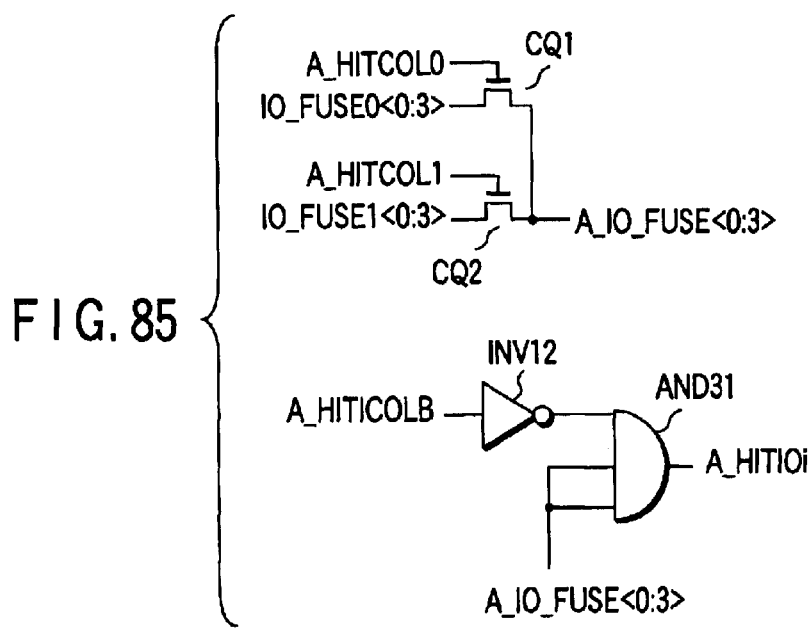
Figure 86:
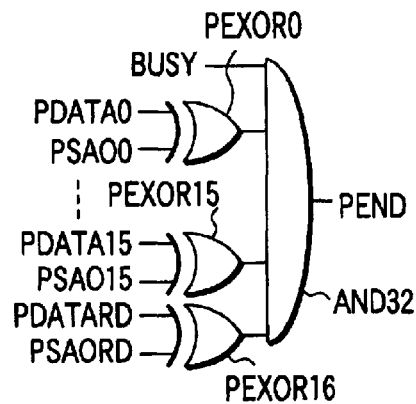
Figure 87:
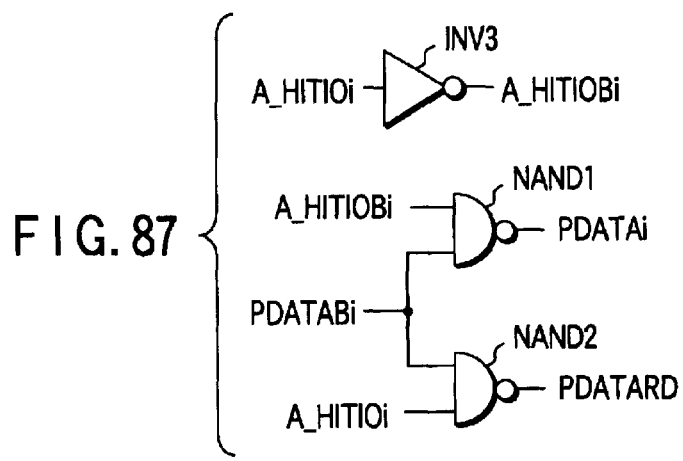
Figure 88:
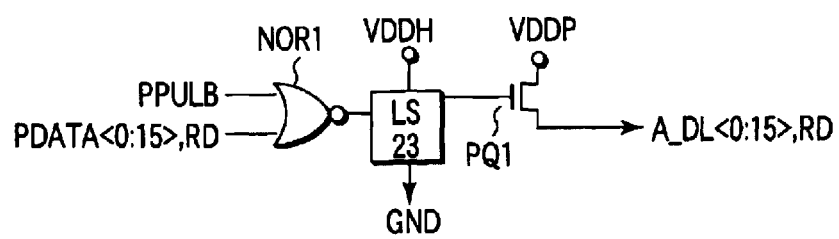
Figure 89:
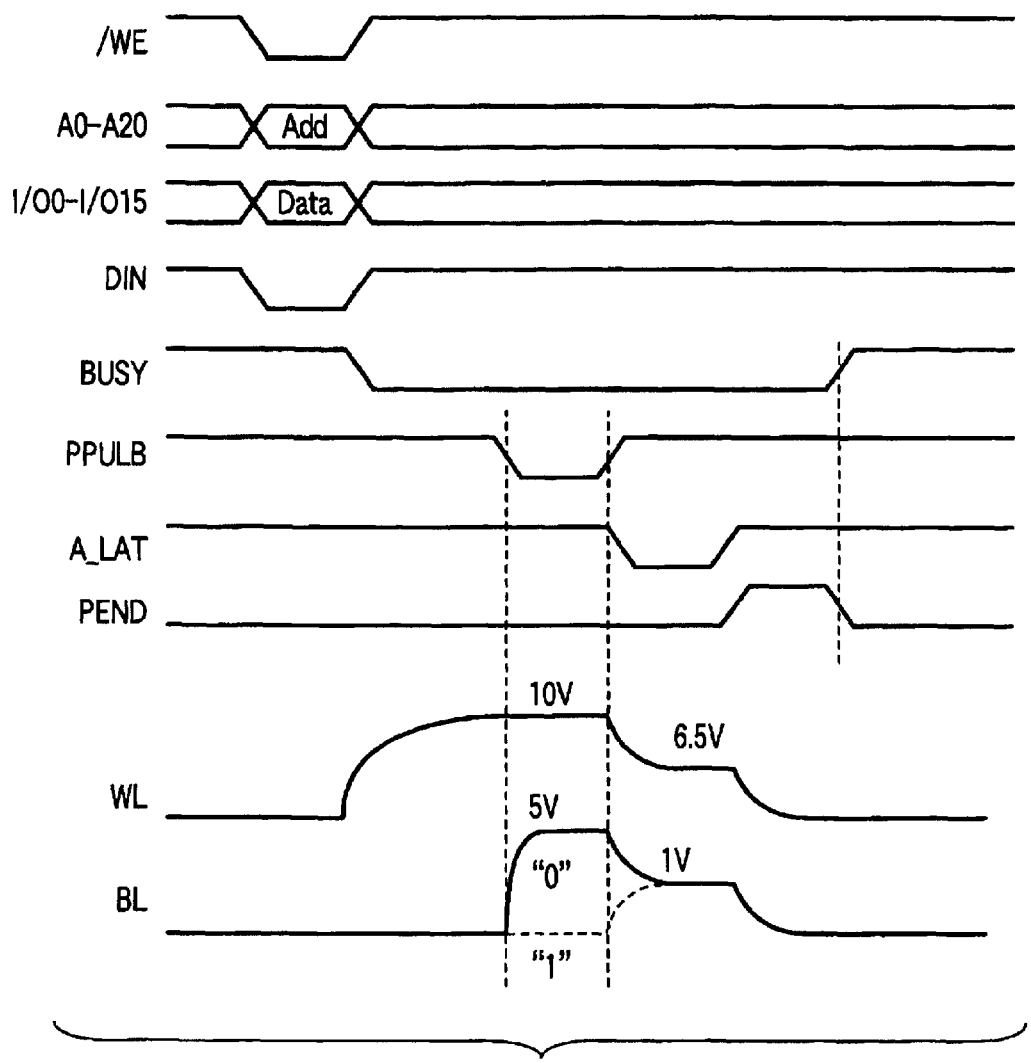
Figures 91A, 91B:
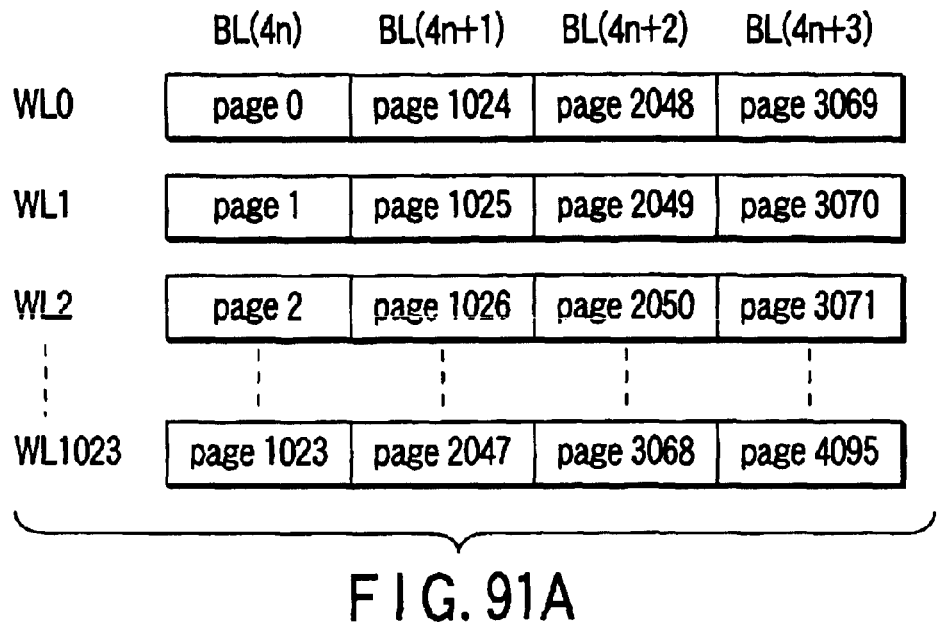
Figures 93A, 93B:
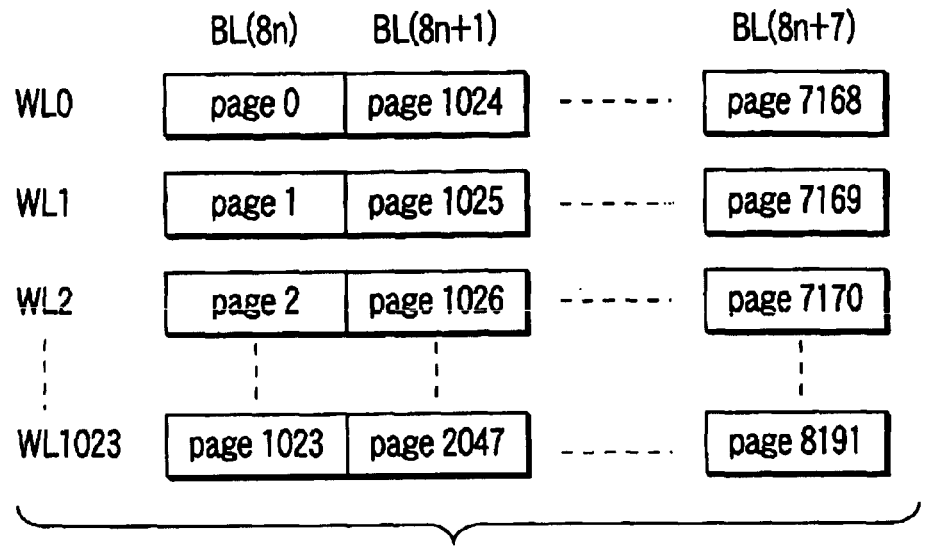
Figures 95A, 95B:
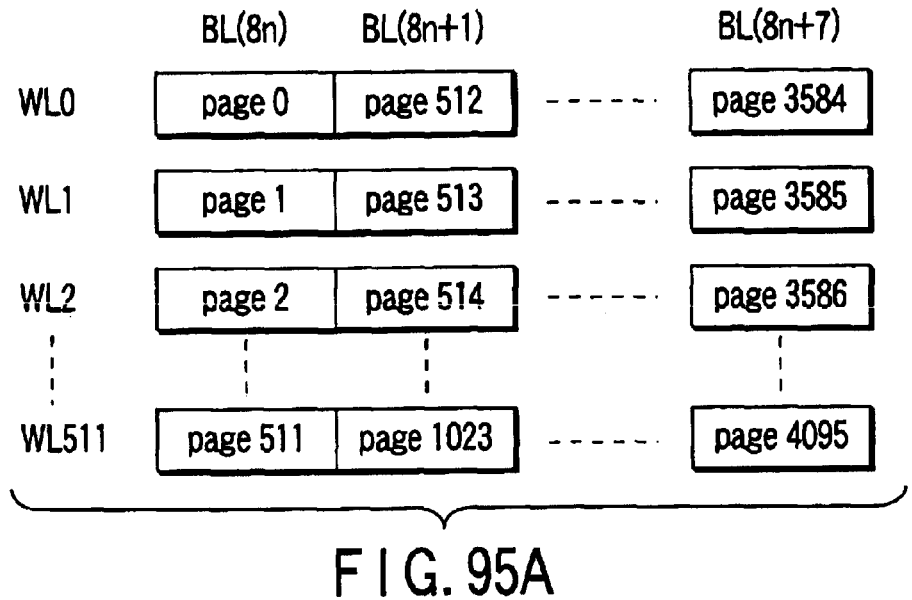
Figure 96A:
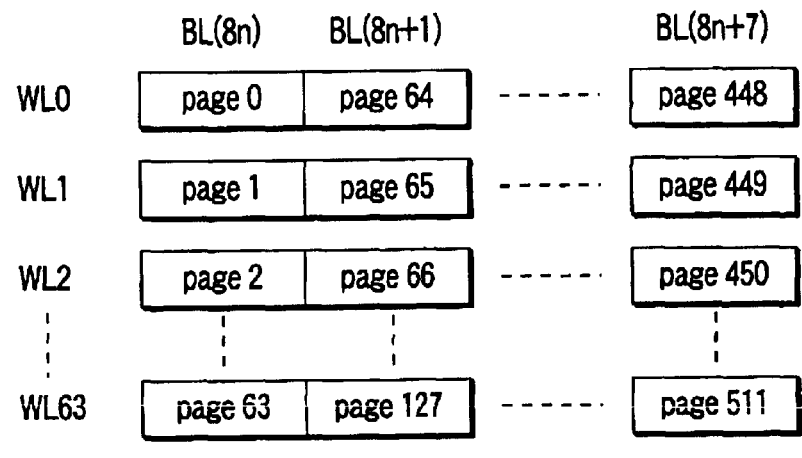
Figure 96C:
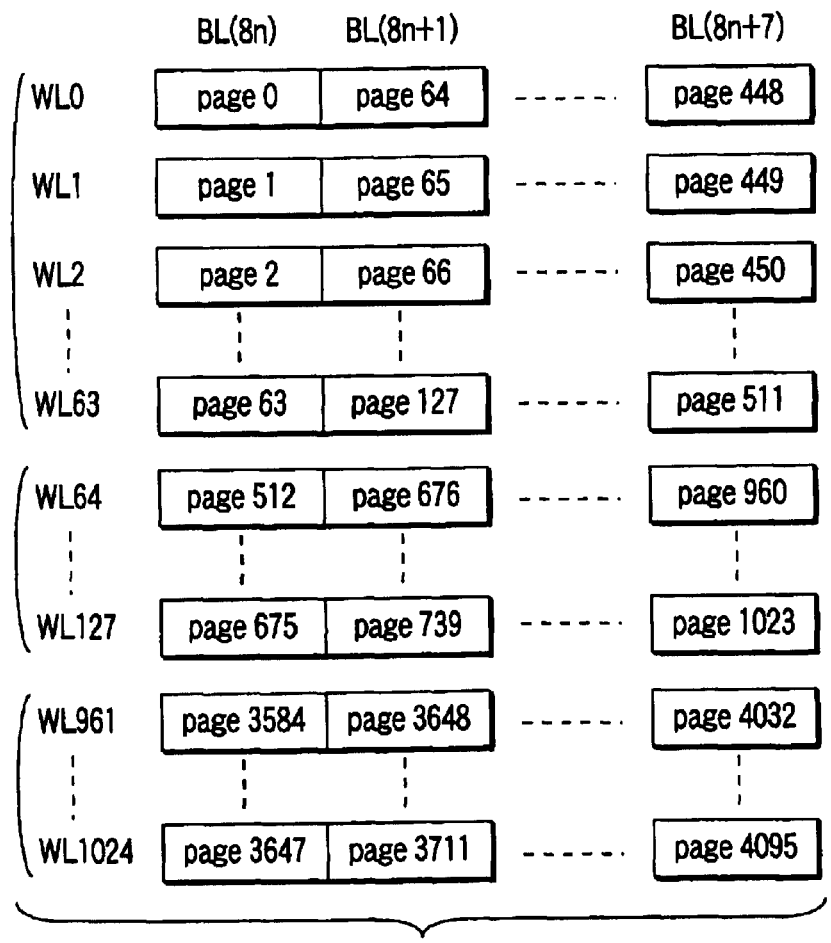
Figure 96D:
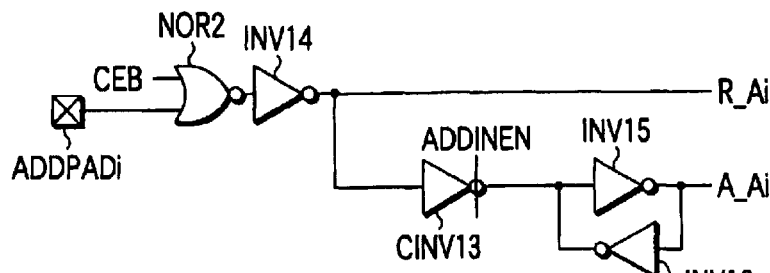
Figure 96E:
Figure 96F:
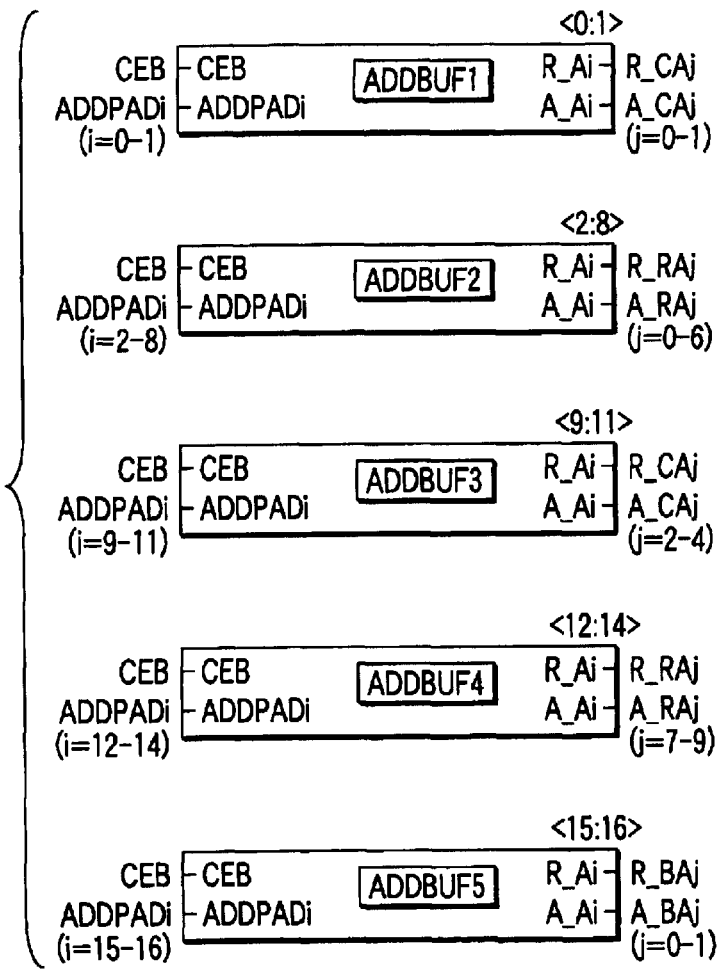
Figures 97A, 97B:
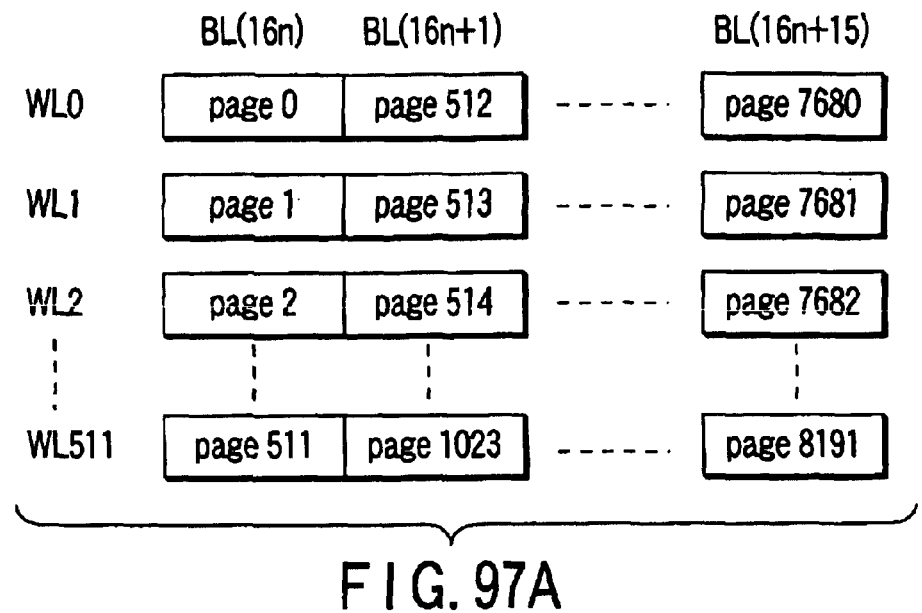
Figure 98A:
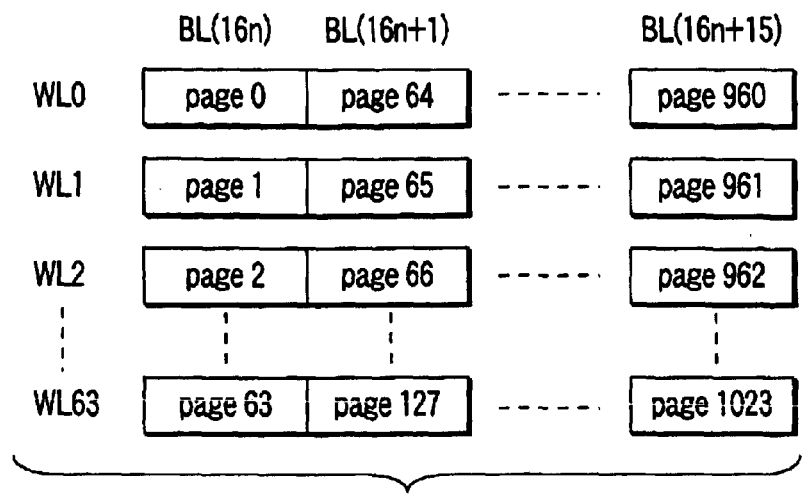
Figure 98C:
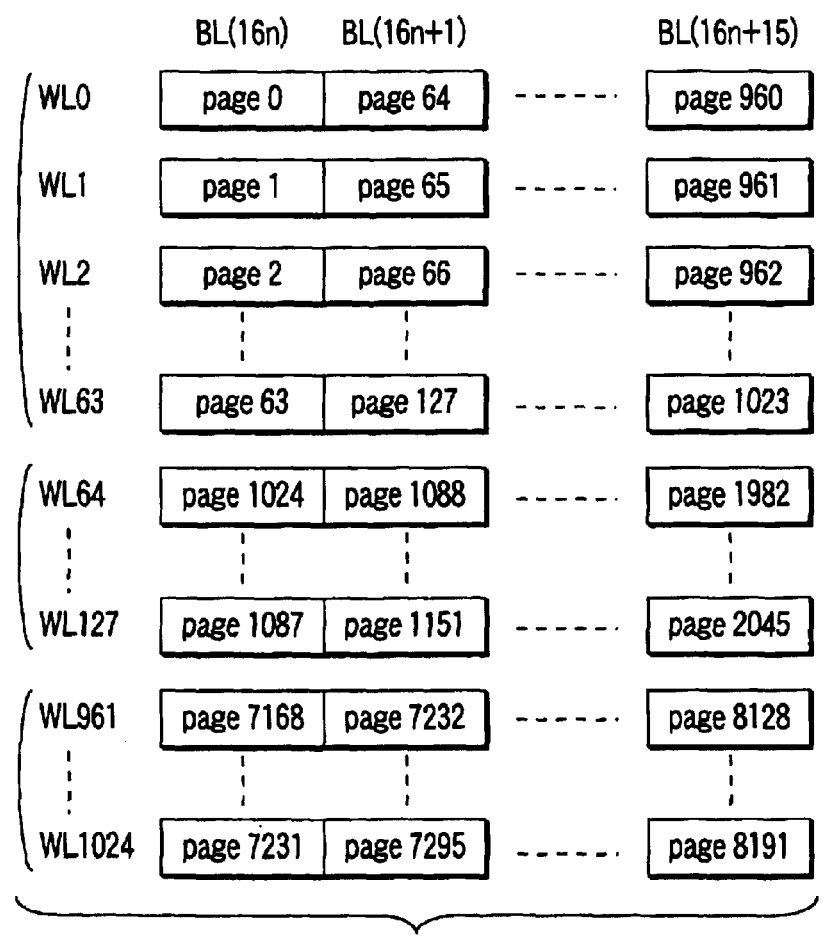

FIG. 75 is a circuit diagram showing an example of the configuration of a column redundancy circuit;

FIG. 76 is a circuit diagram of a sense amplifier and a circuit that latches the sensed data;

FIG. 77 is a circuit diagram of a read and program verify sense amplifier;

FIG. 78 is a circuit diagram of a circuit that latches column redundancy fuse data;

FIG. 79 is a circuit diagram of a circuit that latches column redundancy fuse data;

FIG. 80 is a circuit diagram of a circuit that generates a signal for causing a multiplexer to replace I/O data when outputting the word whose intra-page address coincides with the fuse data;

FIG. 81 is a circuit diagram of the multiplexer;

FIG. 82 is a circuit diagram of the multiplexer;

FIG. 83 is a circuit diagram showing an example of the configuration of a data latch circuit that latches program data;

FIG. 84 is a circuit diagram showing an example of the configuration of a sense latch circuit that verifies a program operation or an erase operation;

FIG. 85 is a circuit diagram showing an example of the configuration of a circuit that performs column redundancy in an auto operation;

FIG. 86 is a circuit diagram showing a circuit which outputs an end signal for designating the end of program when program data and a verify result completely coincide with each other;

FIG. 87 is a circuit diagram of a circuit that transfers data on the target I/O to PDATARD when column redundancy replacement is performed;

FIG. 88 is a circuit diagram showing an example of the configuration of a program load circuit connected to an auto data line;

FIG. 89 is a timing chart for an operation waveform showing a program operation;

FIG. 90 is a timing chart for an operation waveform showing a read operation;

FIGS. 91A and 91B are diagrams showing an example of first address allocation in a nonvolatile semiconductor memory according to an embodiment of the present invention;

FIGS. 92A to 92C are diagrams showing an example of second address allocation in a nonvolatile semiconductor memory according to an embodiment of the present invention;

FIGS. 93A and 93B are diagrams showing an example of third address allocation in a nonvolatile semiconductor memory according to an embodiment of the present invention;

FIGS. 94A to 94C are diagrams showing an example of fourth address allocation in a nonvolatile semiconductor memory according to an embodiment of the present invention;

FIGS. 95A and 95B are diagrams showing an example of fifth address allocation in a nonvolatile semiconductor memory according to an embodiment of the present invention;

FIGS. 96A to 96C are diagrams showing an example of sixth address allocation in a nonvolatile semiconductor memory according to an embodiment of the present invention;

FIG. 96D is a circuit diagram illustrating an i-th bit buffer circuit incorporated in the address buffer;

FIG. 96E is a symbolic view of the buffer circuit shown in FIG. 96D;

FIG. 96F is a block diagram illustrating structural examples of the address buffer of FIG. 4;

FIGS. 97A and 97B are diagrams showing an example of seventh address allocation in a nonvolatile semiconductor memory according to an embodiment of the present invention; and FIGS. 98A to 98C are diagrams showing an example of eighth address allocation in a nonvolatile semiconductor memory according to an embodiment of the present invention.

DETAILED DESCRIPTION OF THE INVENTION

FIG. 4 is a block diagram schematically showing the configuration of a nonvolatile semiconductor memory according to an embodiment of the present invention. The nonvolatile semiconductor memory comprises a memory cell array 11, a row decoder 12, a column decoder 13, a block decoder 14, column gates 15, a sense amplifier 16, a program circuit 17, charge pumps 18, a voltage switch 19, an I/O buffer 20, a controller 21, a command register 22, and an address buffer 23.

An address signal ADD inputted to the address buffer 23 is supplied to the row decoder 12, the column decoder 13, and block decoder 14. In addition, part of the address signal ADD is supplied to the command register 22. Write data WDA supplied to the I/O buffer 20 is supplied to the program circuit 17. Command CMD is supplied to the command register 22. The output of the command register 22 is supplied to the controller 21, which decodes the output. The controller 21 controls the sense amplifier 16, program circuit 17, charge pump 18, voltage switch 19 and address buffer 23. The output voltages Vddh, Vddr, Vbb of the charge pumps 18 are supplied to the voltage switch 19, column decoder 13, and block decoder 14, respectively. The output voltage Vddp is supplied to the program circuit 17. The output voltages VSWi and VBBi of the voltage switch 19 are supplied to the row decoder 12.

The write data WDA supplied to the program circuit 17 passes through the column gates 15 selected by the column decoder 13 and is supplied to bit lines BLs of the memory cell array 11. Then, the write data WDA is written into the memory cells connected to the intersections of the bit line BLs and word line WLs selected by the row decoder 12. At this time, the block to be written into is specified by the block decoder 14.

On the other hand, the data read from the memory cells selected by the row decoder 14, column decoder 13, and block decoder 14 passes through the column gates 15 and is supplied to the sense amplifier 16, which senses and amplifies the data. The resulting data is read via the I/O buffer 20.

FIG. 5 shows a more detailed configuration of the nonvolatile semiconductor memory shown in FIG. 4, giving a layout image of a 16-Mbit flash memory with a 2-bank structure including two redundancy blocks. Eight blocks are arranged in the X direction, starting from the power switch and decoder VolDec. The signals Mi/MiB, Fi, Hi outputted from the power switch and decoder VolDec are wired at a second-level metal layer (metal2) passing over cell array CellArray. On the other hand, a local bit line is wired at a first-level metal layer and a global bit line is wired at a third-level metal layer (metal3). The global bit line commonly connects to three blocks for bank 0 in the Y direction from a second-stage column decoder ColDec8. It further commonly connects to a block and a boot block for bank 1. The main bit line connected to the selected column decoder ColDec8 is connected to a common data line. The local bit line of a redundancy block is connected to a data line in replacement.

Next, the configuration of each block in the layout image of FIG. 5 will be explained.

FIG. 6A is a circuit diagram of column gate 1stCOL1 for selectively connecting local bit lines LBL0 to LBL3 in a block made of the first-level metal layer to the main bit line MBL made of the third-level metal layer. FIG. 6B shows a symbol for column gate 1stCOL1 shown in FIG. 6A. As shown in FIG. 6A, column gate 1stCOL1 is composed of transistors BQ0 to BQ3 to whose gates decode signals BLKH0 to BLKH3 from column decoder ColDec1 are supplied. One end of the current path of transistors BQ0 to BQ3 is connected to local bit lines LBL0 to LBL3. The other end of the current path of transistors BQ0 to BQ3 is connected to main bit line MBL.

FIG. 7A is a block diagram of column gate 1stCOL2 including eight units of the column gate 1stCOL1 shown in FIGS. 6A and 6B. FIG. 7B shows a symbol for the column gate 1stCOL2. The column gate 1stCOL2 is provided so as to correspond to each I/O.

Figure 8B:
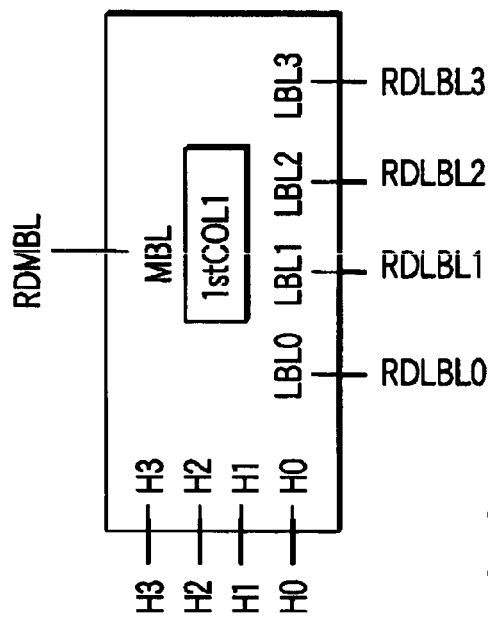
FIG. 8B is a block diagram of a column redundancy column gate.
Figure 8A:
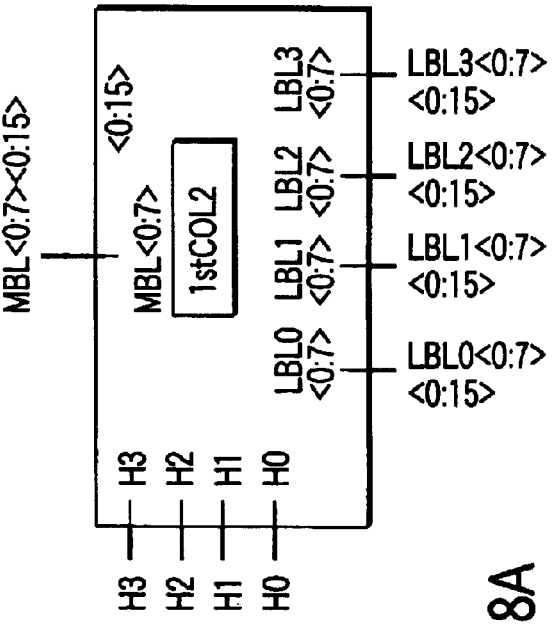
FIG. 8A is a block diagram of a column gate.
Figure 8C:
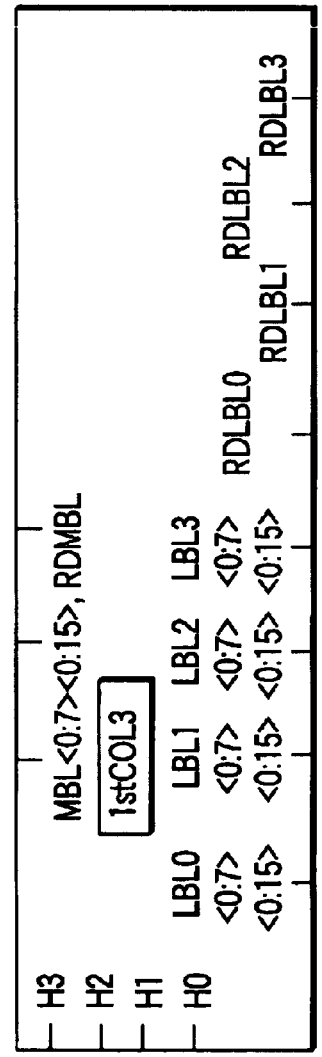
FIG. 8C shows a symbol for a column gate including 16 units of the column gate shown in FIG. 8A and one unit of the column redundancy column gate shown in FIG. 8B.

FIGS. 8A to 8C each show a column gate. Specifically, column gate 1stCOL3 (FIG. 8C) includes as many column gates 1stCOL2 as is equivalent to the word width, that is, 16 units of column gate 1stCOL2 (FIG. 8A), and a single column redundancy column gate 1stCOL1 (FIG. 8B). The column redundancy column gate 1stCOL1, which has four local bit lines (RDLBL0 to RDLBL3) and a single main bit line (RDMBL), is capable of controlling the column select signal by using the same signals H0 to H3 as those in the main body. Column gate 1stCOL3 shown in FIG. 8C decodes 512 local bit lines and four column redundancy bit lines in the main body into 128 main bit lines and one column redundancy bit line.

Figures 9A, 9B:
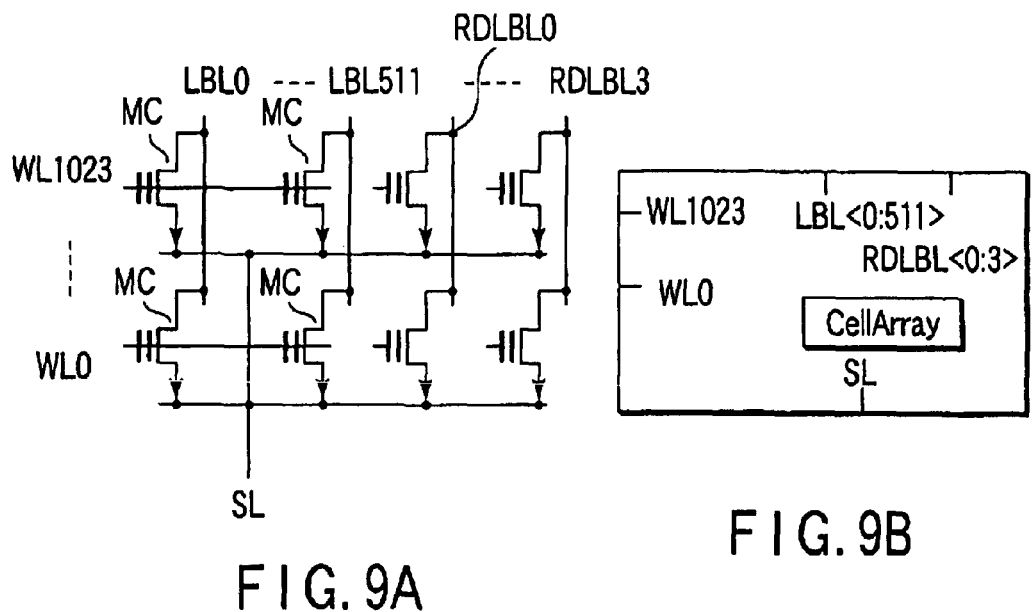
FIG. 9A is a circuit diagram of a 512-Kbit memory cell array.
FIG. 9B shows a symbol for the memory cell array shown in FIG. 9A.

FIG. 9A is a circuit diagram of a 512-Kbit memory cell array CellArray. FIG. 9B shows a symbol for the 512-Kbit memory cell array CellArray. As shown in FIG. 9A, memory cell transistors MC are arranged in a $516 \times 10^{24}$ matrix including redundancy transistors. The control gates of the individual memory cell transistors MC are connected to word lines WL0 to WL1023 on a row basis. The drains of the memory cell transistors MC are connected to local bit lines LBL0 to LBL511 and redundancy local bit lines RDLBL0 to RDLBL3 on a column basis. The sources of the memory cell transistors MC are commonly connected to a source line SL.

Figures 10A, 10B:
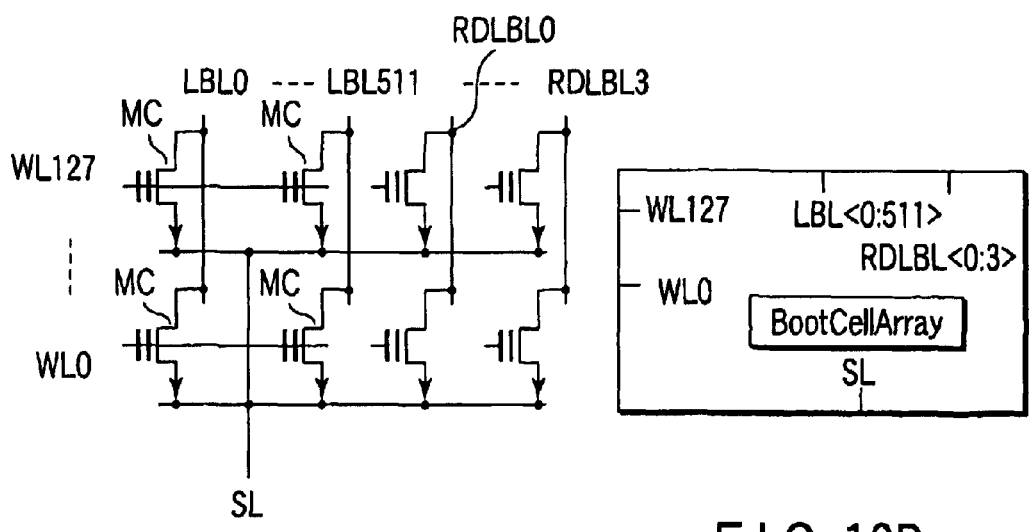
FIG. 10A is a circuit diagram of a 64-Kbit boot block cell array.
FIG. 10B shows a symbol for the boot block cell array shown in FIG. 10A.

FIG. 10A is a circuit diagram of a 64-Kbit boot block cell array BootCellArray. FIG. 10B shows a symbol for the 64-Kbit boot block cell array BootCellArray. As shown in FIG. 10A, 128 word lines are provided and the columns have the same arrangement as that of the main body. Specifically, memory cell transistors MC are arranged in a 516×128 matrix including redundancy transistors. The control gates of the individual memory cell transistors MC are connected to word lines WL0 to WL127 on a row basis. The drains of the memory cell transistors MC are connected to local bit lines LBL0 to LBL511 and redundancy local bit lines RDLBL0 to RDLBL3 on a column basis. The sources of the memory cell transistors MC are commonly connected to a source line SL.

FIG. 11A is a circuit diagram of row decoder RowDec0 connected to each word line. FIG. 11B shows a symbol for row decoder RowDec0. As shown in FIG. 11A, row decoder RowDec0 is composed of a transfer gate made up of an n-channel transistor n1 and a p-channel transistor p1 and an n-channel transistor n2. The transfer gate, which is controlled by a pre-decode signal pair Mi/MiB, determines whether to supply signal BLKFj to word line WLi,j. The pre-decode signal MiB is supplied to the gate of transistor n2, thereby performing on/off control of transistor n2. When word line WLi,j is not selected, transistor n2 is designed to produce an unselected word line potential VBBi.

FIGS. 12A and 12B each shows a row decoder controlled by pre-decode signal pair Mi/MiB. Row decoder RowDec1 shown in FIG. 12B is composed of eight units of row decoder RowDec0 shown in FIG. 12A, with adjacent eight word lines being controlled by the same pre-decode signal pair Mi/MiB.

FIG. 13 shows a row decoder RowDec2 including 128 units of row decoder RowDec1 shown in FIGS. 12A and 12B. The 1024 word lines in the 512-Kbit memory cell array CellArray are decoded by a combination of 8 signals BLKFi and 128 pre-decode signal pairs Mi/MiB.

FIG. 14A is a circuit diagram of pre-decoder RowDec3 that outputs pre-decode signal pair Mi/MiB. FIG. 14B shows a symbol for pre-decoder RowDec3. As shown in FIG. 14A, the pre-decoder RowDec3 includes an AND gate AND1 to which erase signal ERASEB and row address RA<3:9> are supplied and a level shifter LS1 that operates on voltages VSWi and VBBi. Level shifter LS1 is designed to output pre-decode signal pair Mi/MiB.

FIG. 15A is a circuit diagram of pre-decoder RowDec4 that includes 128 pairs of pre-decoder RowDec3 shown in FIGS. 14A and 14B. FIG. 15B shows a symbol for pre-decoder RowDec4. The 128 pre-decode signal pairs Mi/MiB are decode signals for seven row addresses RA<3:9>. In an erase operation, erase signal ERASEB goes low, which brings all of the 128 pre-decode signal pairs Mi/MiB into the unselected state.

FIG. 16A is a circuit diagram of row decoder RowDec5 that drives the selected word line. FIG. 16B shows a symbol for row decoder RowDec5. As shown in FIG. 16A, row decoder RowDec5 includes an AND gate AND2 to which erase signal ERASEB and row address RA<0:2>are supplied and a level shifter LS2 that operates on voltages VSWi and VBBi. Row decoder RowDec5 decodes row address RA<0:2> and causes level shifter LS to output signal Fi.

FIG. 17A is a circuit diagram of row decoder RowDec6 composed of eight units of row decoder RowDec5 shown in FIGS. 16A and 16B. FIG. 17B shows a symbol for row decoder RowDec6.

FIG. 18A is a circuit diagram of block decoder BlockDec. FIG. 18B shows a symbol for block decoder BlockDec. As shown in FIG. 18A, block decoder BlockDec includes AND gates AND3, AND4, level shifters LS3 to LS6, and an inverter INV1. Block address BA<0:2> is supplied to AND gate AND3. The output signal of AND gate AND3 is supplied to one input terminal of each of level shifter LS3, level shifter LS4, and AND gate AND4. Erase signal ERASE (a signal whose phase is opposite to that of erase signal ERASEB) is supplied to the other input terminal of AND gate AND4. The output signal of AND gate AND 4 is supplied to level shifter LS5 and level shifter LS6.

Level shifter LS3, which operates on voltages VSWi and VBBi, outputs signal BSH. Level shifter LS4, which operates on voltages VSWCi and GND, outputs signal BSHH. Level shifter LS5, which operates on voltages VSWCi and GND, drives cell source line SLi of block i. Level shifter LS6 operates on voltages VSWi and VBBi. The output of level shifter LS6 passes through inverter INV1 operating on voltages GND, VBBi and is supplied as signal VBBBi.

That is, block decoder BlockDec decodes block address BA<0:2> into different-level signals BSH and BSHH. Furthermore, when the erasure of block i is selected, bock decoder BlockDec applies voltage VSWCi to the cell source line SLi of block i. Signal VBBBi, which is for applying an unselected word line potential, goes to VBBi level when erasure is selected.

Figure 19A:
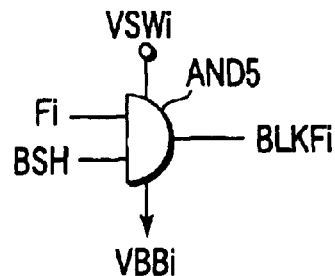
FIG. 19A is a circuit diagram of a row decoder (signal BLKFi generating circuit)
Figure 19B:
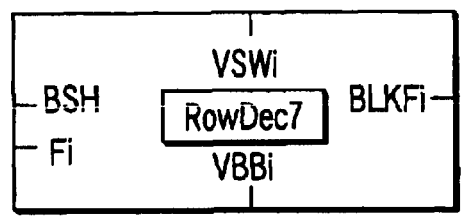
FIG. 19B shows a symbol for the row decoder shown in FIG. 19A.

FIG. 19A is a circuit diagram of row decoder RowDec7 (a signal BLKFi generating circuit). FIG. 19B shows a symbol for Row decoder RowDec7. Row decoder RowDec7, which is composed of an AND gate AND5 operating on voltages VSWi and VBBi, generates signal BLKFi from the logical product of signal Fi and signal BSH.

Figure 20A:
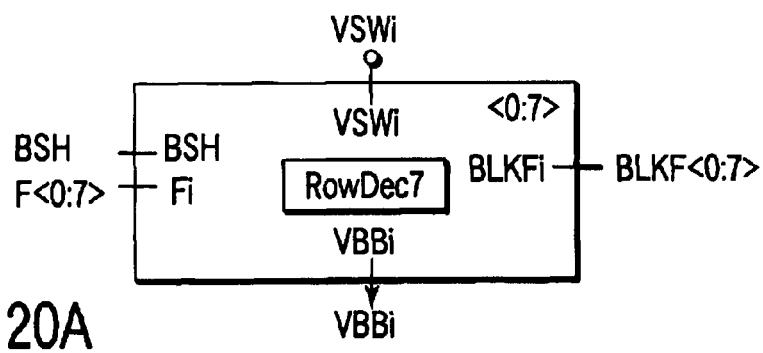
FIG. 20A is a block diagram of a row decoder composed of eight units of the row decoder shown in FIGS. 19A and 19B.
Figure 20B:
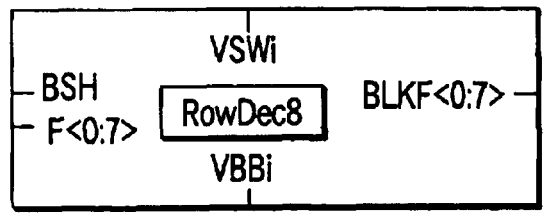
FIG. 20B shows a symbol for the row decoder shown in FIG. 20A.

FIG. 20A is a block diagram of row decoder RowDec8 composed of eight units of row decoder RowDec7 shown in FIGS. 19A and 19B. FIG. 20B shows a symbol for Row decoder RowDec8.

Figures 21A, 21B:
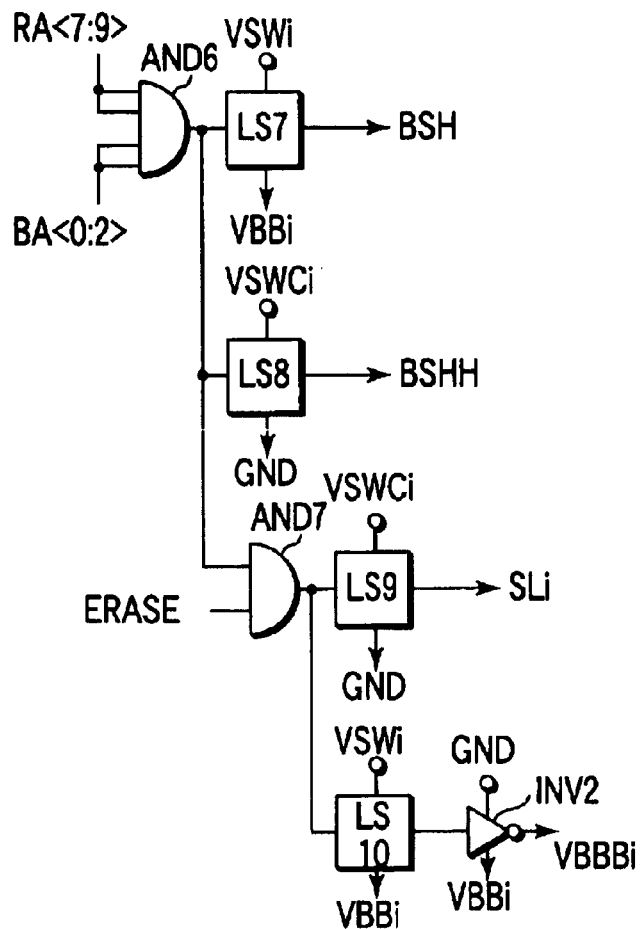
FIG. 21A is a circuit diagram of a block decoder for boot blocks.
FIG. 21B shows a symbol for the block decoder shown in FIG. 21A.

FIG. 21A is a circuit diagram of block decoder BootBlockDec for boot blocks. FIG. 21B shows a symbol for block decoder BootBlockDec. As shown in FIG. 21A, block decoder BootBlockDec includes AND gates AND6, AND7, level shifters LS7 to LS10, and an inverter INV2. Row address RA<7:9> and block address BA<0:2> are supplied to AND gate AND6. The output signal of AND gate AND6 is supplied to one input terminal of each of level shifter LS7, level shifter LS8, and AND gate AND7. Erase signal ERASE is supplied to the other input terminal of AND gate AND7. The output signal of AND gate AND7 is supplied to level shifter LS9 and level shifter LS10.

Level shifter LS7, which operates on voltages VSWi and VBBi, outputs signal BSH. Level shifter LS8, which operates on voltages VSWCi and GND, outputs signal BSHH. Level shifter LS9, which operates on voltages VSWCi and GND, drives cell source line SL. Level shifter LS10 operates on voltages VSWi and VBBi. The output of level shifter LS10 passes through inverter INV2 operating on voltages GND, VBBi and is supplied as signal VBBBi.

With the above configuration, when all of the row addresses RA<7:9> go high, a boot block is selected. Eight boot blocks BootBLK are selected by row addresses RA<7:9>.

FIG. 22A is a circuit diagram of column decoder ColDec1 (signal BLKHi generating circuit). FIG. 22B shows a symbol for column decoder ColDec1. Column decoder ColDec1, which is composed of an AND gate AND8 operating on voltages VSWCi and GND, generates signal BLKHi from the logical product of signal BSHH and signal Hi.

FIG. 23A is a circuit diagram of column decoder ColDec2. FIG. 23B shows a symbol for column decoder ColDec2. Column decoder ColDec2 is composed of four units of column decoder ColDec1. Signal H<0:3> is obtained by level-converting the decode signal of column address CA<3:4>.

FIG. 24A is a circuit diagram of column decoder ColDec3. FIG. 24B shows a symbol for column decoder ColDec3. Column decoder ColDec3 is composed of an AND gate AND9 to which column address CA<3:4> is supplied and a level shifter LS11 to which the output signal of AND gate AND9 is supplied and which operates on voltages VSWCi and GND. Column decoder ColDec3 generates signal H<0:3>.

Main bit lines MBL0, MBL1 are selectively connected to read-only data line R_DL by column gate 2ndCOL1 as shown in FIGS. 25A and 25B. FIG. 25A is a circuit diagram of column gate 2ndCOL1. FIG. 25B shows a symbol for column gate 2ndCOL1. As shown in FIG. 25A, column gate 2ndCOL1 includes transistor RQ0 and transistor RQ1. One end of the current path of transistor RQ0 is connected to main bit line MBL0. The other end of the current path of transistor RQ0 is connected to read-only data line R_DL. Read column gate select signal R_BLKD0 is supplied to the gate of transistor RQ0. One end of the current path of transistor RQ1 is connected to main bit line MBL1. The other end of the current path of transistor RQ1 is connected to read-only data line R_DL. Read column gate select signal R_BLKD1 is supplied to the gate of transistor RQ1.

When the page length is four words, or 64 bits, decoding is effected by column gate 2ndCOL2 composed of 64 units of column gate 2ndCOL1 shown in FIGS. 25A and 25B. As shown in FIG. 26B, column redundancy main bit line RDMBL for each bit is connected to column redundancy data line R_RDDL via the current path of transistor RQ3 to whose gate signal R_BLKDRD is supplied.

Figures 27A, 27B:
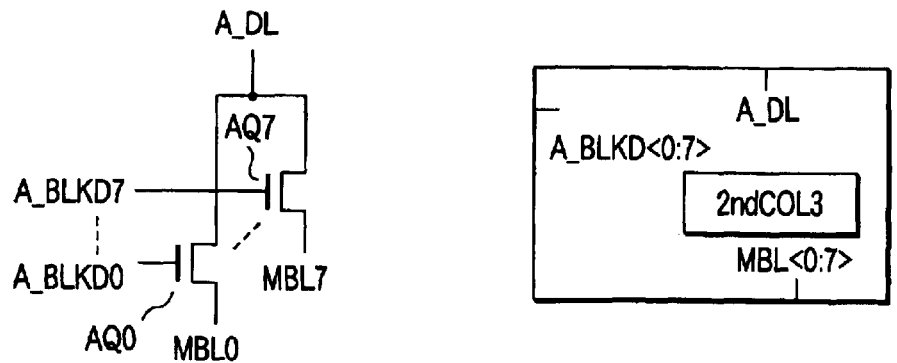
FIG. 27A is a circuit diagram of a column gate that decodes the main bit line in a write or a verify operation and selectively connects the main bit line to an auto-only data line.
FIG. 27B shows a symbol for the column gate shown in FIG. 27A.

FIG. 27A is a circuit diagram of column gate 2ndCOL3 that decodes the signals on main bit lines MBL0 to MBL7 in a program operation or a verify operation and selectively connects the decoded signal to auto-only data line A_DL. FIG. 27B shows a symbol for column gate 2ndCOL3. As shown in FIG. 27A, column gate 2ndCOL3 includes transistors AQ0 to AQ7. One end of the current path of each of transistors AQ0 to AQ7 is connected to the corresponding one of main bit lines MBL0 to MBL7. The other end of the current path of each of transistors AQ0 to AQ7 is connected to auto-only data line A_DL. Signals A_BLKD0 to A_BLKD7 are supplied to the gates of transistors AQ0 to AQ7, respectively.

Figures 28A, 28B:
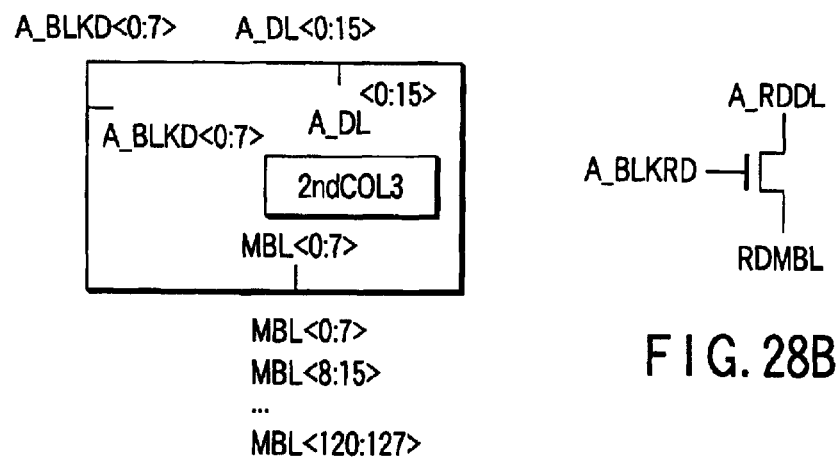
FIG. 28A is a block diagram of a column gate composed of the column gate shown in FIGS. 27A and 27B.
FIG. 28B is a circuit diagram to help explain the connection between the column redundancy main bit line for each bit and A_RDDL.
Figure 28C:
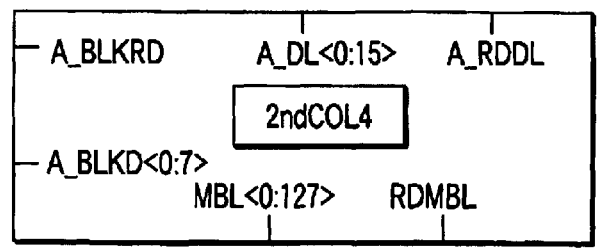
FIG. 28C shows a symbol for the column gate composed of the column gate shown in FIGS. 27A and 27B.

FIG. 28A is a block diagram of column gate 2ndCOL4 composed of column gate 2ndCOL3 shown in FIGS. 27A and 27B. FIG. 28B is a circuit diagram to help explain the connection between column redundancy bit line for each bit and A_RDDL. FIG. 28C shows a symbol for column gate 2ndCOL4.

Figure 29A:
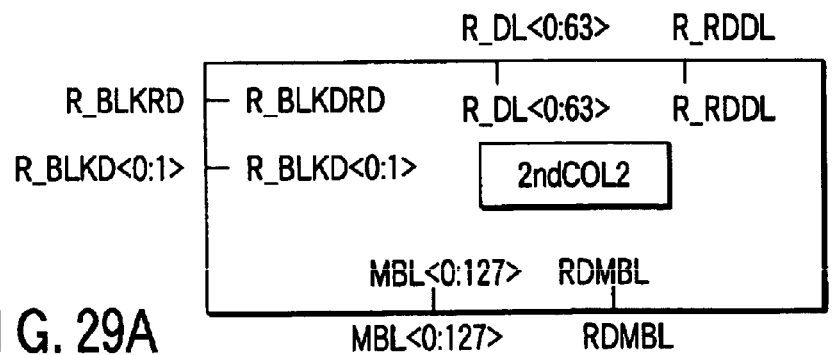
FIGS. 29A and 29B are block diagrams of a pre-decoder that selectively connects 128 main bit lines and a redundancy main bit line to (64+1) read data lines and (16+1) auto data lines.
Figure 29B:
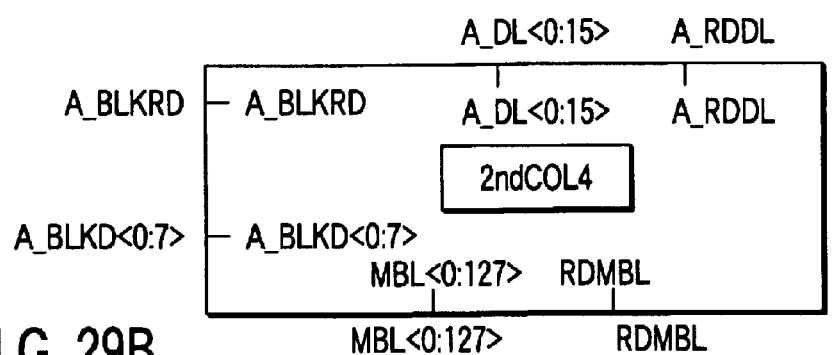
Figure 29C:
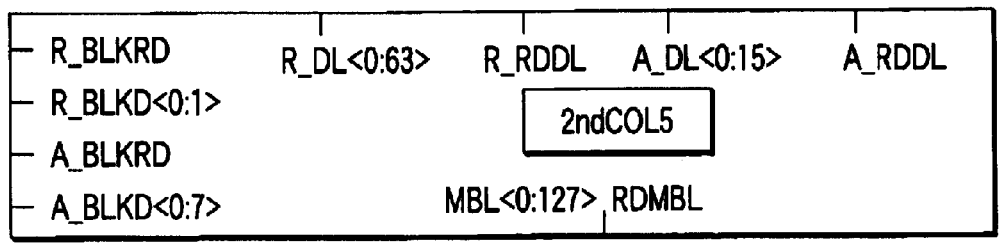
FIG. 29C shows a symbol for the column gate shown in FIGS. 29A and 29B.

FIGS. 29A and 29B are block diagrams of column gate 2ndCOL5 that selectively connects 128 main bit lines MBL<0:127> and one redundancy main bit line RDMBL to (64+1) read data lines and (16+1) auto data lines. FIG. 29C shows a symbol for column gate 2ndCOL5.

Figure 30A:
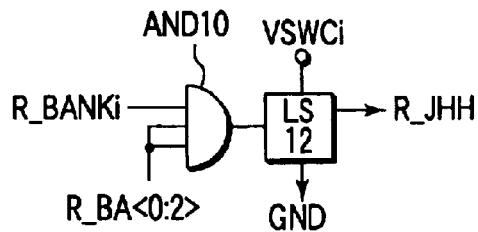
FIG. 30A is a circuit diagram of a decoder that outputs signal R_JHH.
Figure 30B:
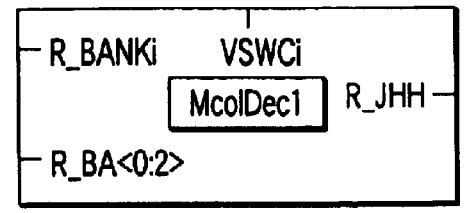
FIG. 30B shows a symbol for the decoder shown in FIG. 30A.

FIG. 30A is a circuit diagram of decoder McolDec1 that outputs signal R_JHH. FIG. 30B shows a symbol for decoder McolDec1. As shown in FIG. 30A, decoder McolDec1 is composed of an AND gate AND10 to which read target bank signal R_BANKi and read block address signal R_BA<0:2> are supplied and a level shifter LS12 operating on voltages VSWCi and GND. Therefore, signal R_JHH is given in the form of decoded signals of read target bank signal R_BANKi and read block address signal R_BA<0:2>.

Figure 31A:
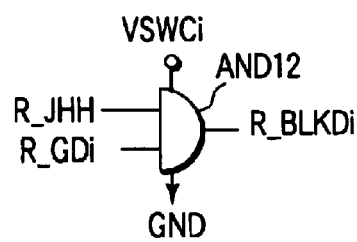
FIG. 31A is a circuit diagram of a decoder for read column gate select signals.
Figure 31B:
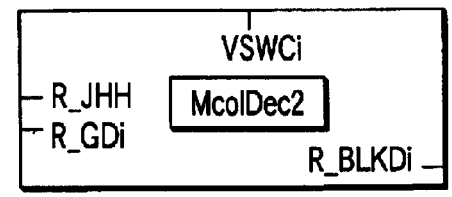
FIG. 31B shows a symbol for the decoder shown in FIG. 31A.

FIG. 31A is a circuit diagram of decoder McolDec2 that outputs read column gate select signal R_BLKDi. FIG. 31B shows a symbol for decoder McolDec2. Decoder McolDec2 operates on voltages VSWCi and GND. Decoder McolDec2, which is composed of the AND gate AND12 to which signal R_JHH and signal R_GDi outputted from decoder McolDec1 shown in FIGS. 30A and 30B are supplied, outputs read column gate select signal R_BLKDi.

Figure 32A:
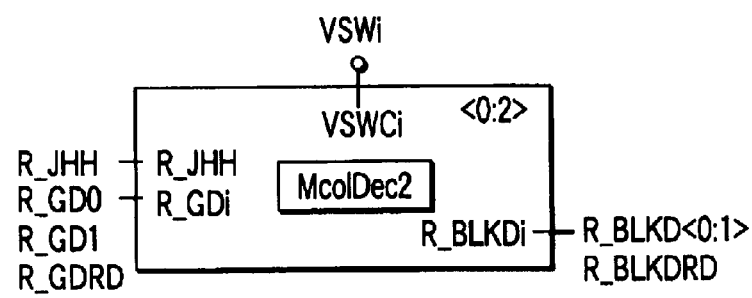
FIG. 32A is a block diagram of a decoder including three units of the decoder shown in FIGS. 31A and 31B.
Figure 32B:
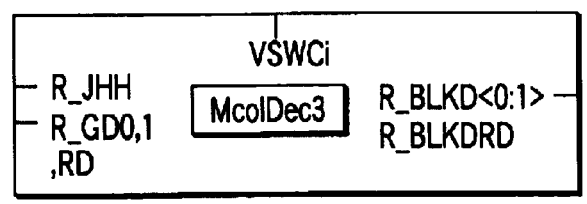
FIG. 32B shows a symbol for the decoder shown in FIG. 32A.

FIG. 32A is a block diagram of decoder McolDec3 including three units of decoder McolDec2. FIG. 32B shows a symbol for decoder McolDec3.

Similarly, FIGS. 33A and 33B to FIGS. 35A and 35B show decoders McolDec4, McolDec5, McolDec6 for auto column gate signals, respectively. Although the input signals and output signals are different, these decoders have basically the same configuration as that in FIGS. 30A and 30B to FIGS. 32A and 32B. That is, decoder McolDec4 is composed of AND gate AND13 and level shifter LS13. Decoder McolDec5 is composed of AND gate AND14. Decoder McolDec6 is composed of nine units of decoder McolDec5.

Figure 36A:
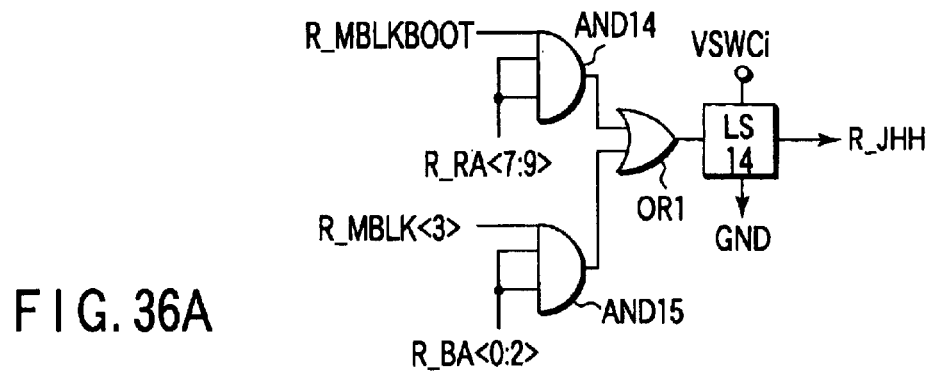
FIG. 36A is a circuit diagram of a decoder for column gate activating signals for a bank including a boot block.

FIGS. 36A and 36B and FIGS. 37A and 37B show decoder McolDec1Boot and decoder McolDec4Boot for column gate activating signals for banks including boot blocks, respectively. As shown in FIG. 36A, decoder McolDec1Boot includes an AND gate AND14 to which signal R_MBLKBOOT and signal R_RA<7:9> are supplied, an AND gate AND15 to which signal R_MBLK<3> and signal R_BA<0:2> are supplied, an OR gate OR1 to which the output signals of AND14 and AND15 are supplied, and a level shift circuit LS14 that operates on voltages VSWCi, GND and shifts the level of the output signal of OR gate OR1. Then, level shift circuit LS14 outputs signal R_JHH.

Figure 36B:
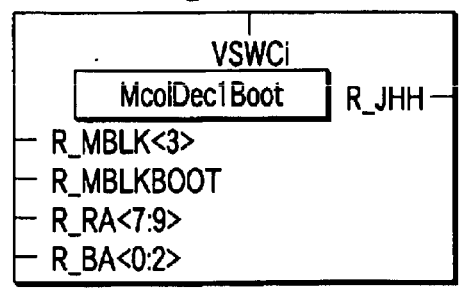
FIG. 36B shows a symbol for the decoder shown in FIG. 36A.
Figure 37A:
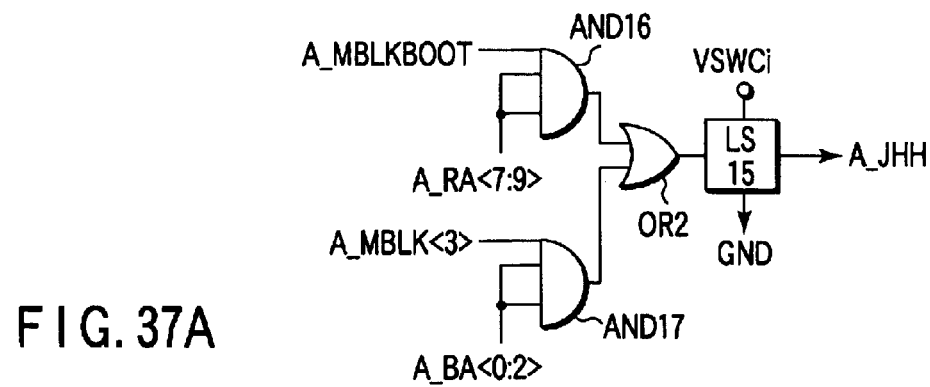
FIG. 37A is a circuit diagram of a decoder for column gate activating signals for a bank including a boot block.
Figure 37B:
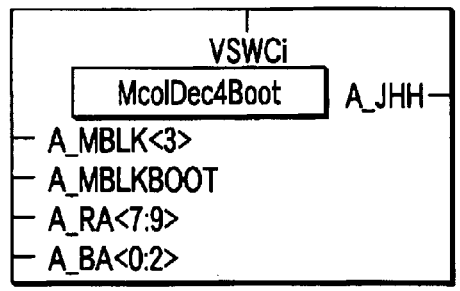
FIG. 37B shows a symbol for the decoder shown in FIG. 37A.

As shown in FIG. 37A, decoder McolDec4Boot includes an AND gate AND16 to which signal A_MBLKBOOT and signal A_RA<7:9> are supplied, an AND gate AND17 to which signal A_MBLK<3> and signal A_BA<0:2> are supplied, an OR gate OR2 to which the output signals of AND16 and AND17 are supplied, and a level shift circuit LS15 that operates on voltages VSWCi and GND, and shifts the level of the output signal of OR gate OR2. Then, level shift circuit LS15 outputs signal A_JHH. FIGS. 36B and 37B show symbols for decoder McolDec1Boot and McolDec4Boot, respectively.

Figures 38A, 38B:
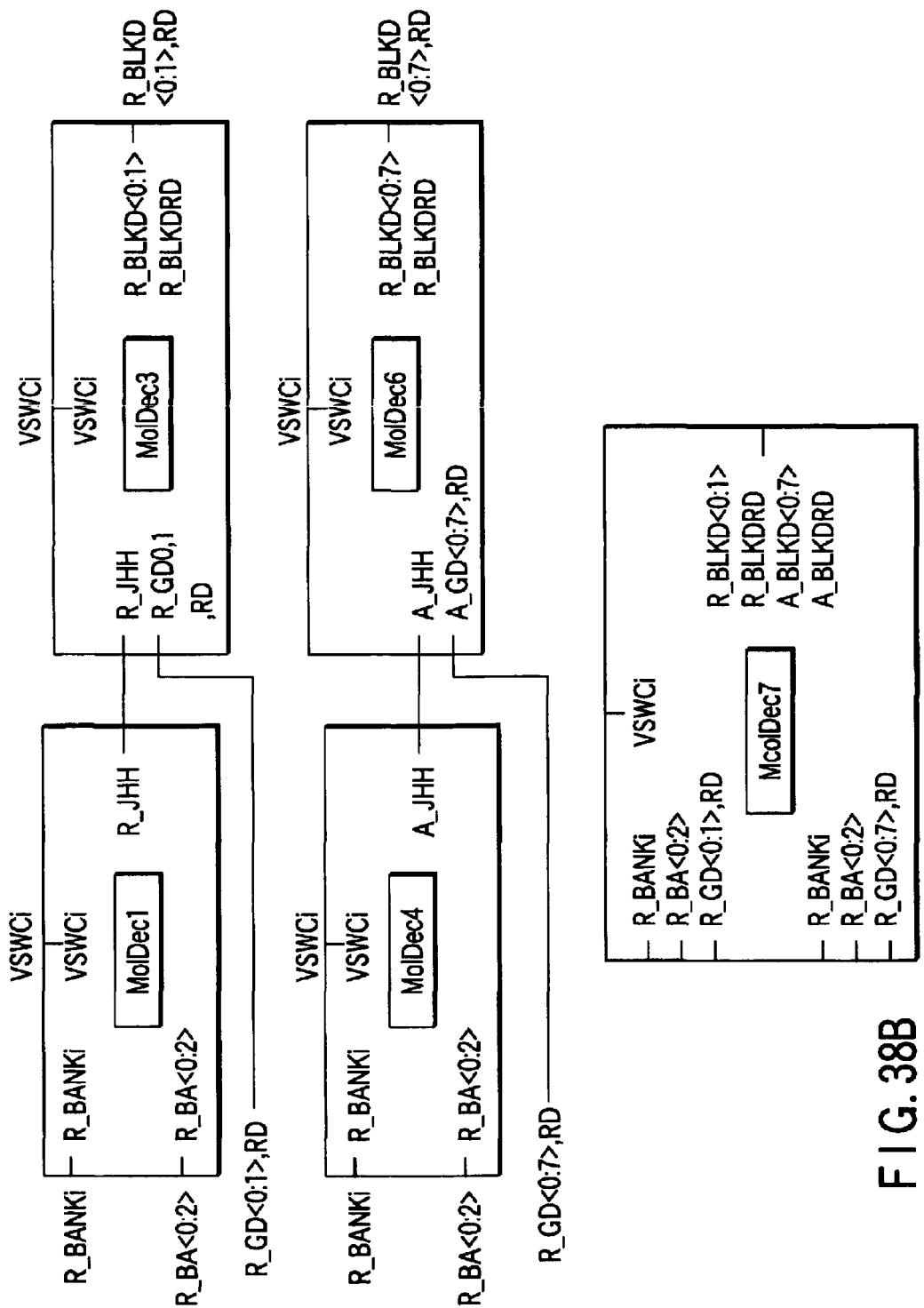
FIG. 38A is a block diagram of a decoder that outputs signals R_BLKD<0:1>, R_BLKDRD, A_BLKD<0:7>, A_BLKDRD.
FIG. 38B shows a symbol for the decoder shown in FIG. 38A.

FIG. 38A is a block diagram of decoder McolDec7 that outputs signals R_BLKD<0:1>, R_BLKDRD, A_BLKD<0:7>, A_BLKDRD. FIG. 38B shows a symbol for decoder McolDec7. As shown in FIG. 38A, decoder McolDec7 is composed of decoders McolDec1 and McolDec3 connected to each other and decoders McolDec4 and McolDec6 connected to each other.

FIG. 39A is a block diagram of decoder McolDec7Boot that outputs a column gate signal for a bank including a boot block. FIG. 39B shows a symbol for decoder McolDec7Boot. As shown in FIG. 39A, decoder McolDec7Boot is composed of decoders McolDec1Boot and McolDec3 connected to each other and decoders McolDec4Boot and McolDec6 connected to each other.

Figures 40A, 40B:
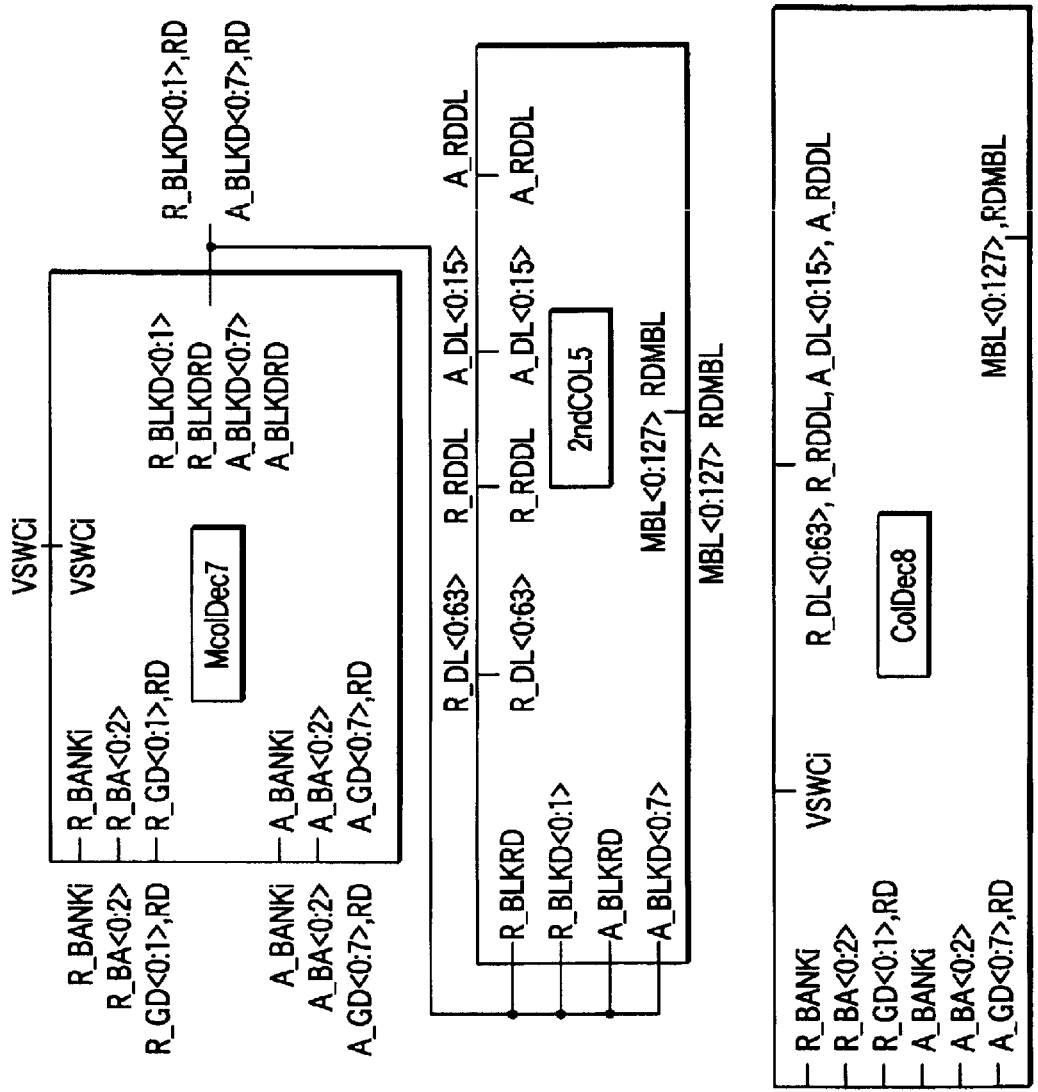
FIG. 40A is a block diagram showing the connection between a column gate signal output for a bank including no boot and a decoder column gate.
FIG. 40B shows a symbol for the circuit shown in FIG. 40A.

FIGS. 40A and 40B and FIGS. 41A and 41B show the connection relationship between the column gate signal output and the decoder column gate for a bank including no boot block and for a bank including a boot block. FIGS. 40A and 41A are block diagrams showing the configuration. FIGS. 40B and 41B show symbols for the respective configurations. As shown in FIG. 40A, decoder ColDec8 is so constructed that the output terminal of decoder McolDec7 is connected to the input terminal of decoder 2ndCOL5. Furthermore, as shown in FIG. 41A, decoder ColDec8Boot is so constructed that the output terminal of decoder McolDec7Boot is connected to the input terminal of decoder 2ndCOL5.

FIGS. 42A, 42B, 43A and 43B are circuit diagrams of global decoder ColGlobalDec for column gate select signals that generates respective decode signals. FIG. 44 shows a symbol for global decoder ColGlobalDec. FIG. 42A shows a circuit section that generates signal R_GD<0:1>, FIG. 42B shows a circuit section that generates signal R_GDRD, FIG. 43A shows a circuit section that generates signal A_GD<0:7>, and FIG. 43B shows a circuit section that generates signal A_GDRD. Each circuit section includes AND gates (AND18 to AND21) and level shifters (LS16 to LS19).

Figure 45A:
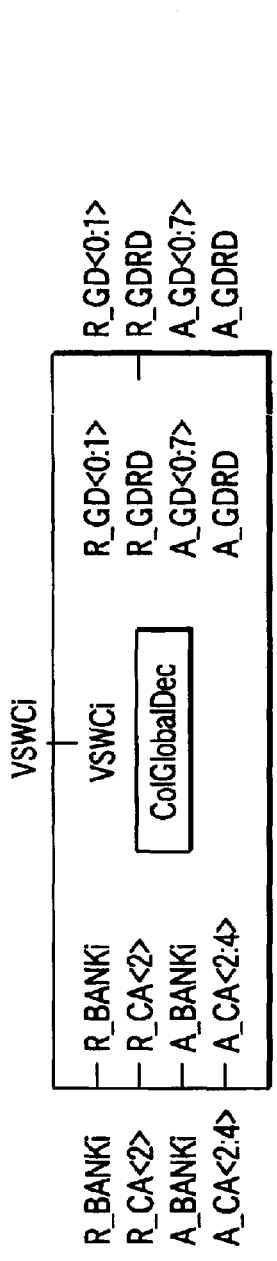
FIG. 45A is a block diagram of a global decoder to help explain the connection relationship between a global column gate signal output for a bank including no boot block and a column decoder.
Figure 45B:
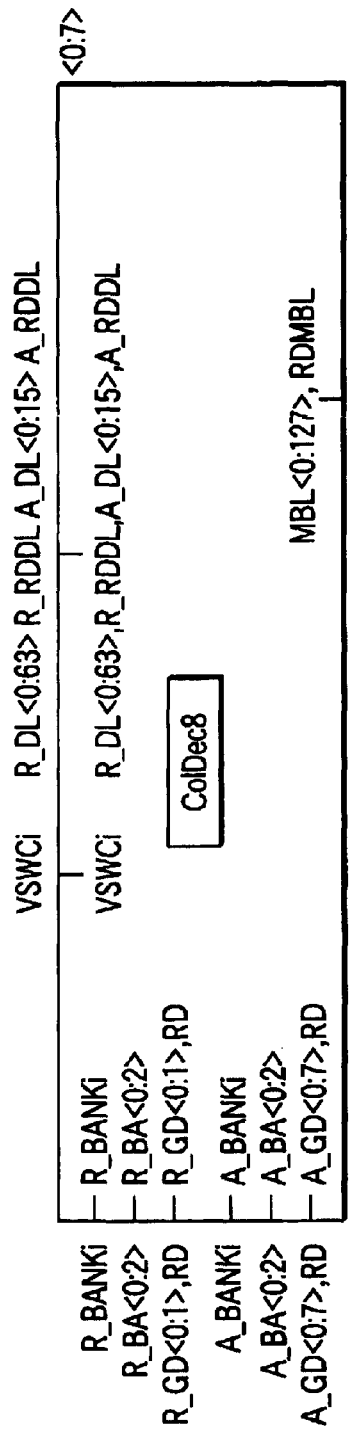
FIG. 45B is a block diagram of a column decoder to help explain the connection relationship between a global column gate signal output for a bank including no boot block and a column decoder.
Figure 45C:
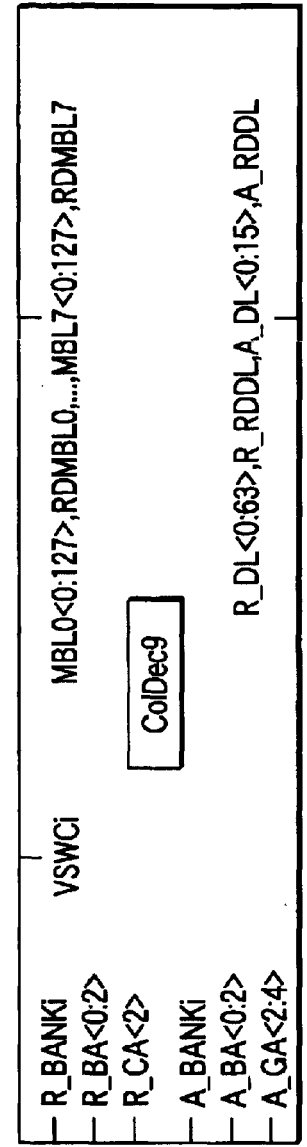
FIG. 45C shows a symbol for a decoder composed of the global decoder shown in FIG. 45A and the column decoder shown in FIG. 45B.

FIGS. 45A to 45C and FIGS. 46A to 46C show the connection relationship between the global column gate signal output and the column decoder for a bank including no boot block and for a bank including a boot block. The output signals R_GD<0:1>, R_GDRD, A_GD<0:7>, A_GDRD of global decoder ColGlobalDec shown in FIG. 45A are supplied to column decoder ColDec8 shown in FIG. 45B. Column decoder ColDec8 drives main bit lines and redundancy main bit lines MBL0<0:127>, REMBL0, . . . , MBL7<0:127>, RDMBL7. FIG. 45C shows a symbol for decoder ColDec9 composed of global decoder ColGlobalDec and column decoder ColDec8.

Figure 46A:
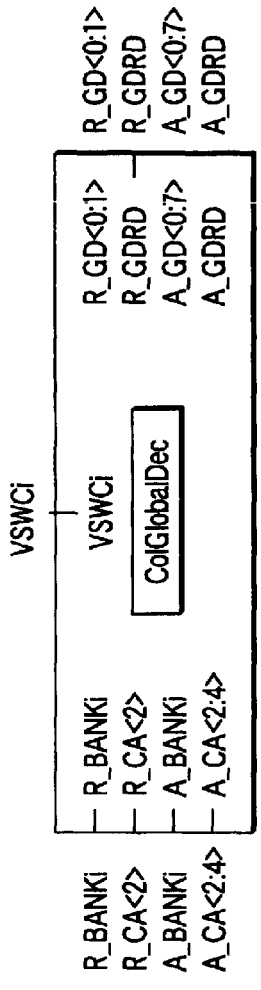
FIG. 46A is a block diagram of a global decoder to help explain the connection relationship between a global column gate signal output for a bank including a boot block and a column decoder.
Figure 46B:
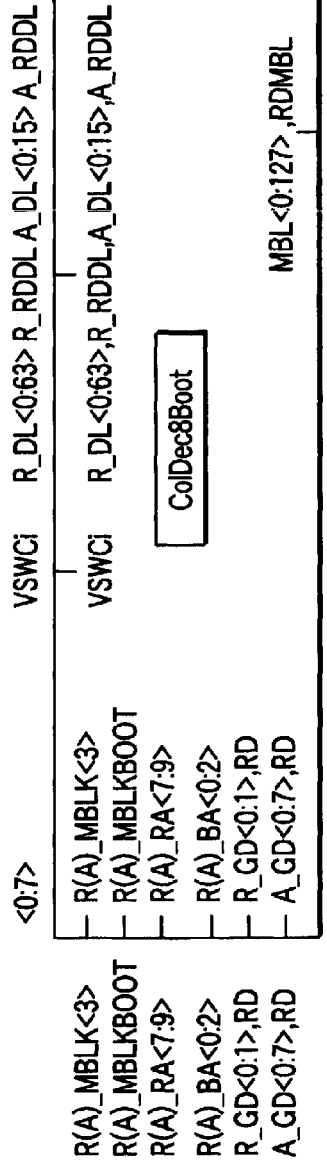
FIG. 46B is a block diagram of a column decoder to help explain the connection relationship between a global column gate signal output for a bank including a boot block and a column decoder.
Figure 46C:
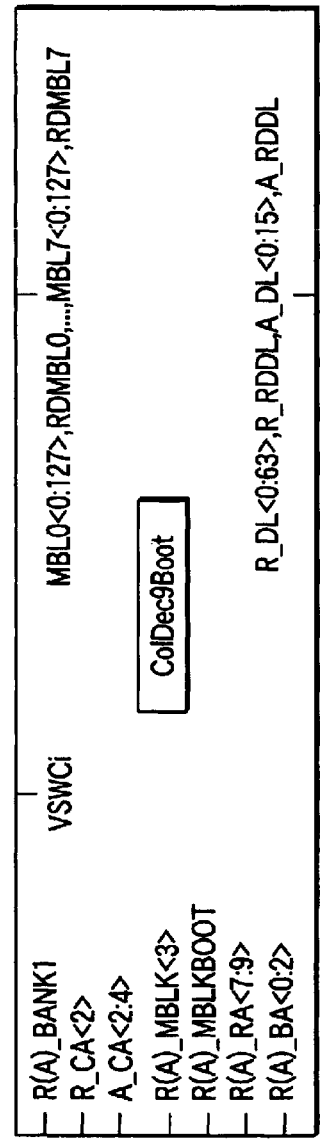
FIG. 46C shows a symbol for a decoder composed of the global decoder shown in FIG. 46A and the column decoder shown in FIG. 46B.

The output signals R_GD<0:1>, R_GDRD, A_GD<0:7>, A_GDRD of global decoder ColGlobalDec shown in FIG. 46A are supplied to column decoder ColDec8Boot shown in FIG. 46B. Column decoder ColDec8Boot drives main bit lines and redundancy main bit lines MBL0<0:127>, REMBL0, . . . , MBL7<0:127>, RDMBL7. FIG. 46C shows a symbol for decoder ColDec9Boot composed of global decoder ColGlobalDec and column decoder ColDec8Boot.

FIG. 47A shows the configuration of a 512-Kbit block. FIG. 47B shows a symbol for the 512-Kbit block. As shown in FIG. 47A, block BLK is comprised of a cell array CellArray, a first-stage column gate 1stCol3, a decoder ColDec2 for the first-stage column gate 1stCol3, row decoders RowDec2 and RowDec8, and a block decoder BlockDec.

FIG. 48A shows the configuration of a 4-Mbit core 4MbCORE composed of eight units of the 512-Kbit block. FIG. 48B shows a symbol for the 4-Mbit core 4MbCORE. These eight blocks share voltages VSWCi, VSWi, VBBi, and signals Mi/MiB, Fi, Hi. Main bit lines MBL<0:127>, MBLRD are provided independently for the eight blocks.

Figures 49A, 49B:
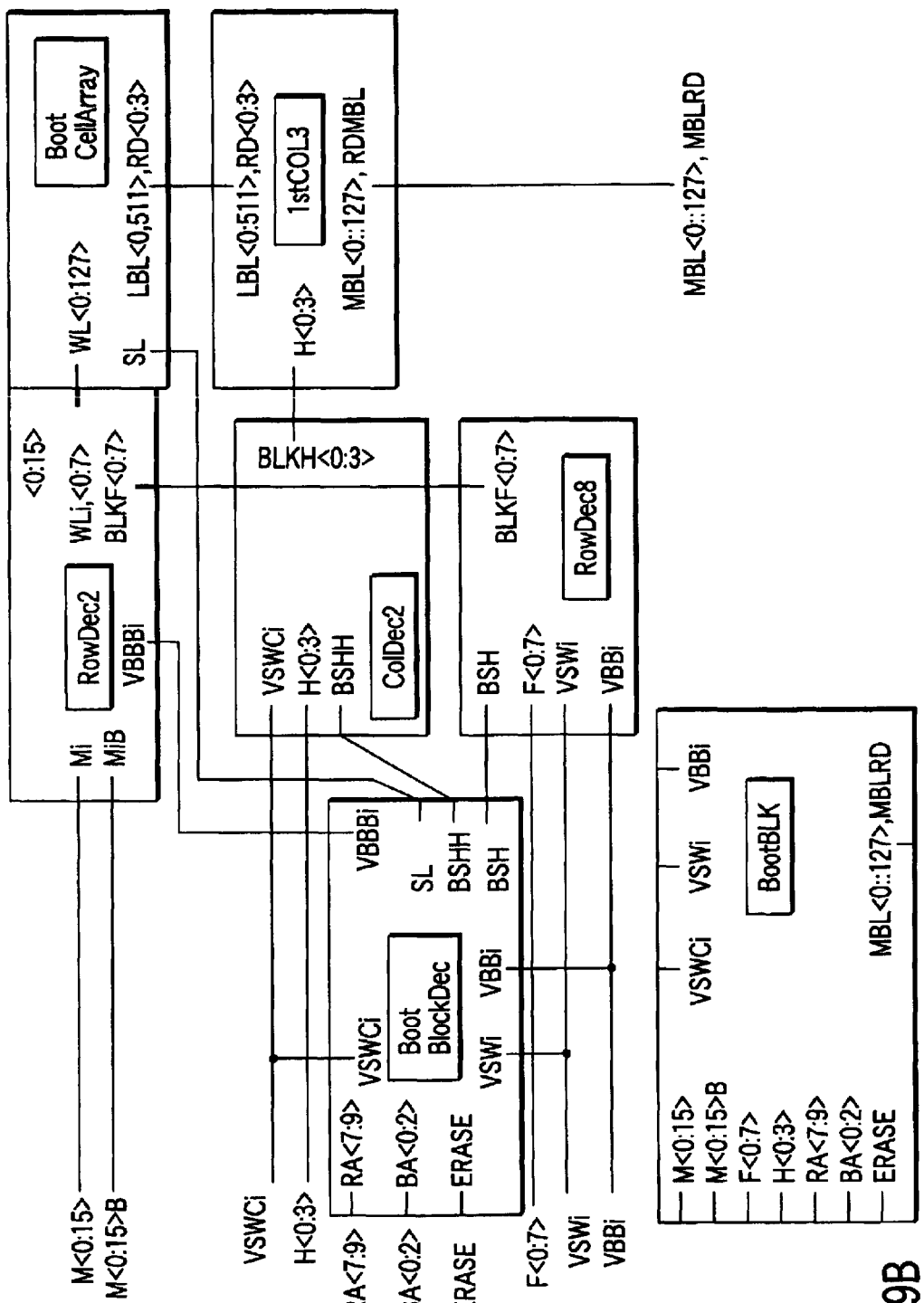
FIG. 49A is a block diagram of a boot block.
FIG. 49B shows a symbol for the boot block shown in FIG. 49A.

FIG. 49A is a block diagram of boot block BootBLK. FIG. 49B shows a symbol for boot block BootBLK. The book block BootBLK differs from block BLK in that the total number of word lines is ⅛ that in block BLK, the number of RowDec2 is ⅛ that in block BLK, and the number of signal lines for transferring pre-decode signal pairs Mi/MiB is ⅛ that in block BLK, or 16.

Figures 50A, 50B:
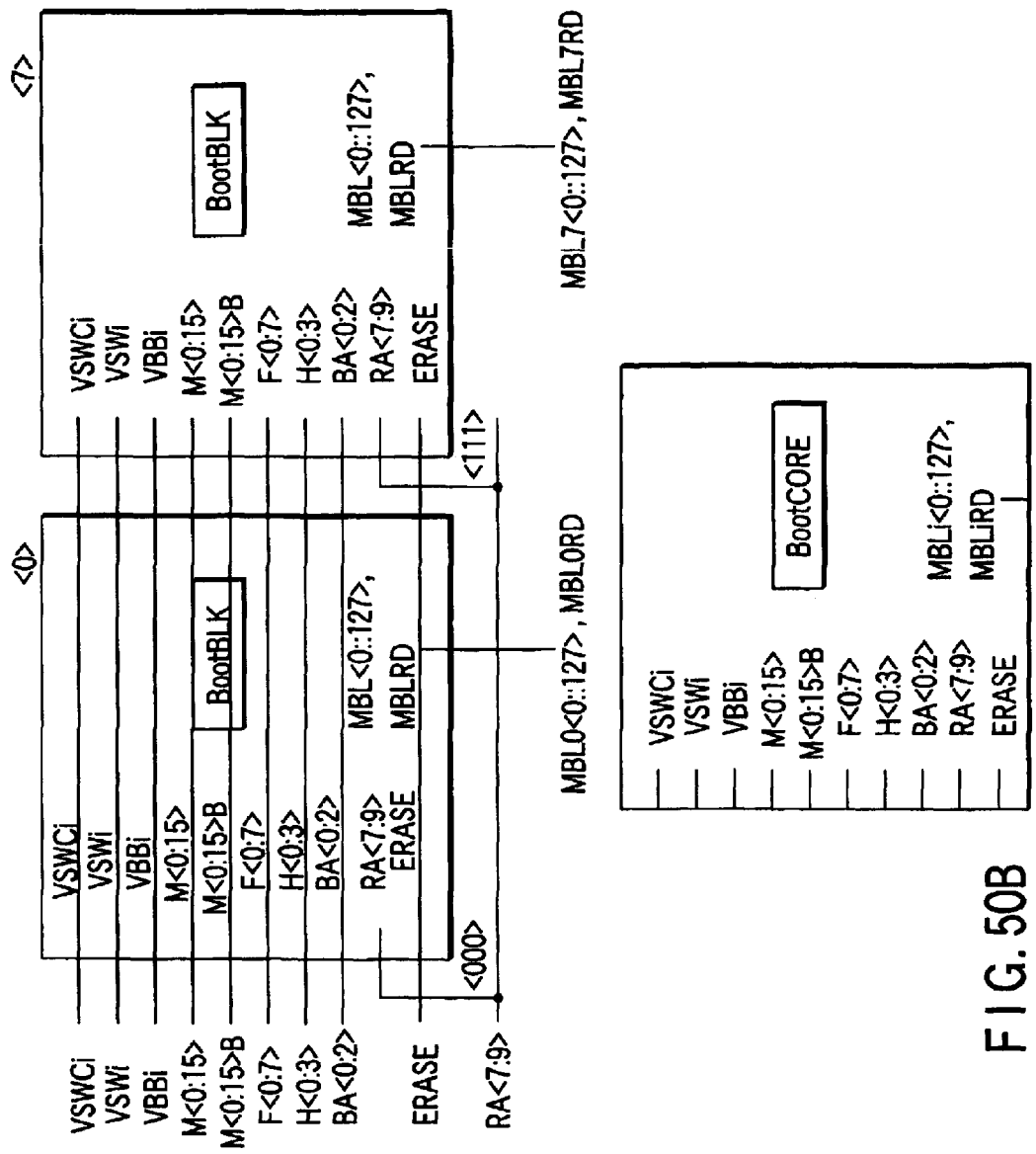
FIG. 50A is a block diagram showing the connection relationship between eight boot blocks.
FIG. 50B shows a symbol for the circuit shown in FIG. 50A.

FIGS. 50A and 50B show the connection relationship between eight boot blocks BootBLK. These boot blocks BootBLK share voltages VSWCi, VSWi, VBBi, and signals Mi/MiB, Fi, Hi. Main bit lines MBL<0:127> and MBLRD are provided independently for the eight blocks.

Figure 51:
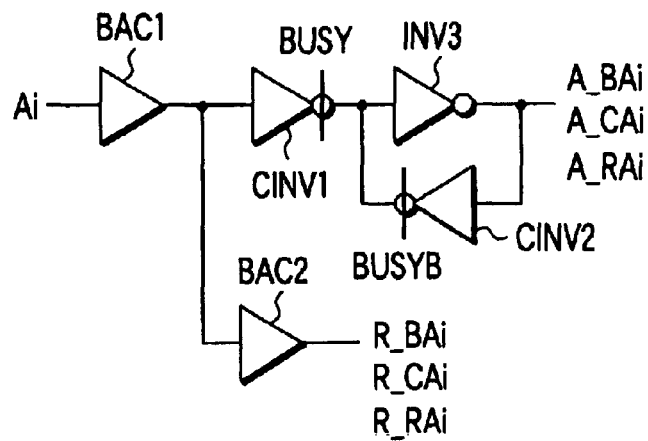
FIG. 51 is a circuit diagram showing an example of the configuration of an address buffer, centering on bit i.

FIG. 51 is a circuit diagram showing the configuration of an address buffer, centering on bit i. The address buffer is composed of buffer circuits BAC1, BAC2, clocked inverters CINV1, CINV2, and an inverter INV3. Signal BUSY goes high in a program operation or an erase operation. Auto addresses A_BA, RA, CA do not accept a change in address pad Ai during an auto operation. R_BA, CA, RA indicate read addresses. Block high-order address BA<3:4> is decoded into main block address MBLK<0:3> whose timing is controlled by signal BUSY or signal READE (in this embodiment, a 16-Mbit flash memory is used as an example).

Figure 52:
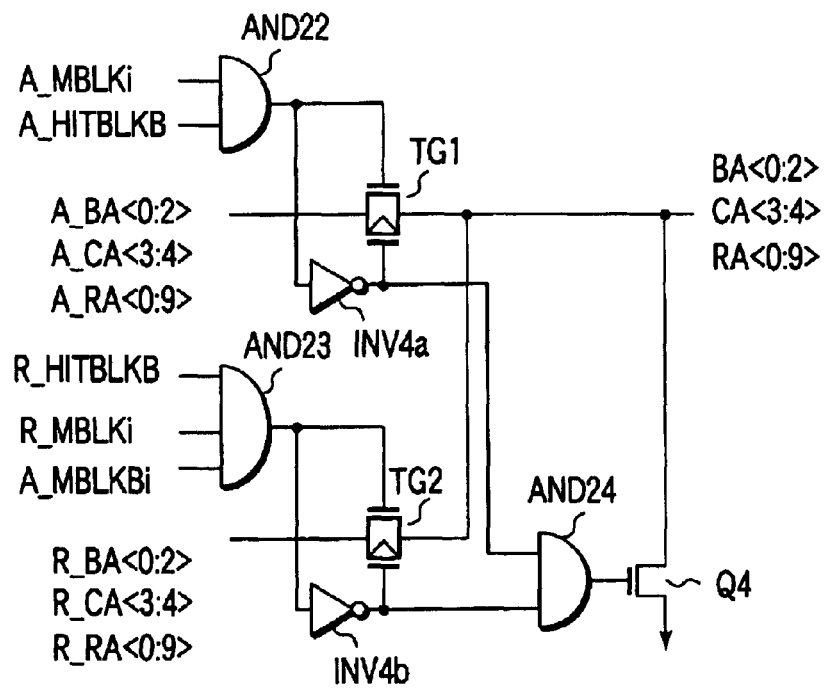
FIG. 52 is a circuit diagram of an address buffer.

FIG. 52 is a circuit diagram of an address switch. The address switch is composed of AND gates AND22, AND23 and AND24, transfer gates TG1 and TG2, inverters INV4a and INV4b, and an n-channel transistor Q4. The address switch is provided for each of the 4-Mbit cores 4MbCOREs or boot cores BootCORE. When the selected block is not replaced with block redundancy, signal A_HITBLKB or signal R_HITBLKB goes high, with the result that addresses BA, RA, CA of the selected 4MbCORE or Boot-CORE become A_BA, RA, CA in an auto operation and R_BA, RA, CA in a read operation. All of the address signals of the unselected 4MbCORE or BootCORE go low.

Figure 53:
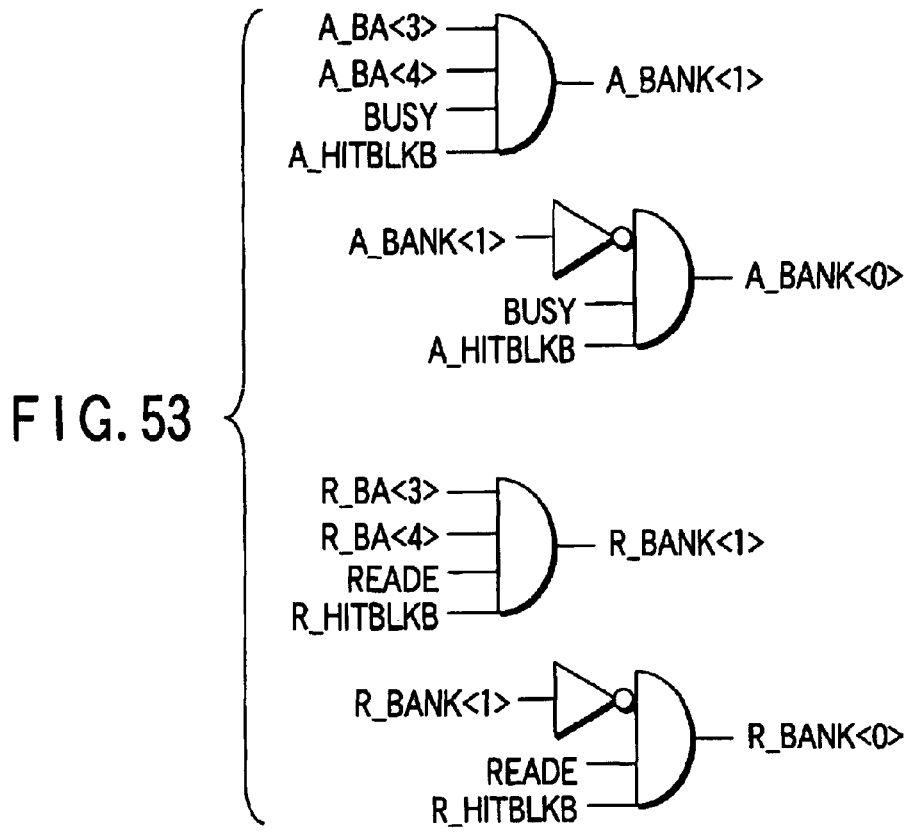
FIG. 53 is a circuit diagram showing an example of the configuration of a bank signal generating circuit.

FIG. 53 shows an example of the configuration of a bank signal generating circuit. In this embodiment, a 2-bank structure is used as an example. The high-order 4 Mbits (BA<3>=BA<4>=H) in a block address belong to a first bank BANK1. The remaining 12 Mbits belong to a second bank BANK0. There are two types of signal BANK, one for an auto operation and the other for a read operation.

Figure 54A:
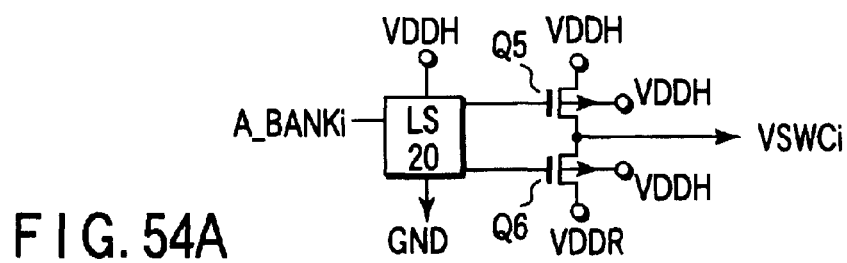
FIG. 54A is a circuit diagram showing an example of the configuration of a power switch.
Figure 54B:
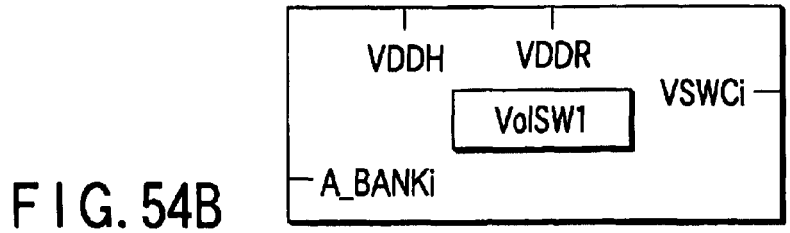
FIG. 54B shows a symbol for the power switch shown in FIG. 54A.

FIGS. 54A, 54B, 55A, 55B, 56A and 56B show power switches VolSW1, VolSW2, and VolSW3, respectively. FIGS. 54A, 55A, and 56A are circuit diagrams of power switches VolSW1, VolSW2 and VolSW3, respectively. FIGS. 54B, 55B and 56B show symbols for power switches VolSW1, VolSW2, and VolSW3, respectively. As shown in FIG. 54A, power switch VolSW1 is composed of a level shifter LS20 and p-channel MOS transistors Q5, Q6. As shown in FIG. 55A, power switch VolSW2 is composed of a level shifter LS21 and p-channel MOS transistors Q7 and Q8. As shown in FIG. 56A, power switch VolSW3 is composed of a level shifter LS22 and p-channel MOS transistors Q9 and Q10. Column power supply VSWC is switched on a bank basis. Row power supplies VSW and VBB are switched on a 4-Mbit core 4MbCORE basis or a boot core BootCORE basis.

Figure 57:
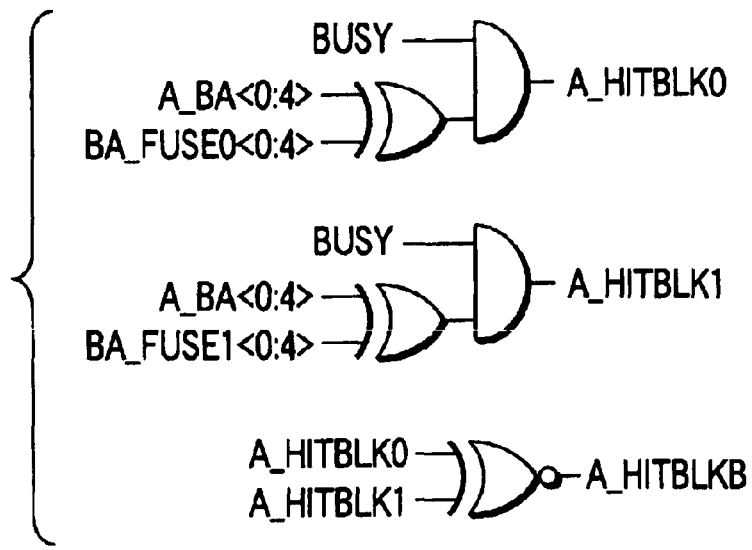
FIG. 57 is a circuit diagram showing an example of the configuration of a block redundancy control signal output circuit.
Figure 58:
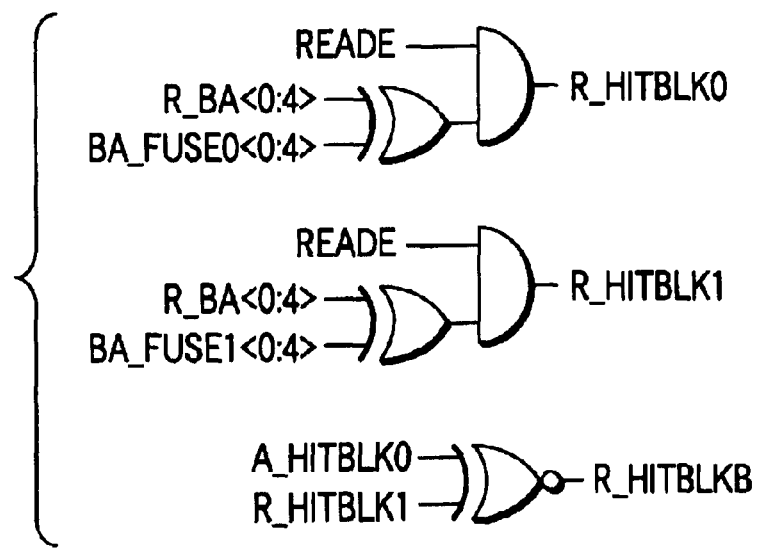
FIG. 58 is a circuit diagram showing an example of the configuration of a block redundancy control signal output circuit.

FIGS. 57 and 58 each show an example of the configuration of a block redundancy control signal output circuit. In each example, two redundancy blocks are used. When the data coincides with redundancy address storage fuse data BA_FUSE0<0:4> or BA_FUSE1<0:4>, signal HITBLK goes high. There are two types of signal HITBLK, one for an auto operation and the other for a read operation.

Figure 59:
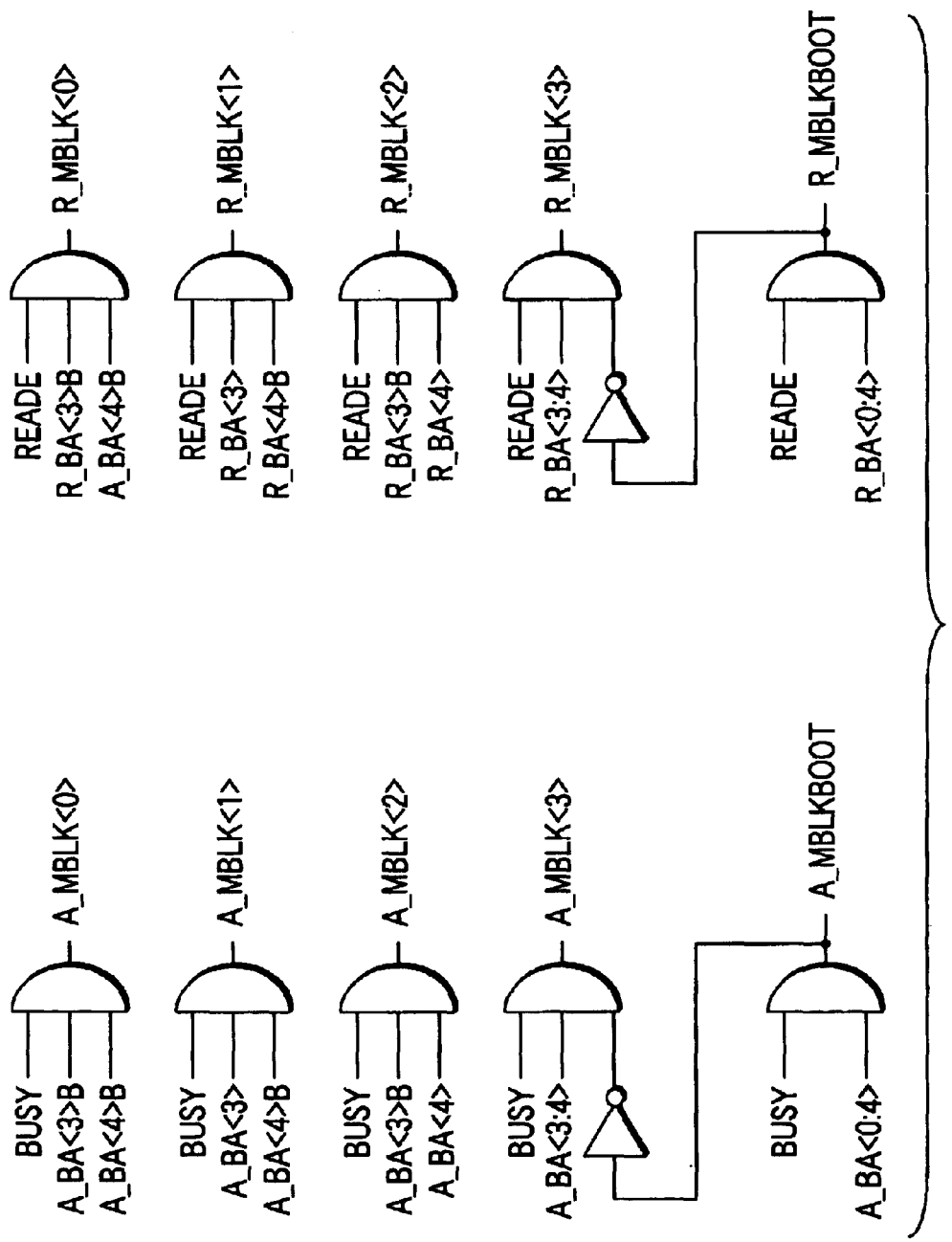
FIG. 59 is a circuit diagram of a circuit that generates main block addresses.

FIG. 59 shows a circuit that generates main block addresses. The main block address signal MBLK outputted from this circuit is a signal for selecting either 4-Mbit core 4MbCORE or boot core BootCORE.

FIGS. 60A and 60B show an example of the configuration of a power switch and decoder VolDec provided for each 4-Mbit core 4MbCORE. As shown in FIG. 60A, the power switch and decoder VolDec includes power switch VolSW2, power switch VolSW3, row decoder RowDec4, row decoder RowDec6, and column decoder ColDec 3.

Figure 61A:
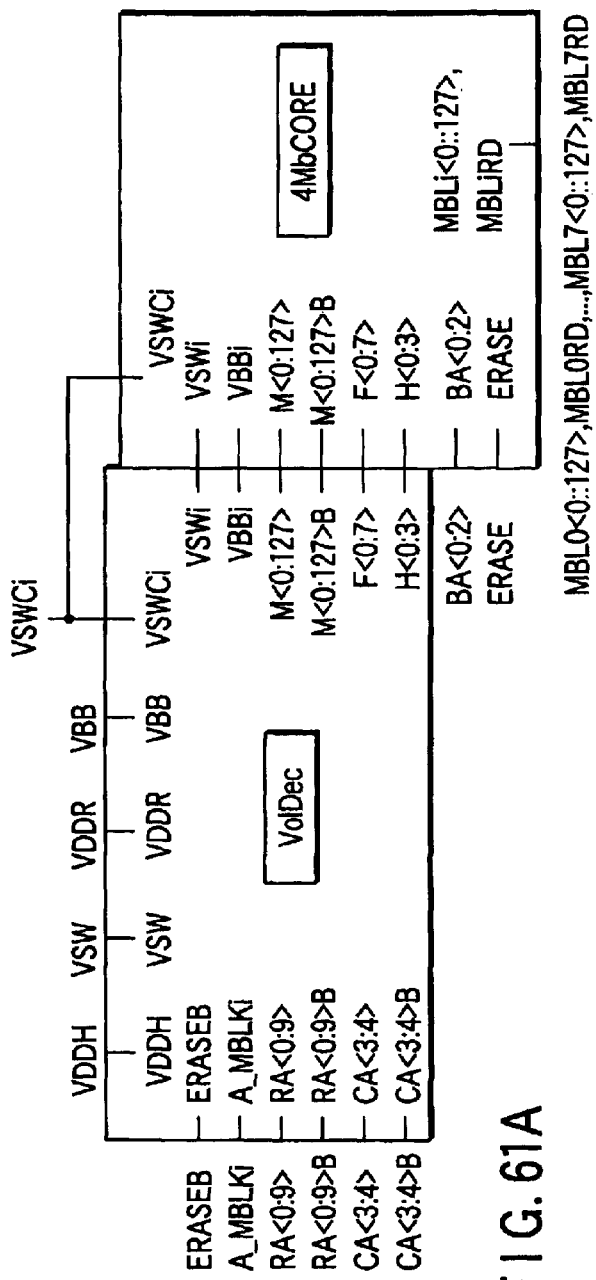
FIG. 61A is a block diagram of a 4-Mbit power switch and a decoder which are composed of a 4-Mbit core and a power switch.
Figure 61B:
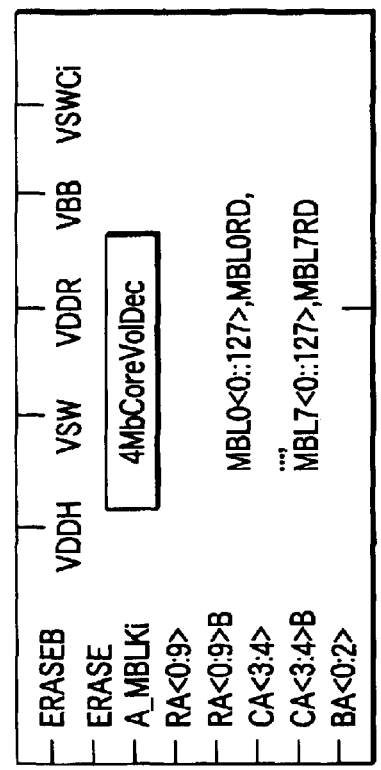
FIG. 61B shows a symbol for the power switch and decoder shown in FIG. 61A.

FIG. 61A is a block diagram of a 4-Mbit power switch and decoder 4MbCoreVolDec which is composed of 4-Mbit core 4MbCORE and the power switch and decoder VolDec. FIG. 61B shows a symbol for the 4-Mbit power switch and decoder 4MbCoreVolDec. The power switch and decoder 4MbCoreVolDec is designed to suppress fluctuations in the parasitic capacitance of the power supply, regardless of whether redundancy is selected or not, by making the address on the main body side unselected and setting the main body power switch in the selected state when selecting block redundancy.

As shown in FIG. 52, when block redundancy is used (HITBLK=H), all of the input addresses to the decoder are made unselected, no voltage is applied to the memory cells. On the other hand, the power switches VolSW2 and VolSW3 shown in FIGS. 55 and 56 are put in the selected state, regardless whether redundancy replacement is performed or not. This is done to make the parasitic capacitance of the power supplies VSW and VBB as constant as possible. Specifically, in a case where the power switch is also put in the unselected state on the basis of redundancy information, when a redundancy block is selected, a parasitic capacitance for one block develops. When no redundancy block is selected, a parasitic capacitance for eight blocks develops. The difference between them is relatively large. A rewrite voltage is generated by a step-up circuit. Its rise time depends largely on the parasitic capacitance. The parasitic capacitance changes greatly, depending on whether redundancy is selected or not, which causes the rise time to change greatly. As a result, the effective rewrite time changes. This means that the rewrite condition changes, depending on whether a redundancy block is selected or not, which causes a problem.

On the other hand, in a case where the power switch is put in the selected state, regardless of redundancy information, when a redundancy block is selected, a parasitic capacitance for nine blocks develops. In contrast, when no redundancy block is selected, a parasitic capacitance for eight blocks develops. The difference between them is relatively small. As a result, the rewrite condition changes less, depending on whether a redundancy block is selected or not, which causes no problem in terms of characteristic.

Therefore, with this configuration, fluctuations in the parasitic capacitance are small, with the result that the rewrite condition for the cells in the redundancy block is almost equal to that for the main body cells.

FIG. 62A is a block diagram of a boot core power switch and decoder VolDecBoot. FIG. 62B shows a symbol for the boot core power switch and decoder VolDecBoot. As shown in FIG. 62A, the boot core power switch and decoder VolDecBoot includes a power switch VolSW2, a power switch VolSW3, a boot block row decoder RowDec4Boot, a row decoder RowDec6, and a column decoder ColDec3.

Figure 63A:
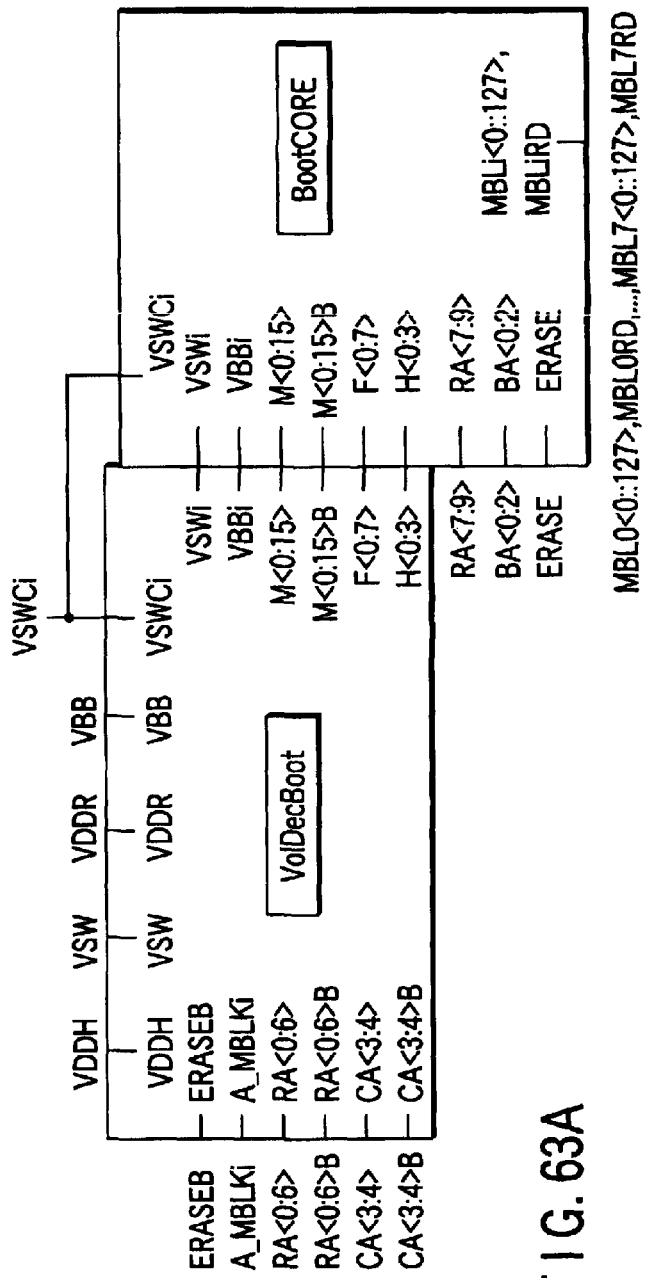
FIG. 63A is a block diagram of a power switch and decoder for a boot core which are composed of a boot core and a power switch and decoder for the boot core.
Figure 63B:
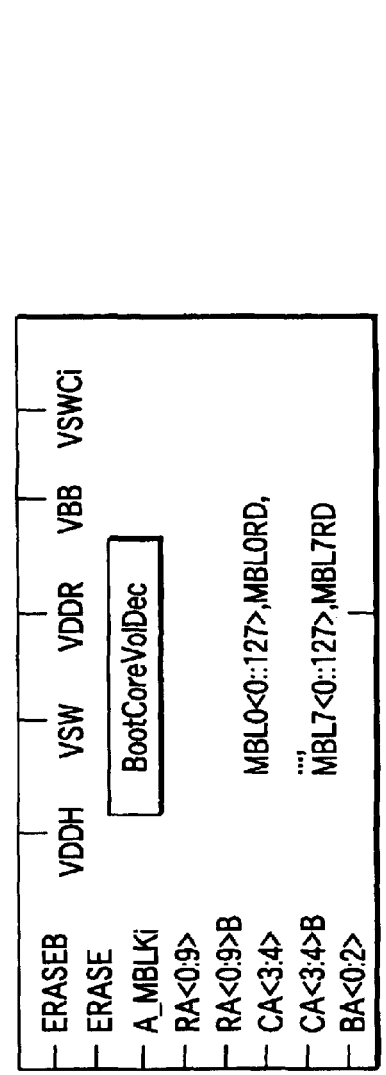
FIG. 63B shows a symbol for the power switch and decoder shown in FIG. 63A.

FIG. 63A is a block diagram of a boot core power switch and decoder BootCoreVolDec composed of the boot core BootCORE and the boot core power switch and decoder VolDecBoot. FIG. 63B shows a symbol for the boot core power switch and decoder BootCoreVolDec. As shown in FIG. 63A, the boot core power switch and decoder BootCoreVolDec is such that the output signals of the boot core power switch and decoder VolDecBoot are supplied to boot core BootCORE.

Figure 64:
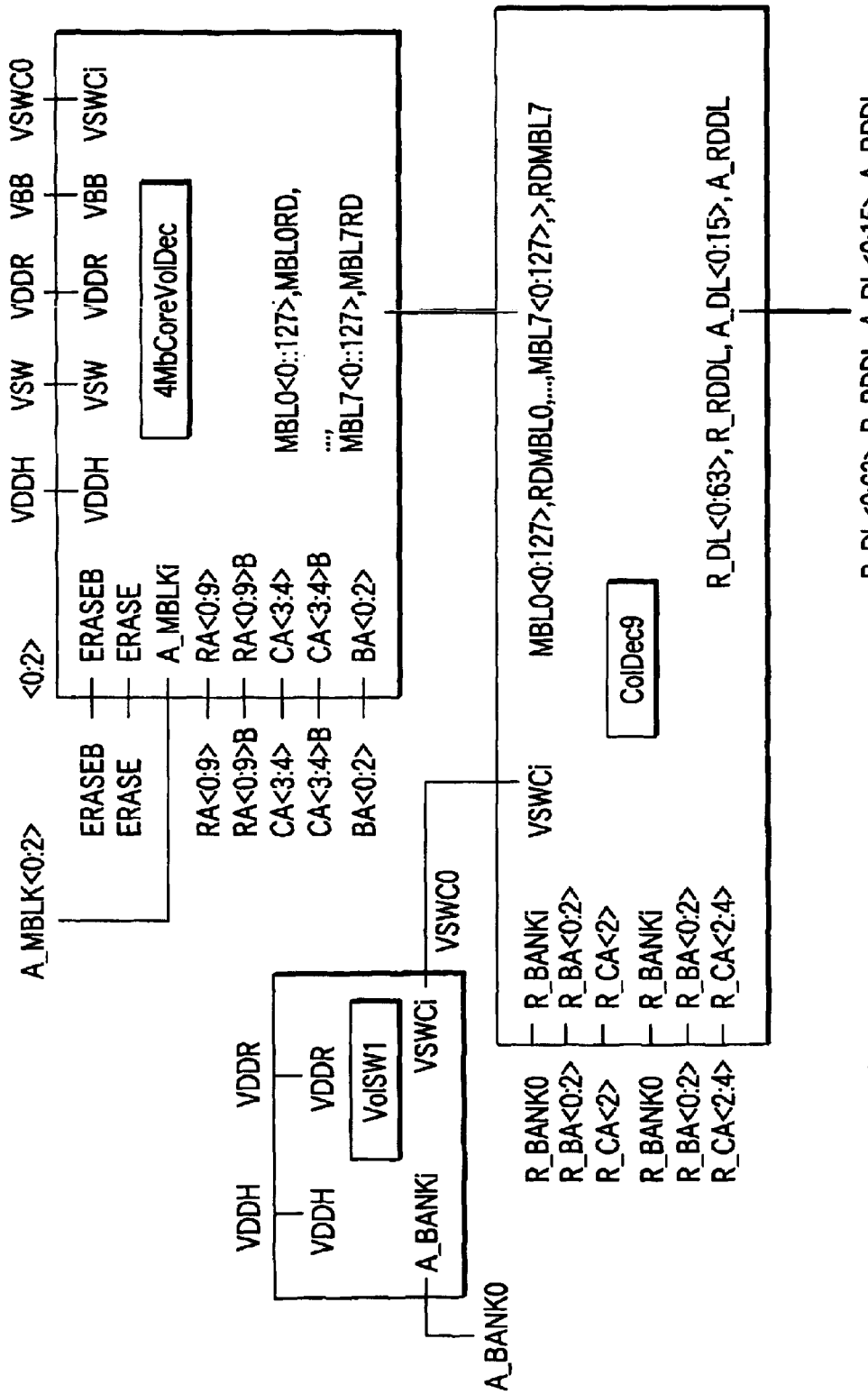
FIG. 64 is a block diagram showing the configuration of the decoder of bank BANK 0.

FIG. 64 shows the configuration of the decoder of bank BANK0. Bank BANK0 is composed of a power switch VolSW1, a 4-Mbit power switch and decoder 4MbCoreVolDec, and a decoder ColDec9.

FIG. 65 shows a symbol for the decoder of bank BANK0 shown in FIG. 64. FIG. 65 shows the configuration of the core of bank BANK0. In this example, one 4-Mbit section and boot section share the main bit line.

FIG. 66A is a block diagram of the power switch and decoder Bank1CoreVolDec of bank BANK1. FIG. 66B shows a symbol for the power switch and decoder Bank1CoreVolDec. As shown in FIG. 66A, the power switch and decoder Bank1CoreVolDec is composed of a 4-Mbit power switch and decoder 4MbcoreVolDec and a boot core power switch and decoder BootCoreVolDec.

Figure 67:
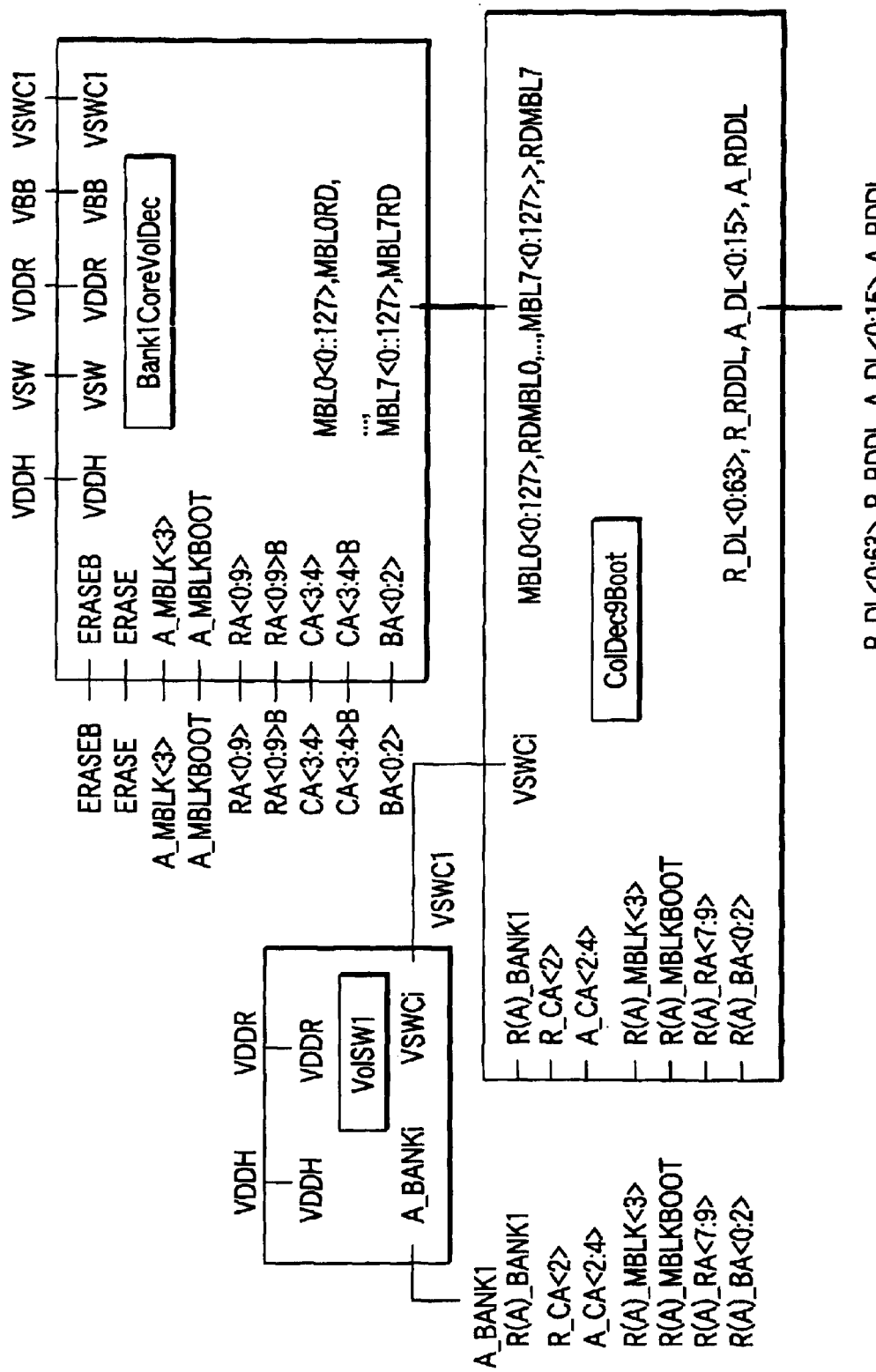

FIG. 67 shows the configuration of the decoder of BANK1. The bank BANK1 is composed of a power switch VolSW1, a power switch and decoder Bank1CoreVolDec, and a boot decoder ColDec9Bboot.

FIG. 68 shows a symbol for the decoder of bank BANK1 shown in FIG. 67. FIG. 68 shows the configuration of the core of bank BANK1.

FIGS. 69A to 69C show a block redundancy column decoder section. This column decoder section includes a global decoder ColGlobalDec shown in FIG. 69A, a decoder ColDec8 shown in FIG. 69B, and a block redundancy decoder ColDec9B shown in FIG. 69C.

On the main body side, a global decoder ColGlobalDec is provided for eight blocks. A redundancy block is provided for a 512-Kbit block so as to be replaced with any block.

FIGS. 70A and 70B show the connection relationship between the redundancy block power switch and decoder VolDec and the block BLK. FIG. 70A is a block diagram of the power switch and decoder VolDec and the block BLK. FIG. 70B shows a symbol for the connection circuit BLKRDVolDec.

Figure 71:
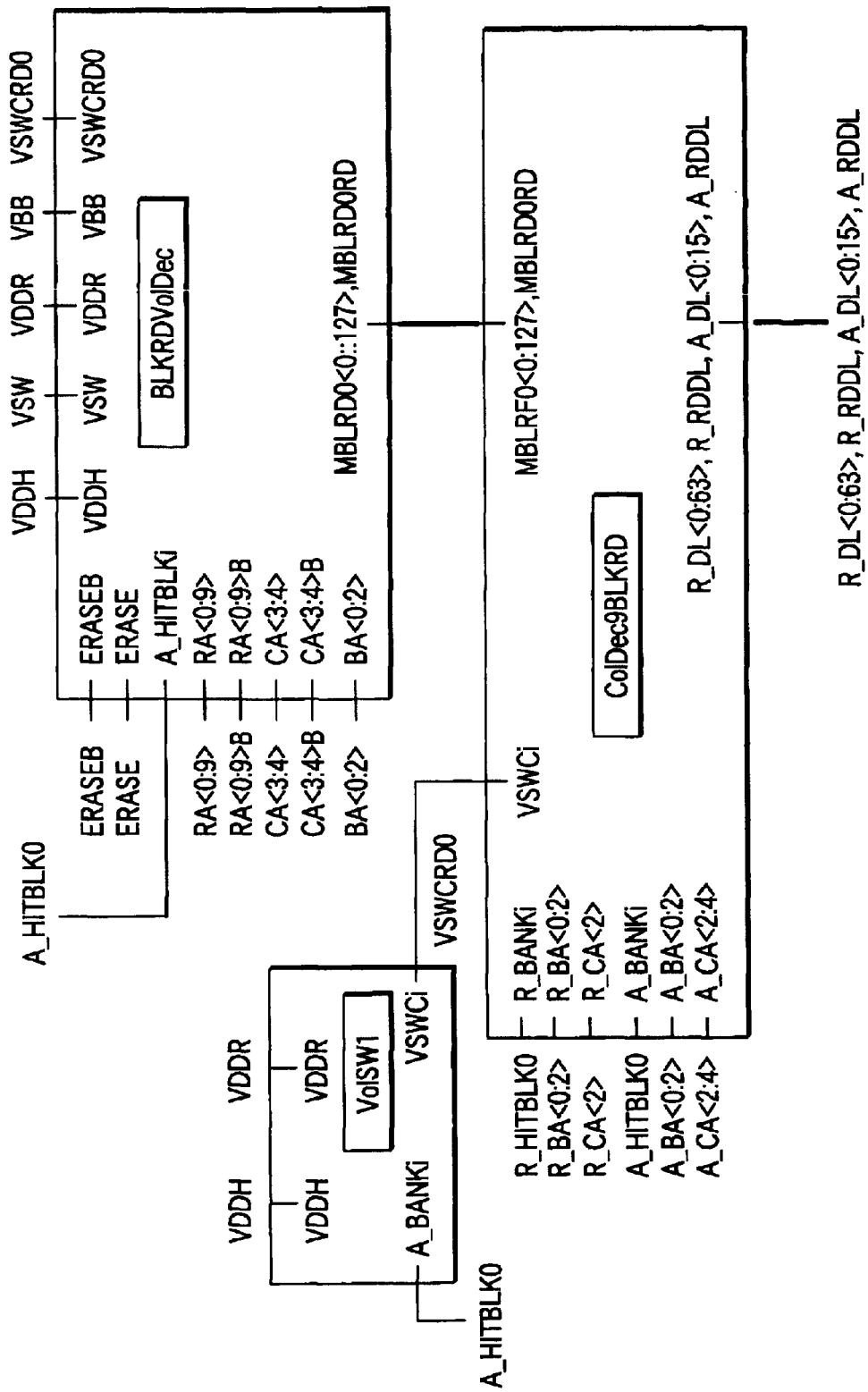

FIG. 71 shows the configuration of the decoder of a redundancy block. The decoder includes the power switch VolSW1 shown in FIGS. 54A and 54B, the connection circuit BLKRDVolDec between the redundancy block power switch and decoder VolDec and the block BLK shown in FIGS. 70A and 70B, and a block redundancy decoder ColDec9BLKRD.

As described above, in the redundancy block, the power switch, row decoder, and column decoder are for exclusive use.

Figure 72:
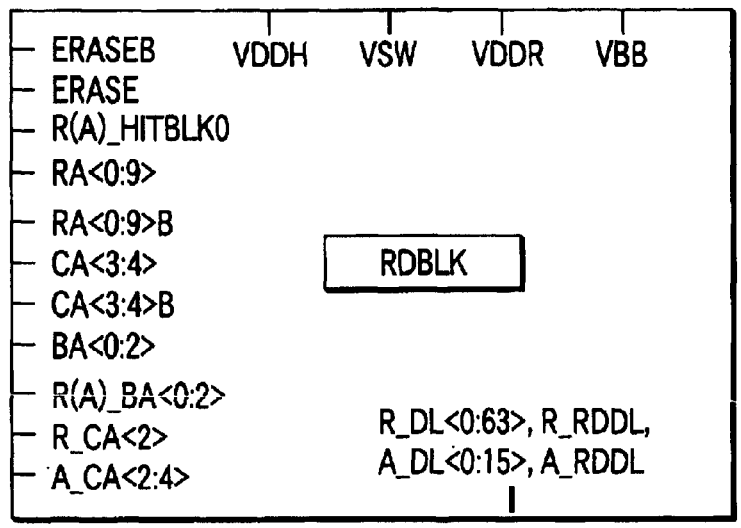

FIG. 72 shows a symbol for the redundancy block decoder RDBLK shown in FIG. 71.

FIGS. 73A to 73D are block diagrams of 16-Mbit flash memory cores with a 2-bank structure of 4 Mbits+12 Mbits, including two redundancy blocks. The two redundancy blocks and two banks share (64+1) read data lines and (16+1) auto data lines.

Figure 74:
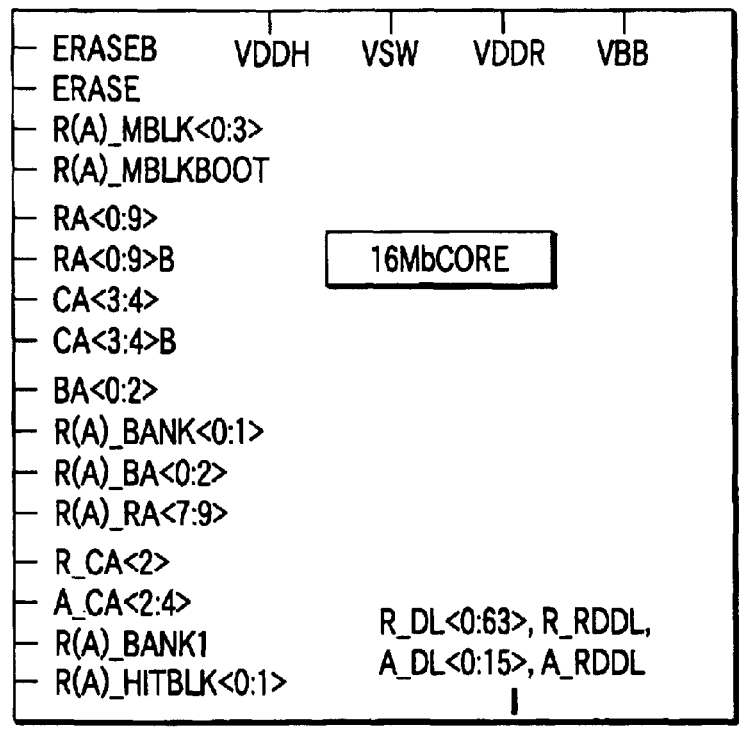
Figures 73A, 73B, 73C, 73D:
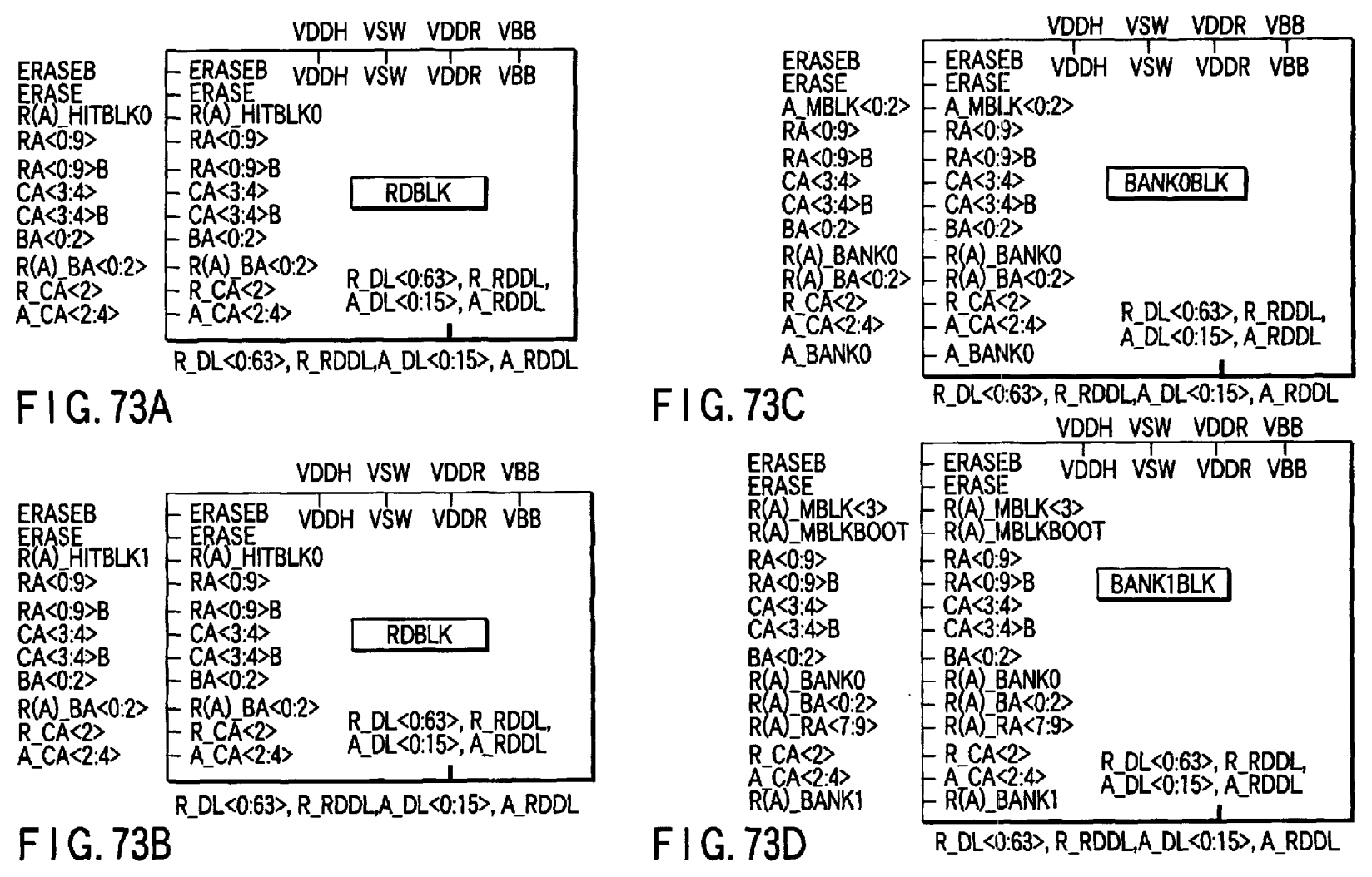

FIG. 74 shows a symbol for the 16-Mbit flash memory cores 16MbCORE shown in FIGS. 73A to 73D.

FIG. 75 is a circuit diagram showing an example of the configuration of a column redundancy circuit. Two replaceable circuits are shown in FIG. 75. An auto column redundancy circuit compares all of the block addresses with the stored data about all of the column addresses. If all of the addresses coincide, the auto column redundancy circuit outputs signal HITCOL. A read column redundancy circuit compares all of the block addresses with the page addresses (all the bits excluding the two low-order bits in four words/page of the embodiment) CA<2:4>. When all the addresses coincide, the read column redundancy circuit outputs signal HITCOL. As 4-bit fuse data R_IO_FUSE<0:3> representing I/O to be replaced with the stored data CA_FUSE<0:1> in intra-page column address CA<0:1>, the fuse data in the hit set is selected and sent to a sense amp data multiplexer.

FIG. 76 shows a sense amplifier and a circuit that latches the sensed data. At the output terminal of a sense amplifier SA1, there is provided a latch circuit composed of clocked inverters CINV3, CINV4 and an inverter INV5. There are provided 65 units of this latch circuit, including a redundancy circuit. A latch signal LAT is a signal that operates with the timing shown in FIG. 90.

FIG. 77 shows a read and program verify sense amplifier. The read sense amplifier Read S/A is composed of 128 sense amplifiers Sense amp., 16 current converters, and a reference current converter. The verify sense amplifier Verify S/A is composed of 16 sense amplifiers Sense amp. and two current converters.

A reference cell is shared by the two sense amplifiers. The reference current converter switches between a read reference cell and a verify reference cell. The reference current converter is shared by eight sense amplifiers. This prevents the area from being wasted, although the reference current converter is composed of a flash memory with a page mode.

Use of the read and program verify sense amplifier with the above configuration enables the reference cell to be shared by the read sense amplifier and the program verify sense amplifier and prevents the verify margin of the main body cells from deteriorating due to variations in the reference cell.

FIGS. 78 and 79 each show a circuit that latches the column redundancy fuse data. The latch circuit shown in FIG. 78 is composed of clocked inverters CINV5, CINV6 and an inverter INV6. The latch circuit shown in FIG. 79 is composed of clocked inverters CINV7, CINV8 and an inverter INV7. A latch signal FLAT is a signal that operates with the timing shown in FIG. 90 explained later.

FIG. 80 shows a circuit that generates a signal R_HITIOi for causing a multiplexer shown in FIGS. 81 and 82 to replace the I/O data specified by signal R_IO_FS<0:3> with signal SAORD when the word for which intra-page address R_CA<0:1> coincides with fuse data R_CA_FS<0:1> is outputted. The circuit is composed of an exclusive OR gate EXOR, an inverter INV8, and an AND gate 25. While in the embodiment, only one bit in 4 words/page can be replaced, use of two sets of signal R_CA_FS<0:1>, R_HITIO and SAORD enables two bits on the page to be replaced.

The multiplexer shown in FIG. 81 is composed of an AND gate AND 26. The multiplexer shown in FIG. 82 is composed of an inverter INV9, AND gates AND27 to AND30, n-channel MOS transistors MQ1 to MQ5, and a buffer BAC3.

FIG. 83 is a circuit diagram showing an example of the configuration of a data latch circuit that holds program data. The data latch circuit includes clocked inverters CINV9, CINV10 and an inverter INV10.

FIG. 84 is a circuit diagram showing an example of the configuration of a sense latch circuit that verifies a program operation or an erase operation. The sense latch circuit includes a sense amplifier SA2, clocked inverters CINV11, CINV12, and an inverter INV11.

FIG. 85 is a circuit diagram showing an example of the configuration of a circuit that performs column redundancy in an auto operation. This circuit is composed of n-channel MOS transistors CQ1 and CQ2, inverter INV12, and an AND gate AND 31.

FIG. 86 is a circuit diagram showing a circuit which outputs an end signal PEND for designating the end of program when program data PDATAi and a verify result PSAOi completely coincide with each other. This circuit includes exclusive OR gates PEXOR0 to PEXOR16 and an AND gate AND32.

FIG. 87 is a circuit diagram of a circuit that transfers the data in the target I/O when column redundancy replacement is performed. This circuit is composed of an inverter INV13 and NAND gates NAND1 and NAND2.

FIG. 88 is a circuit diagram showing an example of the configuration of a program load circuit connected to an auto data line. This circuit is composed of a NOR gate NOR1, a level shifter LS23, and an n-channel MOS transistor PQ1. When program data PDATA is "1," the data line is put in the floating state. When program data PDATA is "0," a write voltage VDDP is applied to the data line.

FIG. 89 is a timing chart showing an operating waveform representing a program operation. The bank including the selected address goes into the program select state, where word line WL and bit line BL are put in the program bias state and program verify state.

FIG. 90 is a timing chart showing an operating waveform representing a read operation. It is possible to access a bank that is not in a program operation or an erase operation. When read page addresses A2 to A19 are switched, a pulse-like address transition sense signal ATD is outputted as a result of the transition. The page data is sensed by the sense amplifier and four words of data are latched with a pulse LAT signal generated from signal ATD. One word specified by intra-page addresses A0, A1 is outputted from an I/O pad. Thereafter, signal ATD is not outputted only by the switching between A0 and A1. The latched data is multiplexed and the resulting data is outputted from the I/O pad.

TABLE 2 lists the voltage values of the internal power supply in each internal operation.

TABLE 2

|  | VDDR | VDDH | VDDP | VSW | VBB |
| --- | --- | --- | --- | --- | --- |
| Read | 5 V | 5 V | Vcc | 5 V | 0 V |
| Program | 5 V | 10 V | 5 V | 10 V | 0 V |
| Program verify | 5 V | 10 V | Vcc | 6.5 V | 0 V |
| Erase | 5 V | 10 V | Vcc | 2.5 V | −7.5 V |
| Erase Verify | 5 V | 10 V | Vcc | 3.5 V | −2 V |

Read word line voltage VDDR keeps the same level in any operating state. VDDH, which is at 10 V in any mode other than the read mode, generates VSW for a select word line level. VDDP generates 5 V only in a program operation. VBB generates not only a word line level in an erase operation but also −2 V in an erase verify operation.

TABLE 3 lists the bias relationship between the selected/unselected word lines and the bit lines in the selected block in each operating state and the bias relationship between the selected/unselected word lines and the bit lines in the unselected blocks.

TABLE 3

|  | Selected | | | Unselected | | Unselected block | | |
| --- | --- | --- | --- | --- | --- | --- | --- | --- |
|  | WL | BL | Well | WL | BL | WL | BL | Well |
| Read | VDDR | 1 V | 0 V | 0 V | floating | 0 V | floating | 0 V |

TABLE 3-continued

| | Selected | | | Unselected | | Unselected block | | |
|---|---|---|---|---|---|---|---|---|
| | WL | BL | Well | WL | BL | WL | BL | Well |
| Program | VSW | VDDP | 0 V | 0 V | floating | 0 V | floating | 0 V |
| Program verify | VSW | 1 V | 0 V | 0 V | floating | 0 V | floating | 0 V |
| Erase | VBB | floating | VDDH | — | — | 0 V | floating | 0 V |
| Erase Verify | VSW | 1 V | 0 V | 0 V | floating | 0 V | floating | 0 V |

Next, address allocation in a nonvolatile semiconductor memory with the configuration as shown in FIGS. 4 to 90 will be explained.

FIGS. 91A, 91B, 92A, 92B, 92C, 93A, 93B, 94A, 94B, 94C, 95A, 95B, 96A, 96B, 96C, 97A, 97B, 98A, 98B, and 98C show a first to an eighth example of address allocation in a nonvolatile semiconductor memory according to embodiments of the present invention.

In the examples of allocation of addresses, addresses A1 to A16 are in the ascending order. Thus, address A0 is the lowers, address A1 is higher than address A0, address A2 is higher than address A1, and so on, and address A16 is the highest. Four or five address subsets are allocated to each of address A1 to A16. If four address subsets are allocated to each address, the first subset corresponds to the intra-page (column) address, the second subset to the row address, the third subset to the page (column) address, and the fourth address subset to the block address. If five address subsets are allocated to each address, the first subset corresponds to the intra-page (column) address, the second subset to the lower row address, the third subset to the page (column) address, the fourth subset to the upper row address or the upper row and boot block address, and the fifth subset to the block address.

The first to eighth examples of address allocation will be described below.

The first example of address allocation shown in FIGS. 91A and 91B is based on the assumption that the configuration includes four 512-Kbit (512×1024) blocks. Each block is divided by bit lines BL(4n) to BL(4n+3) into four groups (32 words) in units of 8 words. Each of page0 to page4095 is composed of 8 words.

As shown in FIG. 91A, word line WL0 selects pages page0, page1024, page2048, and page3069 and word line WL1 selects pages page1, page1025, page2049, and page3070. Moreover, word line WL2 selects pages page2, page1026, page2050, and page3071. Similarly, word lines WL3 to WL1022 select pages in the same manner. Then, word line WL1023 selects pages page1023, page2047, page3068, and page4095.

On the other hand, bit line BL(4n) selects pages page0, page1, page2, . . . , page1023 and bit line BL(4n+1) selects pages page1024, page1025, page1026, . . . , page2047. Furthermore, bit line BL(4n+2) selects pages page2048, page2049, paged2050, . . . , page3068 and bit line BL(4n+3) selects pages page3069, page3070, page3071, . . . , page4095.

Then, as shown in FIG. 91B, intra-page (column) addresses CA0, CA1, CA2 are allocated to low-order addresses A0, A1, A2; row addresses RA0 to RA9 are allocated to addresses A3 to A12; page (column) addresses CA3, CA4 are allocated to addresses A13, A14; and block addresses BA0, BA1 are allocated to high-order addresses A15, A16.

With this allocation, one of the four 512-Kbit (512×10$^{24}$) blocks is selected by block addresses BA0, BA1. Then, one of the four group is selected by page (column) addresses CA3, CA4 and one of word lines WL0 to WL1023 is selected by row addresses RA9 to RA9, thereby selecting one page. Eight words on the selected page are selected by intra-page (column) addresses CA0, CA1, CA2.

The second example of address allocation shown in FIGS. 92A, 92B, and 92C shows a case where there is a boot block. This example is also based on the assumption that the configuration includes four 512-Kbit (512×10$^{24}$) blocks. Each block is divided by bit lines BL(4n) to BL(4n+3) into four groups (32 words) in units of 8 words. Each of page0 to page4095 is composed of 8 words.

As shown in FIG. 92A, the size of the configuration is ⅛ of the size of the configuration of FIG. 91A. Word line WL0 selects pages page0, page128, page256, page 384 and word line WL1 selects pages page1, page129, page257, page385. Moreover, word line WL2 selects pages page2, page130, page258, page386. Similarly, word lines WL3 to WL126 select pages in the same manner. Then, word line WL127 selects pages page127, page255, page383, page511.

Furthermore, bit line BL(4n) selects pages page0, page1, page2, . . . , page127 and bit line BL(4n+1) selects pages page128, page129, page130, . . . , page255. Moreover, bit line BL(4n+2) selects pages page256, page257, page258, . . . , page383 and bit line BL(4n+3) selects pages page384, page385, page386, . . . , page511.

Then, as shown in FIG. 92B, intra-page (column) addresses CA0, CA1, CA2 are allocated to low-order addresses A0, A1, A2; lower row addresses RA0 to RA6 are allocated to addresses A3 to A9; page (column) addresses CA3, CA4 are allocated to addresses A10, A11; upper row addresses & boot block addresses RA7, RA8, RA9 are allocated to addresses A12, A13, A14; and block addresses BA0, BA1 are allocated to high-order addresses A15, A16.

In this case, page (column) addresses CA3, CA4 select one of the four groups and row addresses RA0 to RA6 select one of word lines WL0 to WL127, thereby selecting one page. Eight words in the selected page are selected by intra-page (column) addresses CA0, CA1, CA2.

FIG. 92C shows a combination of eight units of the configuration shown in FIG. 92A. As shown in FIG. 92B, one of the four 512-Kbit blocks is selected by block addresses BA0 and BA1. One of the eight units is selected by row addresses RA7, RA8 and RA9.

The third example of address allocation shown in FIGS. 93A and 93B is based on the assumption that the configuration includes four 512-Kbit (512×10$^{24}$) blocks. Each block is divided by bit lines BL(8n) to BL(8n+7) into eight groups (32 words) in units of 4 words. Each of page0 to page8191 is composed of 4 words.

As shown in FIG. 93A, word line WL0 selects pages page0, page1024, . . . , page7168 and word line WL1 selects pages page1, page1025, . . . , page7169. Moreover, word line WL2 selects pages page2, page1026, . . . , page7170. Similarly, word lines WL3 to WL1022 select pages in the same manner. Then, word line WL1023 selects pages page1023, page2047, . . . , page8191.

On the other hand, bit line BL(8n) selects pages page0, page1, page2, . . . , page1023 and bit line BL(8n+1) selects pages page1024, page1025, page1026, . . . , page2047.

Similarly, bit lines BL(8n+2) to BL(8n+6) select pages in the same manner. Then, bit line BL(8n+7) selects pages page7168, page7169, page7170, . . . , page8191.

Then, as shown in FIG. 93B, intra-page (column) addresses CA0, CA1 are allocated to low-order addresses A0, A1; row addresses RA0 to RA9 are allocated to addresses A2 to A11; page (column) addresses CA2, CA3, CA4 are allocated to addresses A12, A13, A14; and block addresses BA0, BA1 are allocated to high-order addresses A15, A16.

With this allocation, block addresses BA0, BA1 select one of the four 512-Kbit ($512 \times 10^{24}$) blocks. In addition, page (column) addresses CA2, CA3, CA4 select two of the eight groups and row addresses RA0 to RA9 select one of word lines WL0 to WL1023, thereby selecting two consecutive pages. Eight words on the selected two pages are selected by intra-page (column) addresses CA0, CA1 and CA2.

The fourth example of address allocation shown in FIGS. 94A, 94B and 94C shows a case where there is a boot block. This example is also based on the assumption that the configuration includes four 512-Kbit ($512 \times 10^{24}$) blocks. Each block is divided by bit lines BL(8n) to BL(8n+7) into eight groups (32 words) in units of 4 words. Each of page0 to page8191 is composed of 4 words.

As shown in FIG. 94A, the size of the configuration is 1/8 of the size of the configuration of FIG. 93A. Word line WL0 selects pages page0, page128, . . . , page 896 and word line WL1 selects pages page1, page129, . . . , page897. Moreover, word line WL2 selects pages page2, page130, . . . , page898. Similarly, word lines WL3 to WL126 select pages in the same manner. Then, word line WL127 selects pages page127, page255, . . . , page1023.

Furthermore, bit line BL(8n) selects pages page0, page1, page2, . . . , page127 and bit line BL(8n+1) selects pages page128, page129, page130, . . . , page255. Similarly, bit lines BL(8n+2) to BL(8n+6) select pages in the same manner. Then, bit line BL(8n+7) selects pages page896, page897, page898, . . . , page1023.

Then, as shown in FIG. 94B, intra-page (column) addresses CA0, CA1 are allocated to low-order addresses A0, A1; lower row addresses RA0 to RA6 are allocated to addresses A2 to A8; page (column) addresses CA2, CA3, CA4 are allocated to addresses A9, A10, A11; upper row addresses & boot block addresses RA7, RA8, RA9 are allocated to addresses A12, A13, A14; and block addresses BA0, BA1 are allocated to high-order addresses A15, A16.

In this case, page (column) addresses CA2, CA3, CA4 select two of the eight groups and lower row addresses RA0 to RA6 select one of word lines WL0 to WL127, thereby selecting two consecutive pages. Eight words on the selected two pages are selected by intra-page (column) addresses CA0, CA1.

FIG. 94C shows a combination of eight units of the configuration shown in FIG. 94A. As shown in FIG. 94B, one of the four 512-Kbit ($512 \times 10^{24}$) blocks is selected by block addresses BA0, BA1. One of the eight units is selected by upper row addresses & boot block addresses RA7, RA8 and RA9.

The fifth example of address allocation shown in FIGS. 95A and 95B is based on the assumption that the configuration includes four 512-Kbit (1024×512) blocks. Each block is divided by bit lines BL(8n) to BL(8n+7) into eight groups (64 words) in units of 8 words. Each of page0 to page4095 is composed of 8 words.

As shown in FIG. 95A, word line WL0 selects pages page0, page512, . . . , page3584 and word line WL1 selects pages page1, page513, . . . , page3585. Moreover, word line WL2 selects pages page2, page514, . . . , page3586. Similarly, word lines WL3 to WL510 select pages in the same manner. Then, word line WL511 selects pages page511, page1023, . . . , page4095.

On the other hand, bit line BL(8n) selects pages page0, page1, page2, . . . , pages11 and bit line BL(8n+1) selects pages page512, page513, page514, . . . , page1023. Similarly, bit lines BL(8n+2) to BL(8n+6) select pages in the same manner. Then, bit line BL(8n+7) selects pages page3584, page3585, page3586, . . . , page4095.

Then, as shown in FIG. 95B, intra-page (column) addresses CA0, CA1 are allocated to low-order addresses A0, A1; row addresses RA0 to RA8 are allocated to addresses A2 to A10; page (column) addresses CA2, CA3, CA4, CA5 are allocated to addresses A11, A12, A13, A14; and block addresses BA0, BA1 are allocated to high-order addresses A15, A16.

With this allocation, block addresses BA0 and BA1 select one of the four 512-Kbit (1024×512) blocks. In addition, page (column) addresses CA2, CA3, CA4 and CA5 select one of the eight groups and row addresses RA0 to RA8 select one of word lines WL0 to WL511, thereby selecting one page. Eight words on the selected page are selected by intra-page (column) addresses CA0, CA1.

The sixth example of address allocation shown in FIGS. 96A, 96B and 96C shows a case where there is a boot block. This example is also based on the assumption that the configuration includes four 512-Kbit (1024×512) blocks. Each block is divided by bit lines BL(8n) to BL(8n+7) into eight groups (64 words) in units of 8 words. Each of page0 to page4095 is composed of 8 words.

As shown in FIG. 96A, the size of the configuration is 1/8 of the size of the configuration of FIG. 95A. Word line WL0 selects pages page0, page64, . . . , page448 and word line WL1 selects pages page1, page65, . . . , page449. Moreover, word line WL2 selects pages page2, page66, . . . , page450. Similarly, word lines WL3 to WL62 select pages in the same manner. Then, word line WL63 selects pages page63, page127, . . . , page511.

Furthermore, bit line BL(8n) selects pages page0, page1, page2, . . . , page63 and bit line BL(8n+1) selects pages page64, page65, page66, . . . , page127. Similarly, bit lines BL(8n+2) to BL(8n+6) select pages in the same manner. Then, bit line BL(8n+7) selects pages page448, page459, page450, . . . , page511.

Then, as shown in FIG. 96B, intra-page (column) addresses CA0, CA1 are allocated to low-order addresses A0, A1 (first address subset); row addresses RA0 to RA6 are allocated to addresses A2 to A8 (second address subset); page (column) addresses CA2, CA3, CA4 are allocated to addresses A9, A10, A11 (third address subset); upper row addresses & boot block addresses RA7, RA8, RA9 are allocated to addresses A12, A13, A14 (forth address subset); and block addresses BA0, BA1 are allocated to high-order addresses A15, A16 (fifth address subset).

In this case, page (column) addresses CA2, CA3 and CA4 select one of the eight groups and row addresses RA0 to RA6 select one of word lines WL0 to WL511, thereby selecting one page. Eight words on the selected page are selected by intra-page (column) addresses CA0, CA1.

FIG. 96C shows a combination of eight units, each identical to the configuration shown in FIG. 96A. As FIG. 96B depicts, one of the four 512-Kbit ($512 \times 10^{24}$) blocks is selected by block addresses BA0 and BA1. One of the eight units is selected by row addresses RA7, RA8 and RA9.

FIGS. 96D to 96F show structural examples of the address buffer 23 (see FIG. 4), which is used for realizing the examples of the sixth address allocation shown in FIGS. 96A, 96B and 96C. FIG. 96D is a circuit diagram illustrating an i-th bit buffer circuit incorporated in the address buffer 23. FIG. 96E is a symbolic view of the buffer circuit shown in FIG. 96D. FIG. 96F is a block diagram illustrating structural examples of the address buffer of FIG. 4.

As seen from FIG. 96D, each bit of the address buffer 23 is provided with a buffer circuit that comprises a NOR gate NOR2, inverters INV14, INV15 and INV16, and clocked inverter CINV13. One input terminal of the NOR gate NOR2 is supplied with a chip enable signal CEB. The chip enable signal CEB is supplied from the controller 21, and is low-level upon selection of a chip. The other input terminal of the NOR gate NOR2 is connected to the i-th bit input pad ADDPADi for the address signal ADD. The output terminal of the NOR gate NOR2 is connected to the input terminal of the inverter INV14. The output terminal of the inverter INV14 outputs a signal R_Ai, and is connected to the input terminal of the clocked inverter CINV13. The clock input terminal of the clocked inverter CINV13 is controlled by an enable signal ADDINEN supplied from the controller 21 for address input for automatic writing and erasure. The output terminal of the clocked inverter CINV13 is connected to the input terminal of the inverter INV15. The output and input terminals of the inverter INV15 are connected to the input and output terminals of the inverter INV16, respectively. As a result, the inverters INV15 and INV16 provide a latch circuit. The output terminal of the INV15 outputs a signal A_Ai.

The buffer circuit is constructed under the presumption of dual operation, and the signal ADDINEN is a control signal for fetching an address for writing and erasure into the decoder.

If the buffer circuit shown in FIG. 96D is expressed by a symbol figure (ADDBUF) as shown in FIG. 96E, the address buffer 23 shown in FIG. 4 is expressed as shown in FIG. 96F. A buffer circuit ADDBUF1 corresponds to the first address subset, and outputs signals R_CAj(j=0–1) and A_CAj(j=0–1) on the basis of 0-th and 1-st bit address signals ADDi input to the chip enable signal CEB and address pad ADDPADi (i=0–1), respectively. The signal ADDINEN is a control signal for fetching the intra-page (column) address into the column decoder 13 for writing and erasure. A buffer circuit ADDBUF2 corresponds to the second address subset, and outputs signals R_CAj(j=0–6) and A_CAj(j=0–6) on the basis of 2-nd to 8-th bit address signals ADDi input to the chip enable signal CEB and address pad ADDPADi (i=2–8), respectively. The signal ADDINEN is a control signal for fetching the lower row address into the row decoder 12 for writing and erasure. A buffer circuit ADDBUF3 corresponds to the third address subset, and outputs signals R_CAj(j=2–4) and A_CAj(j=2–4) on the basis of 9-th to 11-th bit address signals ADDi input to the chip enable signal CEB and address pad ADDPADi (i=9–11), respectively. The signal ADDINEN is a control signal for fetching the page (column) address into the column decoder 13 for writing and erasure. A buffer circuit ADDBUF4 corresponds to the fourth address subset, and outputs signals R_CAj(j=7–9) and A_CAj(j=7–9) on the basis of 12-th to 14-th bit address signals ADDi input to the chip enable signal CEB and address pad ADDPADi (i=12–14), respectively. The signal ADDINEN is a control signal for fetching the upper row and boot block addresses into the row decoder 12 for writing and erasure. A buffer circuit ADDBUF5 corresponds to the fifth address subset, and outputs signals R_CAj(j=1–2) and A_CAj(j=1–2) on the basis of 15-th and 16-th bit address signals ADDi input to the chip enable signal CEB and address pad ADDPADi (i=15–16), respectively. The signal ADDINEN is a control signal for fetching the block address into the block decoder 14 for writing and erasure.

The seventh example of address allocation shown in FIGS. 97A and 97B is based on the assumption that the configuration includes four 512-Kbit (1024×512) blocks. Each block is divided by bit lines BL(16n) to BL(16n+15) into 16 groups (64 words) in units of 4 words. Each of page0 to page8191 is composed of 4 words.

As shown in FIG. 97A, word line WL0 selects pages page0, page512, . . . , page7680 and word line WL1 selects pages page1, page513, . . . , page7681. Moreover, word line WL2 selects pages page2, page514, . . . , page7682. Similarly, word lines WL3 to WL510 select pages in the same manner. Then, word line WL511 selects pages page511, page1023, . . . , page8191.

On the other hand, bit line BL(16n) selects pages page0, page1, page2, . . . , page511 and bit line BL(16n+1) selects pages page512, page513, page514, . . . , page1023. Similarly, bit lines BL(16n+2) to BL(16n+14) select pages in the same manner. Then, bit line BL(16n+15) selects pages page7680, page7681, page7682, . . . , page8191.

Then, as shown in FIG. 97B, intra-page (column) addresses CA0, CA1 are allocated to low-order addresses A0, A1; row addresses RA0 to RA8 are allocated to addresses A2 to A10; page (column) addresses CA2 to CA5 are allocated to addresses A11 to A14; and block addresses BA0, BA1 are allocated to high-order addresses A15, A16.

With this allocation, block addresses BA0, BA1 select one of the four 512-Kbit (1024×512) blocks. In addition, page (column) addresses CA2 to CA5 select one of the 16 groups and row addresses RA0 to RA8 select one of word lines WL0 to WL511, thereby selecting one page. Four words on the selected page are selected by intra-page (column) addresses CA0, CA1.

The eighth example of address allocation shown in FIGS. 98A, 98B, and 98C shows a case where there is a boot block. This example is also based on the assumption that the configuration includes four 512-Kbit (1024×512) blocks. Each block is divided by bit lines BL(16n) to BL(16n+15) into 16 groups (64 words) in units of 4 words. Each of page0 to page8191 is composed of 4 words.

As shown in FIG. 98A, the size of the configuration is ⅛ of the size of the configuration of FIG. 97A. Word line WL0 selects pages page0, page64, . . . , page960 and word line WL1 selects pages page1, page65, . . . , page961. Moreover, word line WL2 selects pages page2, page66, . . . , page962. Similarly, word lines WL3 to WL62 select pages in the same manner. Then, word line WL63 selects pages page63, page127, . . . , page1023.

Furthermore, bit line BL(16n) selects pages page0, page1, page2, . . . , page63 and bit line BL(16n+1) selects pages page64, page65, page66, . . . , page127. Similarly, bit lines BL(16n+2) to BL(16n+14) select pages in the same manner. Then, bit line BL(16n+15) selects pages page960, page961, page962, . . . , page1023.

Then, as shown in FIG. 98B, intra-page (column) addresses CA0, CA1 are allocated to low-order addresses A0, A1; lower row addresses RA0 to RA5 are allocated to addresses A2 to A7; page (column) addresses CA2 to CA5 are allocated to addresses A8 to A11; upper row addresses & boot block addresses RA6, RA7, RA8 are allocated to addresses A12, A13, A14; and block addresses BA0, BA1 are allocated to high-order addresses A15, A16.

In this case, page (column) addresses CA2 to CA5 select one of the 16 groups and row addresses RA0 to RA5 select one of word lines WL0 to WL511, thereby selecting one page. Four words on the selected page are selected by intra-page (column) addresses CA0 and CA1.

FIG. 98C shows a combination of 16 units of the configuration shown in FIG. 98A. As shown in FIG. 98B, one of the four 512-Kbit (1024×512) blocks is selected by block addresses BA0 and BA1. One of the 16 units is selected by row addresses RA7, RA8 and RA9.

As described above, in the examples shown in FIGS. 91A and 91B, 93A and 93B, 95A and 95B, 97A and 97B intra-page (column) addresses are allocated to low-order addresses, row addresses are allocated to middle-order addresses, page (column) addresses are allocated to addresses higher in order than the middle-order addresses, and block addresses are allocated to the highest-order addresses.

In the examples shown in FIGS. 92A to 92C, 94A to 94C, 96A to 96C, and 98A to 98C, intra-page (column) addresses are allocated to low-order addresses, low-order row addresses are allocated to middle-order addresses, page (column) addresses are allocated to addresses higher in order than the middle-order addresses, high-order row addresses are allocated to addresses higher in order than the page (column) addresses, and block addresses are allocated to the highest-order addresses.

The latter is effective in the case of a flash memory including 8-Kbyte boot blocks.

In the above-described allocation examples of the first to eighth addresses, four or five address subsets are allocated. However, the same advantageous effect can be obtained even if three address subsets are allocated. In this case, the column address is allocated to the first address subset, the row address is allocated to the second address subset, and the second column address is allocated to the third address subset. This address allocation provides the same advantageous effect as that obtained in the above-described allocation examples of the first to eighth addresses.

Next, the read disturb time is calculated in the already described example (the case where cells for 32 words are connected to a single word line and 128 consecutive words continue to be read for 10 years). When the page size is 8 words (for example, see FIGS. 91A and 91B), 128 words are distributed to 16 word lines. Since 8 words can be read in the read time required to read one word, the word line stress time for the time required to read 8 words is ⅛. Moreover, the number of word lines decreases to $16/128$, the length of time that one word line is selected becomes 8 times the present value. As a result, the word line stress time (or read disturb time) can be made identical with that when no page mode function is used. Of course, the same holds true for other examples, in addition to the examples of FIGS. 91A and 91B.

Therefore, it is possible to provide a nonvolatile semiconductor memory capable of suppressing an increase in the read disturb time of the nonvolatile semiconductor memory with a page mode (page reading function) to a conventional level and assuring the same reliability as that of a conventional equivalent.

As described above, according to an aspect of the present invention, there is provided a nonvolatile semiconductor memory capable of, although having a page mode, making the read disturb time equivalent to that of a nonvolatile semiconductor memory without a page mode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a plurality of nonvolatile memory cells, at least one of said plurality of nonvolatile memory cells is addressed by address signals Ai (i=0, . . . , I−1), each of said address signals Ai (i=0, . . . , I−1) including first address subset Aj (j=0, . . . , J−1), second address subset Ak (k=J, . . . , K−1), and third address subset Al (l=K, . . . , L−1);
   a plurality of word lines and a plurality of bit lines which are connected to said plurality of nonvolatile memory cells;
   an address buffer to which said first address subset is inputted as a first column address, said second address subset is inputted as a first row address, and a third address subset is inputted as a second column address; and
   a decoder to which the output signal of said address buffer is supplied and which is configured to select at least one of said plurality of nonvolatile memory cells,
   wherein said plurality of bit lines are selected by at least said third address subset, and said plurality of word lines are selected by at least said second address subset.

2. The nonvolatile semiconductor memory according to claim 1, wherein said address buffer further takes in a fourth address subset higher in order than said third address subset as a second row address.

3. The nonvolatile semiconductor memory according to claim 2, wherein said plurality of nonvolatile memory cells are arranged in a matrix to form a memory cell array, said memory cell array divided into a plurality of blocks, each of said plurality of blocks is selected to a block address, and said address buffer further takes in a fifth address subset higher in order than said fourth address subset as the block address of said plurality of blocks.

4. The nonvolatile semiconductor memory according to claim 1, wherein said plurality of nonvolatile memory cells are arranged in a matrix to form a memory cell array, said memory cell array divided into a plurality of blocks, each of said plurality of blocks is selected by a block address, and said address buffer further takes in a fourth address higher in order than said third address subset as the block address of said plurality of blocks.

5. A nonvolatile semiconductor memory with at least as many sense amplifiers as correspond to $2^{N1}$ words comprising:
   a plurality of nonvolatile memory cells;
   a plurality of word lines and a plurality of bit lines which are connected to said plurality of nonvolatile memory cells;
   an address buffer to which an N1 number of address subset of the lowest order are inputted as a first column address, an N2 number of address subset higher than any of said N1 number of address subset are inputted as a first row address, and an N3 number of address subset higher in order than any of said N2 number of address subset are inputted as a second column address; and
   a decoder to which the output signal of said address buffer is supplied and which is configured to select at least one of said plurality of nonvolatile memory cells, wherein said plurality of bit lines are selected by at least said second column address, and said plurality of word lines are selected by at least said first row address.

6. The nonvolatile semiconductor memory according to claim 5, wherein said address buffer further takes in an N4 number of address subset higher in order than any of said N3 number of address subset as second row address.

7. The nonvolatile semiconductor memory according to claim 6, wherein said plurality of nonvolatile memory cells are arranged in a matrix to form a memory cell array, said memory cell array divided into a plurality of blocks, each of said plurality of blocks is selected by a block address, and said address buffer further takes in an N5 number of address subset higher in order than any of said N4 number of address subset as the block address.

8. The nonvolatile semiconductor memory according to claim 5, wherein said plurality of nonvolatile memory cells are arranged in a matrix to form a memory cell array, said memory cell array divided into a plurality of blocks, each of said plurality of blocks is selected to a block address, and said address buffer further takes in an N5 number of address subset higher in order than any of said N3 number of address subset as the block address.

9. A nonvolatile semiconductor memory with at least as many sense amplifiers as correspond to $2^{N1}$ words comprising:
a plurality of nonvolatile memory cells;
a plurality of word lines and a plurality of bit lines which are connected to said plurality of nonvolatile memory cells;
an address buffer to which an N1 number of address subset of the lowest order are inputted as an intra-page address, an N2 number of address subset higher in order than any of said N1 number of address subset are inputted as a first row address, and an N3 number of address subset higher in order than any of said N2 number of address subset are inputted as a page address; and
a decoder to which the output signal of said address buffer is supplied and which is configured to select at least one of said plurality of nonvolatile memory cells,
wherein said plurality of bit lines are selected by at least said page address, and said plurality of word lines are selected by at least said first row address.

10. The nonvolatile semiconductor memory according to claim 9, wherein said address buffer further takes in an N4 number of address subset higher in order than any of said N3 number of address subset as second row address.

11. The nonvolatile semiconductor memory according to claim 10, wherein said plurality of nonvolatile memory cells are arranged in a matrix to form a memory cell array, said memory cell array divided into a plurality of blocks, each of said plurality of blocks is selected by a block address, and said address buffer further takes in an N5 number of address subset higher in order than any of said N4 number of address subset as the block address.

12. The nonvolatile semiconductor memory according to claim 9, wherein said plurality of nonvolatile memory cells are arranged in a matrix to form a memory cell array, said memory cell array divided into a plurality of blocks, each of said plurality of blocks is selected by a block address, and said address buffer further takes in an N5 number of address subset higher in order than any of said N3 number of address subset as the block address.

13. A nonvolatile semiconductor memory comprising:
a plurality of nonvolatile memory cells;
a plurality of word lines and a plurality of bit lines which are connected to said plurality of nonvolatile memory cells;
a first address buffer to which a first address subset is inputted;
a second address buffer to which a second address subset higher in order than said first address subset is inputted;
a third address buffer to which a third address subset higher in order than said second address subset is inputted;
a row decoder to which the output of said second address buffer is inputted and which selects one of said plurality of word lines when reading the data stored in said plurality of nonvolatile memory cells;
a column decoder to which the output of said third address buffer is inputted and which selects at least an N (where N is a positive integer equal to or larger than 2) number of bit lines from said plurality of bit lines when reading the data stored in said plurality of nonvolatile memory cells;
at least an N number of sense amplifiers which read the data in said memory cells selected for reading;
a multiplexer to which the output of said first address buffer is inputted and which selects an M number of outputs from the outputs of said N number of sense amplifiers; and
an output buffer to which the output of said multiplexer is inputted.

14. The nonvolatile semiconductor memory according to claim 13, further comprising a fourth address buffer to which a fourth address higher in order than said third address subset is inputted and the output of which is inputted to said row decoder.

15. A nonvolatile semiconductor memory comprising:
a plurality of nonvolatile memory blocks, each of which includes a plurality of nonvolatile memory cells, a plurality of word lines and a plurality of bit lines which are connected to said plurality of nonvolatile memory cells, a row decoder which selects one of said plurality of word lines when reading the data stored in said plurality of nonvolatile memory cells, and a column decoder which selects at least an N (where N is a positive integer equal to or larger than 2) number of bit lines from said plurality of bit lines when reading the data stored in said plurality of nonvolatile memory cells;
a first address buffer to which a first address subset is inputted;
a second address buffer to which a second address subset higher in order than said first address subset is inputted;
a third address buffer to which a third address subset higher in order than said second address subset is inputted;
a fourth address buffer to which a fourth address subset higher in order than said third address subset is inputted;
at least an N number of sense amplifiers which read the data in said memory cells selected for reading;
a multiplexer to which the output of said first address buffer is inputted and which selects an M number of outputs from the outputs of said N number of sense amplifiers;

an output buffer to which the output of said multiplexer is inputted; and a block decoder to which the output of said fourth address buffer is inputted and which selects one of said plurality of nonvolatile memory blocks when reading the data stored in said plurality of nonvolatile memory cells, wherein one of said word-lines is selected by the output of said second address buffer and the output of said block decoder, and at least one of said bit-lines is selected by the output of at least said third address buffer and the output of said block decoder.

16. A nonvolatile semiconductor memory comprising:

a plurality of nonvolatile memory blocks, each of which includes a plurality of nonvolatile memory cells, a plurality of word lines and a plurality of bit lines which are connected to said plurality of nonvolatile memory cells, a row decoder which selects one of said plurality of word lines when reading the data stored in said plurality of nonvolatile memory cells, and a column decoder which selects at least an N (where N is a positive integer equal to or larger than 2) number of bit lines from said plurality of bit lines when reading the data stored in said plurality of nonvolatile memory cells;

a first address buffer to which a first address subset is inputted;

a second address buffer to which a second address subset higher in order than said first address subset is inputted;

a third address buffer to which a third address subset higher in order than said second address subset is inputted;

a fourth address buffer to which a fourth address subset higher in order than said third address subset is inputted;

a fifth address buffer to which a fifth address subset higher in order than said fourth address subset is inputted;

at least an N number of sense amplifiers which read the data in said memory cells selected for reading;

a multiplexer to which the output of said first address buffer is inputted and which selects an M number of outputs from the outputs of said N number of sense amplifiers;

an output buffer to which the output of said multiplexer is inputted; and a block decoder to which the output of said fifth address buffer is inputted and which selects one of said plurality of nonvolatile memory blocks when reading the data stored in said plurality of nonvolatile memory cells, wherein one of said word-lines is selected by the outputs of said second and fourth address buffers and the output of said block decoder, and at least one of said bit-lines is selected by the output of at least said third address buffer and the output of said block decoder.

* * * * *